(12) United States Patent
Tango et al.

(10) Patent No.: US 8,846,290 B2
(45) Date of Patent: Sep. 30, 2014

(54) ACTINIC RAY-SENSITIVE OR RADIATION-SENSITIVE RESIN COMPOSITION AND PATTERN FORMING METHOD USING THE SAME

(75) Inventors: Naohiro Tango, Shizuoka (JP); Michihiro Shirakawa, Shizuoka (JP); Mitsuhiro Fujita, Kanagawa (JP); Shuhei Yamaguchi, Shizuoka (JP); Akinori Shibuya, Shizuoka (JP); Shohei Kataoka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/260,777

(22) PCT Filed: Mar. 26, 2010

(86) PCT No.: PCT/JP2010/056041
§ 371 (c)(1),
(2), (4) Date: Sep. 28, 2011

(87) PCT Pub. No.: WO2010/114107
PCT Pub. Date: Oct. 7, 2010

(65) Prior Publication Data
US 2012/0015302 A1   Jan. 19, 2012

(30) Foreign Application Priority Data

Mar. 31, 2009 (JP) .................................. 2009-088557
Sep. 4, 2009 (JP) .................................. 2009-205362

(51) Int. Cl.
*G03F 7/027* (2006.01)
*C08F 220/18* (2006.01)

(52) U.S. Cl.
USPC ......... 430/270.1; 430/913; 430/914; 430/945

(58) Field of Classification Search
USPC .............................. 439/270.1, 913, 914, 945
See application file for complete search history.

(56) References Cited

U.S. PATENT DOCUMENTS

| | | | |
|---|---|---|---|
| 4,480,910 A | 11/1984 | Takanashi et al. | |
| 6,528,232 B1 * | 3/2003 | Maeda et al. | 430/270.1 |
| 6,602,647 B2 * | 8/2003 | Iwasa et al. | 430/270.1 |
| 6,638,685 B2 * | 10/2003 | Maeda et al. | 430/270.1 |
| 7,371,503 B2 * | 5/2008 | Miyamatsu et al. | 430/270.1 |
| 7,531,686 B2 * | 5/2009 | Harada et al. | 560/117 |
| 7,629,107 B2 * | 12/2009 | Shibuya et al. | 430/270.1 |
| 7,794,916 B2 * | 9/2010 | Shibuya | 430/270.1 |
| 7,897,821 B2 * | 3/2011 | Nagai et al. | 568/842 |
| 8,124,314 B2 * | 2/2012 | Nishimura et al. | 430/270.1 |
| 2004/0072097 A1 * | 4/2004 | Kodama | 430/270.1 |
| 2004/0175654 A1 | 9/2004 | Yasunami et al. | |
| 2006/0154171 A1 | 7/2006 | Hirayama et al. | |
| 2006/0160023 A1 * | 7/2006 | Kobayashi et al. | 430/270.1 |
| 2007/0231741 A1 | 10/2007 | Nishi et al. | |
| 2008/0085464 A1 | 4/2008 | Shibuya et al. | |
| 2009/0023095 A1 * | 1/2009 | Hada et al. | 430/281.1 |
| 2010/0009288 A1 * | 1/2010 | Kato et al. | 430/270.1 |
| 2010/0183979 A1 * | 7/2010 | Yamaguchi | 430/270.1 |
| 2011/0027716 A1 * | 2/2011 | Yamaguchi et al. | 430/270.1 |
| 2012/0215297 A1 * | 8/2012 | Buiser et al. | 623/1.11 |

FOREIGN PATENT DOCUMENTS

| | | |
|---|---|---|
| EP | 1925979 A1 * | 5/2008 |
| EP | 2105440 A2 | 9/2009 |
| JP | 57-153433 A | 9/1982 |
| JP | 7-220990 A | 8/1995 |
| JP | 10-232490 A | 9/1998 |
| JP | 10-303114 A | 11/1998 |
| JP | 2003-195489 A | 7/2003 |
| JP | 2004-271629 A | 9/2004 |
| JP | 2006-276742 A | 10/2006 |
| JP | 2007-58159 A | 3/2007 |
| JP | 2007-298569 A | 11/2007 |
| JP | 2008-96743 A | 4/2008 |
| JP | 2008-116496 A | 5/2008 |
| JP | 2008116496 A * | 5/2008 |
| JP | 2008-170784 A | 7/2008 |
| TW | 200819917 | 9/1996 |
| WO | 2004/077158 A1 | 9/2004 |

OTHER PUBLICATIONS

Hoffnagle, J.A., et al., "Liquid immersion deep-ultraviolet interferometric lithography", J. Vac. Sci. Technol. B, 1999, pp. 3306-3309, vol. 17, No. 6.
Ito, H., et al., "Dissolution/swelling behavior of cycloolefin polymers in aqueous base", Proceedings of SPIE, 2000, pp. 2-12, vol. 3999.
Lin, B.J., et al., "Semiconductor Foundry, Lithography, and Partners", Proceedings of SPIE, 2002, pp. 11- 24, vol. 4688.
International Search Report for PCT/JP2010/056041 dated May 25, 2010 [PCT/ISA/210].
Written Opinion for PCT/JP2010/056041 dated May 25, 2010 [PCT/ISA/237].
European Search Report issued Jul. 5, 2012, in counterpart European Patent Application No. 10758878.2.
Communication dated Oct. 2, 2012 from the Japanese Patent Office in counterpart Japanese application No. 2009-205362.
Office Action mailed Jul. 4, 2014 in Taiwanese Application No. 099109785.

* cited by examiner

*Primary Examiner* — Amanda C. Walke
(74) *Attorney, Agent, or Firm* — Sughrue Mion, PLLC

(57) ABSTRACT

An actinic ray-sensitive or radiation-sensitive resin composition includes: (A) a resin capable of increasing a solubility of the resin (A) in an alkali developer by an action of an acid; and (B) a compound capable of generating an acid upon irradiation with an actinic ray or radiation, wherein (B) the compound capable of generating an acid upon irradiation with an actinic ray or radiation is contained in an amount of 10 to 30 mass % based on the entire solid content of the actinic ray-sensitive or radiation-sensitive resin composition, and a pattern forming method uses the composition.

29 Claims, No Drawings

ACTINIC RAY-SENSITIVE OR RADIATION-SENSITIVE RESIN COMPOSITION AND PATTERN FORMING METHOD USING THE SAME

TECHNICAL FIELD

The present invention relates to an actinic ray-sensitive or radiation-sensitive resin composition for use in lithography for the production of a semiconductor such as IC, a liquid crystal device or a circuit board such as thermal head and further for other photofabrication processes, and a pattern forming method using the same. More specifically, the present invention relates to a actinic ray-sensitive or radiation-sensitive resin composition for immersion exposure, which is suitable for exposure by an immersion projection exposure apparatus using a light source that emits a far ultraviolet ray at a wavelength of 300 nm or less, and a pattern forming method using the same.

In the present invention, the term "actinic ray" or "radiation" indicates, for example, a bright line spectrum of mercury lamp, a far ultraviolet ray typified by an excimer laser, an extreme-ultraviolet ray, an X-ray or an electron beam. Also, in the present invention, the "light" means an actinic ray or radiation.

BACKGROUND ART

Along with miniaturization of a semiconductor device, the trend is moving into a shorter wavelength of the exposure light source and a higher numerical aperture (higher NA) of the projection lens, and at present, an exposure machine with NA of 0.84 has been developed, where an ArF excimer laser having a wavelength of 193 nm is used as a light source. As commonly well known, these factors can be expressed by the following formulae:

(Resolution)=$k_1 \cdot (\lambda/NA)$ (Depth of focus)=$\pm k_2 \cdot \lambda/NA^2$ wherein $\lambda$ is the wavelength of the exposure light source, NA is the numerical aperture of the projection lens, and $k_1$ and $k_2$ are coefficients related to the process.

For more shortening the wavelength and thereby obtaining higher resolution, studies are being made on an exposure machine where an $F_2$ excimer laser having a wavelength of 157 nm is used as a light source. However, the lens material used for the exposure apparatus so as to realize shorter wavelength and the material used for the resist are extremely limited and therefore, it is very difficult to stabilize the production cost or quality of the apparatus and materials. This may lead to a failure in outfitting the exposure apparatus and the resist each assured of sufficiently high performance and stability within a required time period.

A so-called immersion method of filling a high refractive-index liquid (hereinafter sometimes referred to as an "immersion liquid") between a projection lens and a sample has been conventionally known as a technique for enhancing the resolution in an optical microscope.

As for the "effect of immersion", assuming that $NA_0 = \sin\theta$, the resolution and the depth of focus in immersion can be expressed by the following formulae:

(Resolution)=$k_1 \cdot (\lambda_0/n)/NA_0$ (Depth of focus)=$\pm k_2 \cdot (\lambda_0/n)/NA_0^2$ wherein $\lambda_0$ is the wavelength of exposure light in air, n is the refractive index of the immersion liquid based on air, and $\theta$ is the convergence half-angle of beam.

That is, the effect of immersion is equal to use of an exposure wavelength of 1/n. In other words, when the projection optical system has the same NA, the depth of focus can be made n times larger by the immersion. This is effective for all pattern profiles and furthermore, can be combined with the super-resolution technology under study at present, such as phase-shift method and modified illumination method.

Examples of the apparatus where the effect above is applied to the transfer of a fine image pattern of a semiconductor device is described in JP-A-57-153433 (the term "JP-A" as used herein means an "unexamined published Japanese patent application") and JP-A-7-220990.

Recent technical progress of the immersion exposure is reported, for example, in SPIE Proc., Vol. 4688, page 11 (2002), J. Vac. Sci. Tecnol. B, 17 (1999)) and SPIE Proc., Vol. 3999, page 2 (2000) and JP-A-10-303114 and International Publication No. 04/077158.

In the case of using an ArF excimer laser as a light source, pure water (refractive index at 193 nm: 1.44) is considered to be most promising as the immersion liquid in view of safety in handling as well as transmittance and refractive index at 193 nm. In the case of using an $F_2$ excimer laser as a light source, a fluorine-containing solution is being studied from the aspect of balance between transmittance and refractive index at 157 nm, but a satisfactory solution in terms of environmental safety and refractive index has not yet been found. Considering the degree of immersion effect and the perfection of resist, the immersion exposure technique is expected to be most soon mounted on an ArF exposure machine.

Since the advent of a resist for KrF excimer laser (248 nm), an image fanning method called chemical amplification is used as an image forming method for a resist so as to compensate for sensitivity reduction caused by light absorption. For example, the image forming method by positive chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure Bake), and removing the exposed area by alkali development.

Various compounds have been also found for the acid generator that is a main constituent component of the chemical amplification resist composition, and a resist composition containing a specific sulfonium salt compound as the acid generator is disclosed in JP-A-10-232490 and JP-A-2003-195489.

JP-A-2004-271629 discloses a positive resist composition containing a polyhydroxystyrene-based resin and from 5 to 20 mass % of an acid generator with an attempt to realize high sensitivity, high resolution, good pattern profile and reduced line edge roughness in the patterning by X-ray, electron beam or EUV exposure.

However, in view of overall performance as a resist, it is actually very difficult to find out an appropriate combination of a resin, a photo-acid generator, an additive, a solvent and the like used for the pattern formation. In the formation of a fine pattern having as small a line width as 100 nm or less, the normal dry exposure and particularly the immersion exposure are faced with a tapering problem of the pattern profile due to refinement, or many insufficient points still remain, and improvement of line edge roughness (LER) is being required.

SUMMARY OF INVENTION

An object of the present invention is to provide an actinic ray-sensitive or radiation-sensitive resin composition having an effect in the improvement of tapered profile of a resist pattern and enabling formation of a pattern with good LER performance, and a pattern forming method using the composition.

(1) An actinic ray-sensitive or radiation-sensitive resin composition, comprising:

(A) a resin capable of increasing a solubility of the resin (A) in an alkali developer by an action of an acid; and (B) a compound capable of generating an acid upon irradiation with an actinic ray or radiation, wherein (B) the compound capable of generating an acid upon irradiation with an actinic ray or radiation is contained in an amount of 10 to 30 mass % based on the entire solid content of the actinic ray-sensitive or radiation-sensitive resin composition.

(2) The actinic ray-sensitive or radiation-sensitive resin composition as described in (1) above, wherein the component (B) is a compound represented by the following formula (1-1) or (1-2):

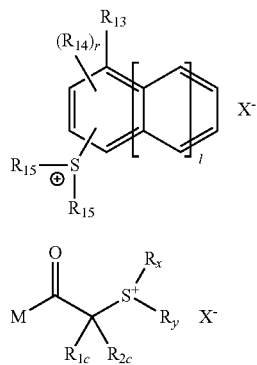

wherein in formula (1-1), $R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton;

$R_{14}$ represents an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton, and when a plurality of $R_{14}$'s are present, the plurality of $R_{14}$'s are the same or different;

each $R_{15}$ independently represents an alkyl group, a cycloalkyl group or a naphthyl group, and two $R_{15}$'s may combine with each other to form a ring;

l represents an integer of 0 to 2;

r represents an integer of 0 to 8; and $X^-$ represents a non-nucleophilic anion; and in formula (1-2), M represents an alkyl group, a cycloalkyl group, an aryl group or a benzyl group and when M has a ring structure, the ring structure may contain an oxygen atom, a sulfur atom, an ester bond, an amide bond or a carbon-carbon double bond;

each of $R_{1c}$ and $R_{2c}$ independently represents a hydrogen atom, an alkyl group, a cycloalkyl group, a halogen atom, a cyano group or an aryl group, and $R_{1c}$ and $R_{2c}$ may combine with each other to form a ring;

each of $R_x$ and $R_y$ independently represents an alkyl group, a cycloalkyl group, a 2-oxoalkyl group, an alkoxycarbonylalkyl group, an allyl group or a vinyl group;

$R_x$ and $R_y$ may combine with each other to form a ring, at least two members of M, $R_{1c}$ and $R_{2c}$ may combine with each other to form a ring, and the ring structure may contain a carbon-carbon double bond; and $X^-$ represents a non-nucleophilic anion.

(3) The actinic ray-sensitive or radiation-sensitive resin composition as described in (1) or (2) above, further comprising:

a nitrogen-containing basic compound.

(4) The actinic ray-sensitive or radiation-sensitive resin composition as described in any one of (1) to (3) above, wherein the resin (A) contains a lactone structure-containing repeating unit.

(5) The actinic ray-sensitive or radiation-sensitive resin composition as described in any one of (1) to (4) above, wherein the resin (A) contains a repeating unit having an acid-decomposable group that contains a monocyclic or polycyclic alicyclic structure.

(6) The actinic ray-sensitive or radiation-sensitive resin composition as described in any one of (1) to (5) above, wherein when a film having a film thickness of 100 nm is formed from the actinic ray-sensitive or radiation-sensitive resin composition, the film has a transmittance of 60 to 85% for light at a wavelength of 193 nm.

(7) The actinic ray-sensitive or radiation-sensitive resin composition as described in any one of (1) to (6) above, wherein the amount of the compound (B) is from 18 to 30 mass % based on the entire solid content of the actinic ray-sensitive or radiation-sensitive resin composition.

(8) The actinic ray-sensitive or radiation-sensitive resin composition as described in any one of (1) to (7) above, wherein the resin (A) contains a repeating unit represented by the following formula (AI):

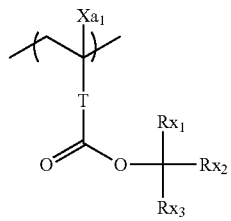

wherein $Xa_1$ represents a hydrogen atom, a methyl group or a group represented by —$CH_2$—$R_9$;

$R_9$ represents a hydroxyl group or a monovalent organic group;

T represents a single bond or a divalent linking group;

each of $Rx_1$ to $Rx_3$ independently represents an alkyl group or a cycloalkyl group; and two members out of $Rx_1$ to $Rx_3$ may combine with each other to form a cycloalkyl group.

(9) The actinic ray-sensitive or radiation-sensitive resin composition as described in any one of (1) to (8) above, which is used for immersion exposure.

(10) A pattern forming method, comprising:

forming a film from the actinic ray-sensitive or radiation-sensitive resin composition described in any one of (1) to (9) above; and subjecting the film to immersion exposure and development.

DESCRIPTION OF EMBODIMENTS

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

Furthermore, in the present invention, unless otherwise indicated, the "exposure" includes not only exposure to a mercury lamp, a far ultraviolet ray typified by an excimer laser, an X-ray, EUV light or the like but also lithography with a particle beam such as electron beam and ion beam.

By the present invention, it has been found that even when a compound capable of generating an acid upon irradiation with an actinic ray or radiation and a compound represented by formula (1-1) or (1-2) having high transparency particularly to ArF light and being in a high concentration of 10 to 30 mass % based on the entire solid content of the actinic ray-sensitive or radiation-sensitive resin composition are added, a problem does not arise in the transparency to ArF light, an effect of improving the tapered profile of a resist pattern is provided, and a pattern with good LER performance can be formed.

[1] (A) Resin Capable of Increasing the Solubility in an Alkali Developer by the Action of an Acid The actinic ray-sensitive or radiation-sensitive resin composition of the present invention contains (A) a resin capable of increasing the solubility in an alkali developer by the action of an acid.

The resin capable of increasing the solubility in an alkali developer by the action of an acid ("acid-decomposable resin") contains a group capable of decomposing by the action of an acid to produce an alkali-soluble group (hereinafter sometimes referred to as an "acid-decomposable group"), on the main chain and/or the side chain of the resin.

The resin (A) is preferably insoluble or sparingly soluble in an alkali developer.

The acid-decomposable group preferably has a structure where an alkali-soluble group is protected by a group capable of decomposing and leaving by the action of an acid.

The alkali-soluble group is not particularly limited as long as it dissociates in an alkali developer and becomes an ion, but preferred examples of the alkali-soluble group include a carboxyl group, a fluorinated alcohol group (preferably hexafluoroisopropanol) and a sulfonic acid group.

The group preferred as the acid-decomposable group is a group where a group capable of leaving by the action of an acid is substituted for a hydrogen atom of the alkali-soluble group above.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group, and $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit that can be contained in the resin (A) is preferably a repeating unit represented by the following formula (AI). Also, a repeating unit having an acid-decomposable group containing a monocyclic or polycyclic alicyclic structure is preferred.

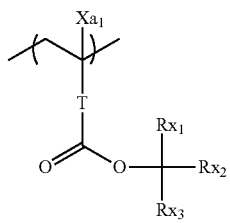

(AI)

In formula (AI), $Xa_1$ represents a hydrogen atom, a methyl group or a group represented by —$CH_2$—$R_9$. $R_9$ represents a hydroxyl group or a monovalent organic group, and examples thereof include an alkyl group having a carbon number of 5 or less and an acyl group. Of these, an alkyl group having a carbon number of 3 or less is preferred, and a methyl group is more preferred. $Xa_1$ is preferably a hydrogen atom, a methyl group, a trifluoromethyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

Two members out of $Rx_1$ to $Rx_3$ may combine with each other to form a cycloalkyl group (monocyclic or polycyclic).

Examples of the divalent linking group of T include an alkylene group, a —COO-Rt- group and a —O-Rt- group, wherein Rt represents an alkylene group or a cycloalkylene group.

T is preferably a single bond or a —COO-Rt- group. Rt is preferably an alkylene group having a carbon number of 1 to 5, more preferably a —$CH_2$— group or a —($CH_2$)$_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining two members out of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, and particularly preferably a monocyclic cycloalkyl group having a carbon number of 5 or 6.

An embodiment where $Rx_1$ is a methyl group or an ethyl group and $Rx_2$ and $Rx_3$ are combined to form the above-described cycloalkyl group is preferred.

The groups above may have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

The content in total of the acid-decomposable group-containing repeating units is preferably from 20 to 70 mol %, more preferably from 30 to 50 mol %, based on all repeating units in the resin.

Specific preferred examples of the repeating unit having an acid-decomposable group are set forth below, but the present invention is not limited thereto.

In specific examples, each of Rx and $Xa_1$ represents a hydrogen atom, $CH_3$, $CF_3$ or $CH_2OH$, each of Rxa and Rxb represents an alkyl group having a carbon number of 1 to 4, Z represents a polar group-containing substituent, for example, represents a polar group itself such as hydroxyl group, cyano group, amino group, alkylamide group and sulfonamide group, or a linear or branched alkyl group or cycloalkyl group containing any of these polar groups, and when a plurality of Z's are present, each is independent of every other Z. p represents 0 or a positive integer.

1

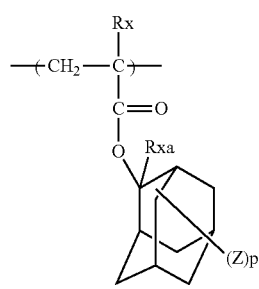

2

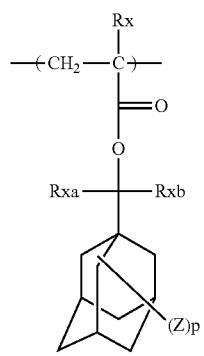

3

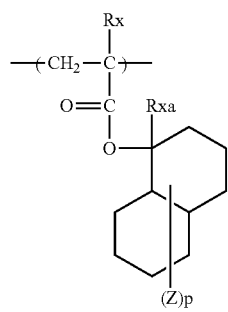

4

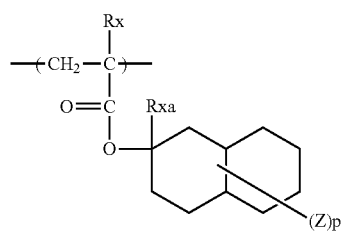

5

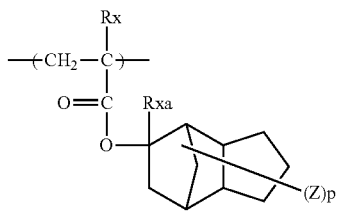

6

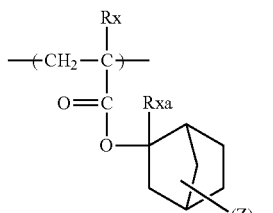

7

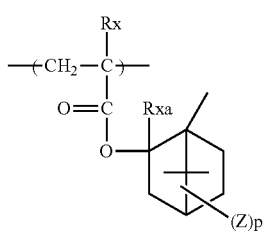

8

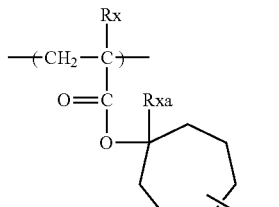

9

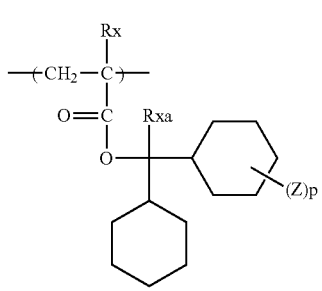

10

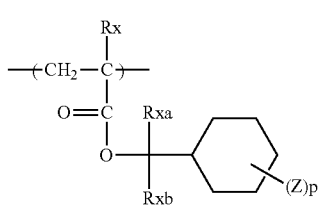

11

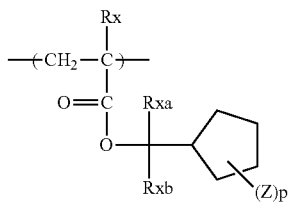

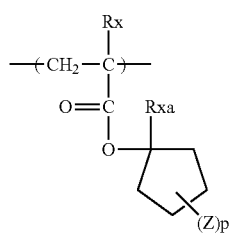
12
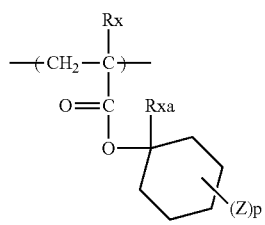
13
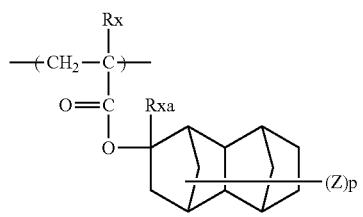
14
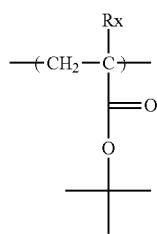
15
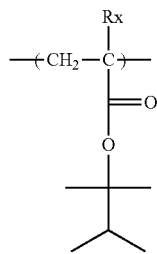
16
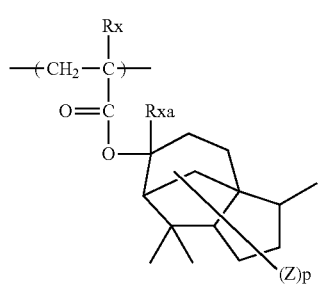
17
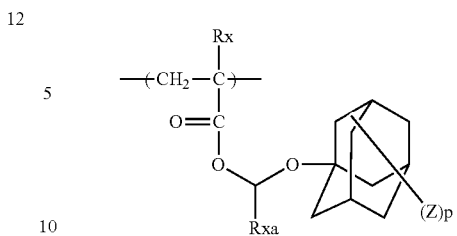
18
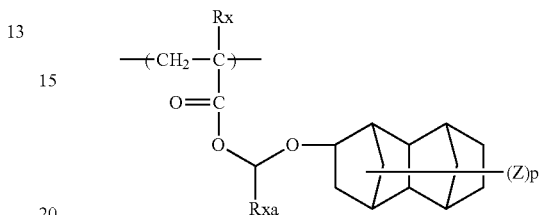
19
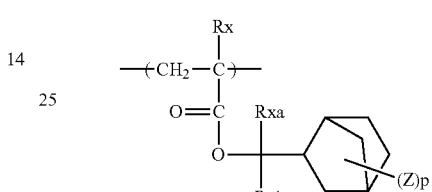
20
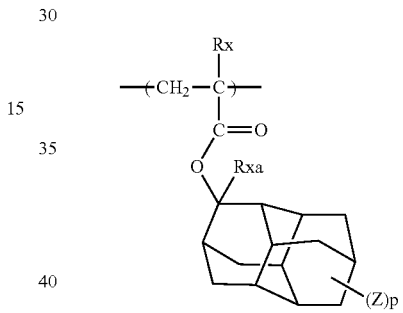
21
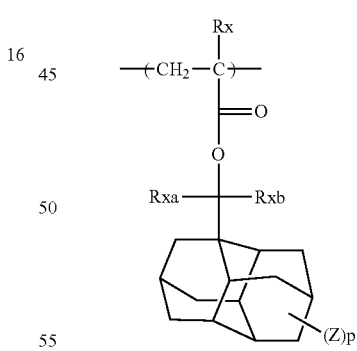
22
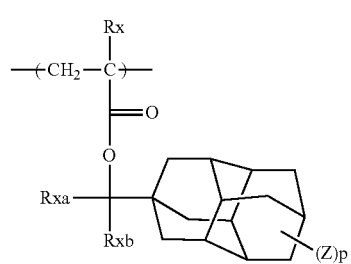
23

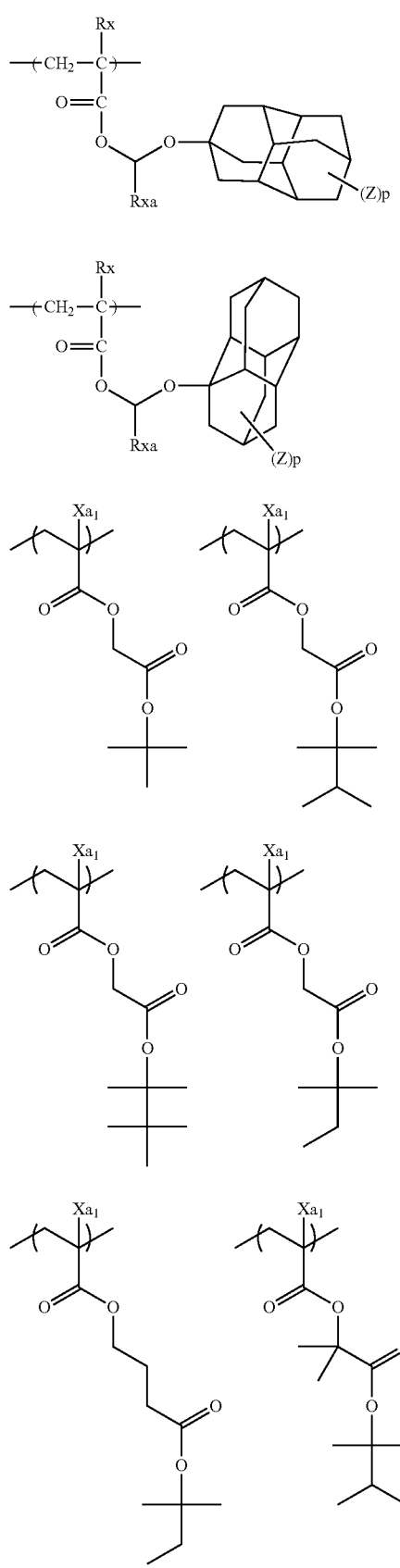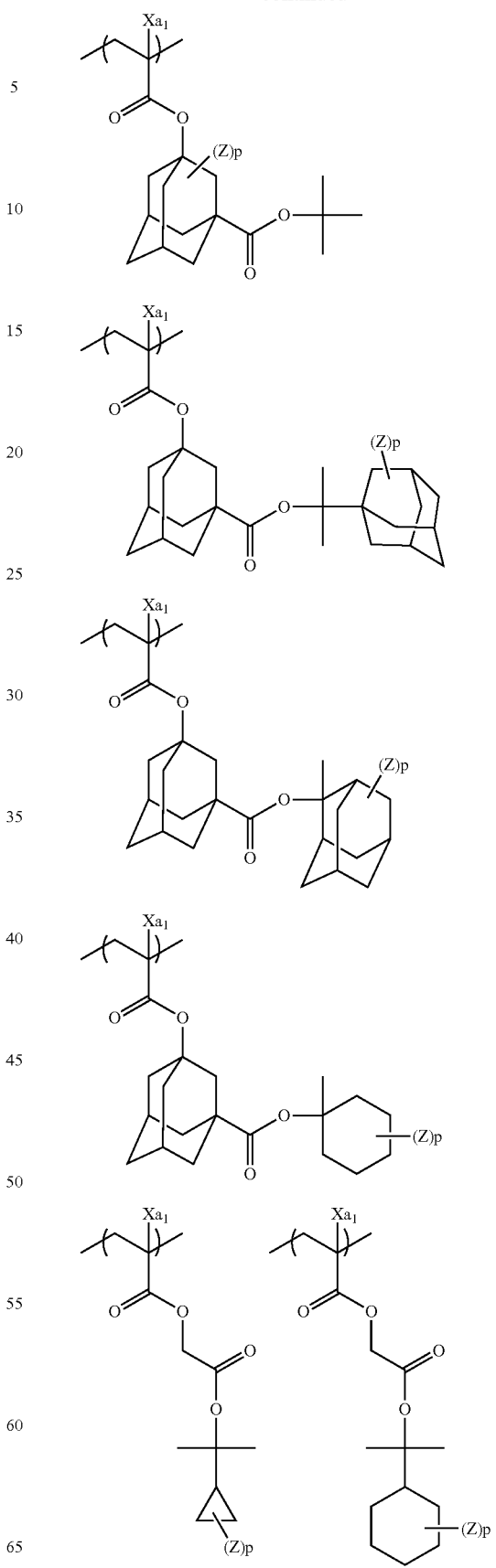

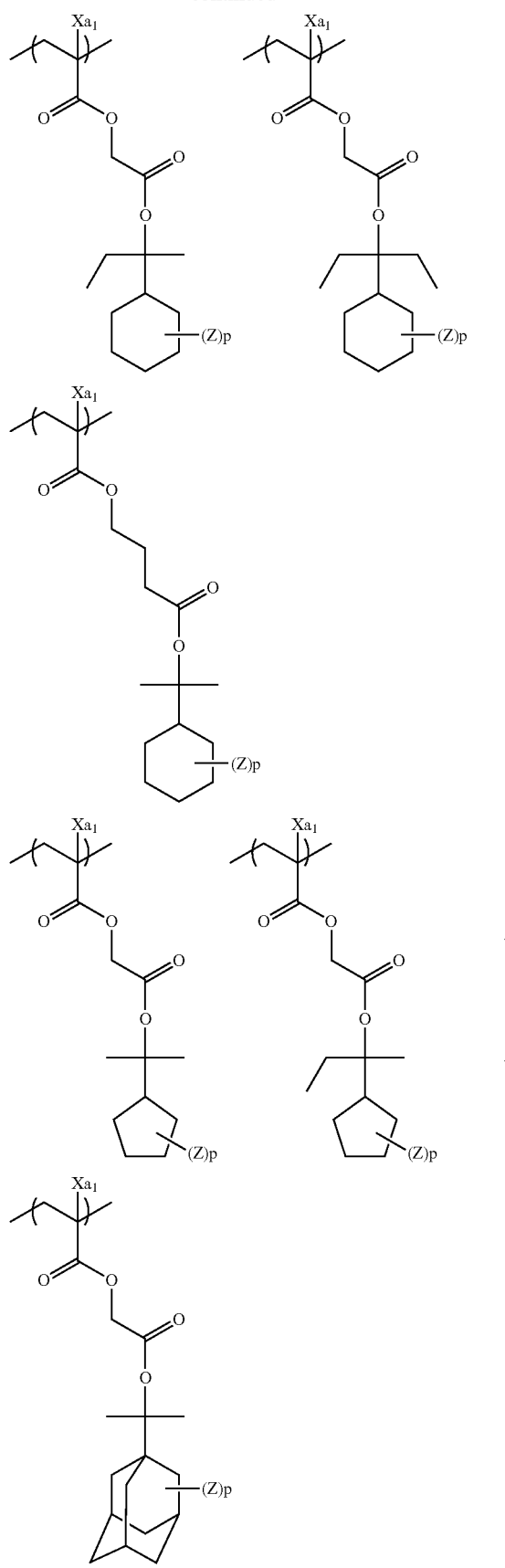
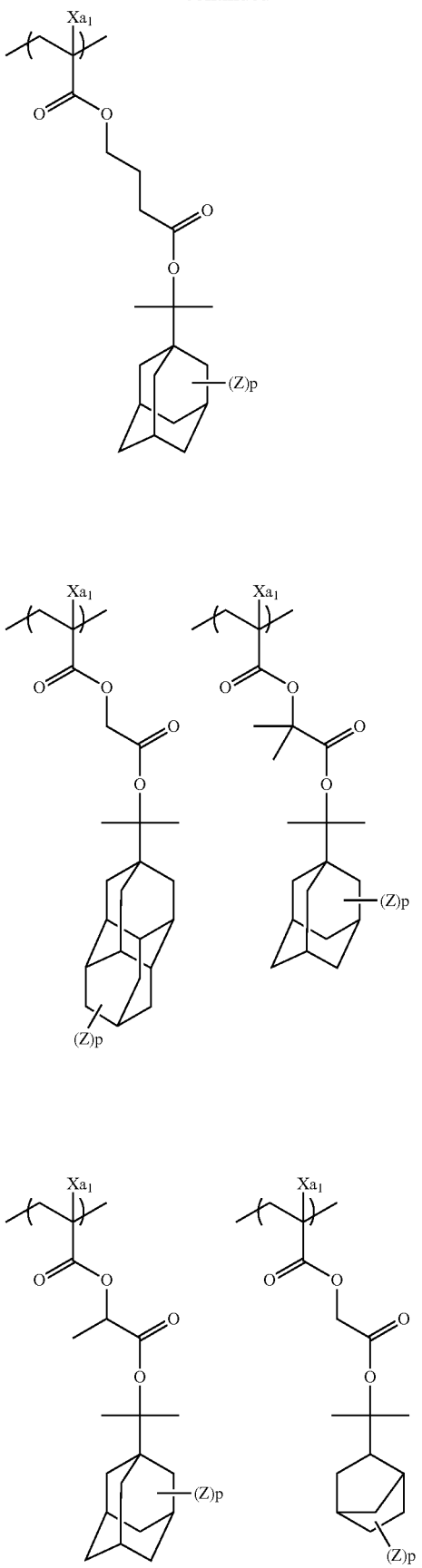

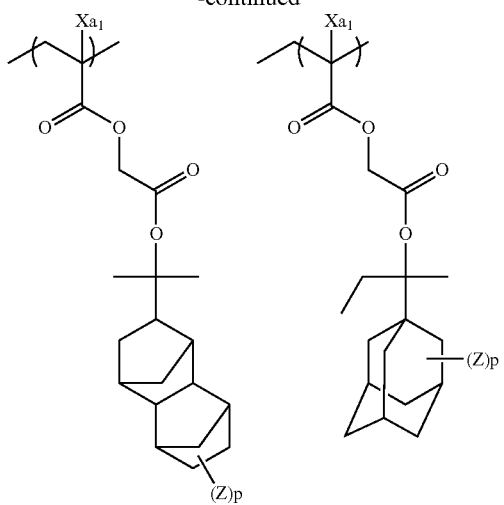
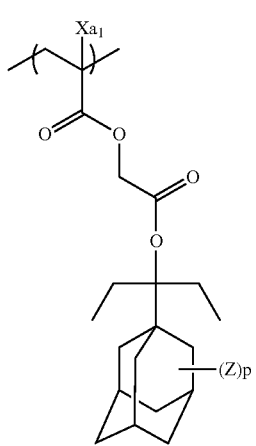
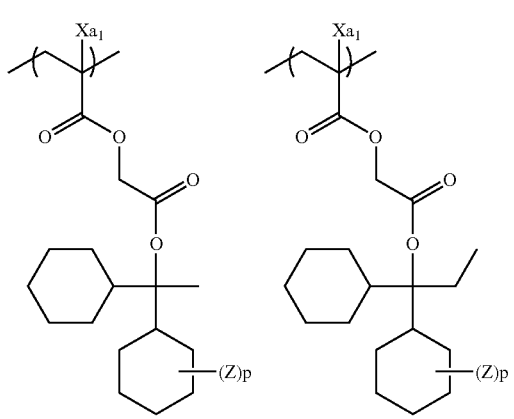
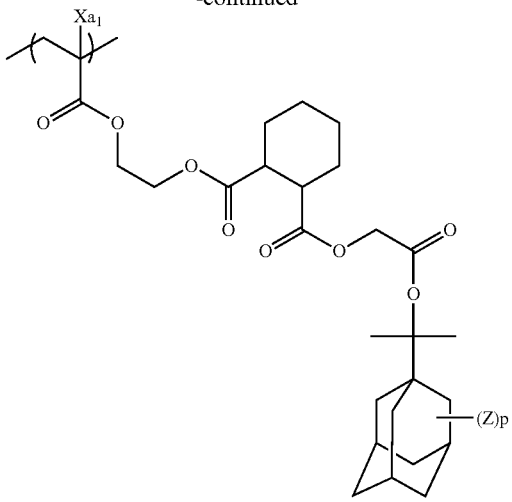
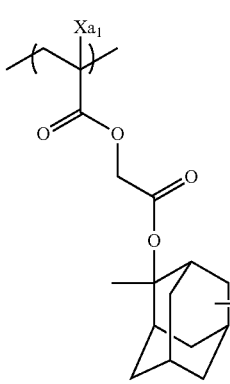
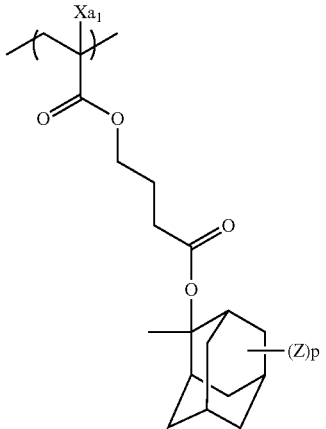
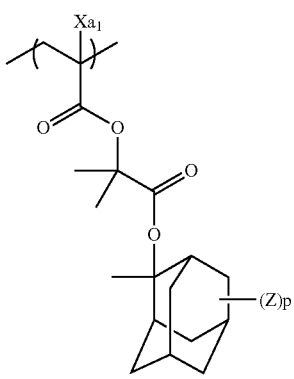

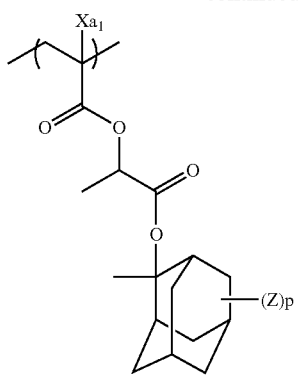
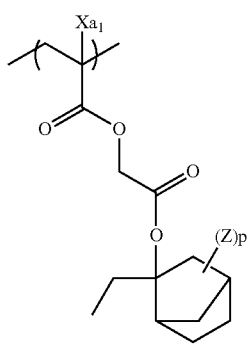
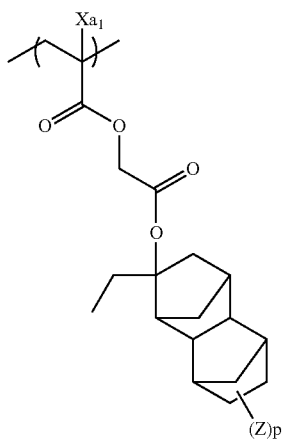
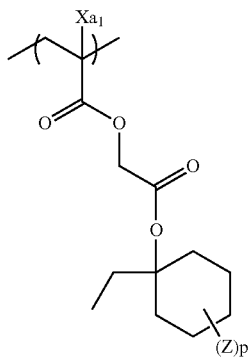
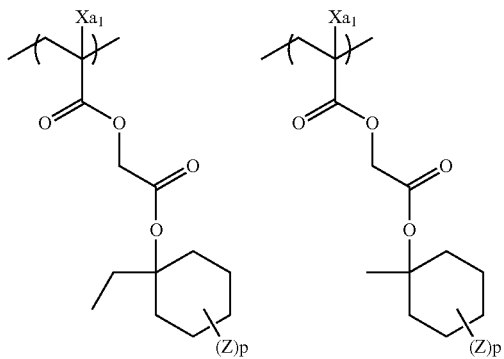
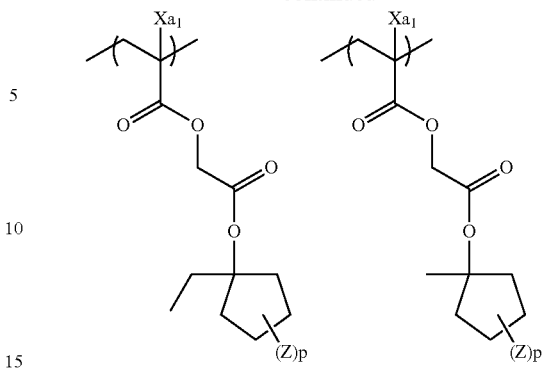
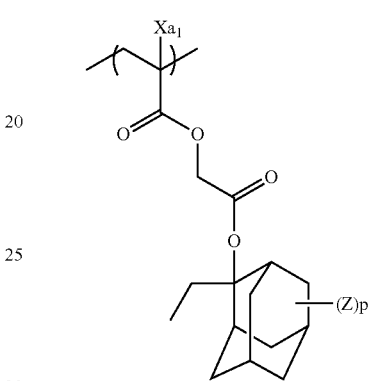
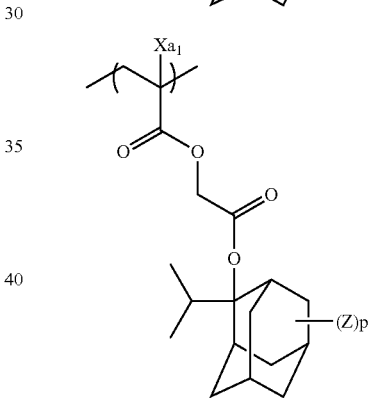

The resin (A) is preferably a resin containing, as the repeating unit represented by formula (AI), at least either a repeating unit represented by formula (1) or a repeating unit represented by formula (2). The repeating unit having an acid-decomposable group containing a monocyclic or polycyclic alicyclic structure includes a repeating unit represented by formula (1) and a repeating unit where in formula (2), —C($R_4$)($R_5$)($R_6$) contains a monocyclic or polycyclic alicyclic structure.

(1)

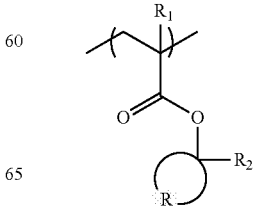

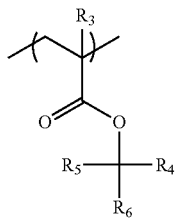

(2)

In formulae (1) and (2), each of $R_1$ and $R_3$ independently represents a hydrogen atom, a methyl group or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

$R_1$ is preferably a hydrogen atom, a methyl group, a trifluoromethyl group or a hydroxymethyl group.

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R is preferably a monocyclic alicyclic structure, and the carbon number thereof is preferably from 3 to 7, more preferably 5 or 6.

$R_3$ is preferably a hydrogen atom or a methyl group, more preferably a methyl group.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The repeating unit represented by formula (1) is preferably a repeating unit represented by the following formula (1-1):

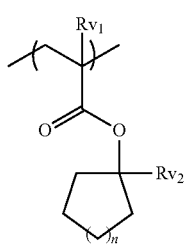

(1-1)

In formula (1-1), each of $Rv_1$ and $Rv_2$ independently represents an alkyl group having a carbon number of 1 to 10.

n represents an integer of 1 to 6.

n preferably represents 1 or 2, more preferably 1.

The alkyl group having a carbon number o 1 to 10 in $Rv_1$ and $Rv_2$ may be linear or branched and may have a substituent. Examples of the substituent include a cycloalkyl group (preferably having a carbon number of 3 to 10), a halogen atom, a hydroxyl group, an alkoxy group (preferably having a carbon number of 1 to 4), a carboxyl group and an alkoxycarbonyl group (preferably having a carbon number of 2 to 6), and those having a carbon number of 8 or less are preferred.

The repeating unit represented by formula (2) is preferably a repeating unit represented by the following formula (2-1):

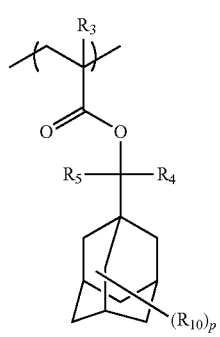

(2-1)

In formula (2-1), $R_3$ to $R_5$ have the same meanings as in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a polar group itself such as hydroxyl group, cyano group, amino group, alkylamide group and sulfonamide group, or a linear or branched alkyl group or cycloalkyl group containing any of these polar groups. An alkyl group having a hydroxyl group is preferred, and a branched alkyl group having a hydroxyl group is more preferred. The branched alkyl group is particularly preferably an isopropyl group.

p represents an integer of 0 to 15. p is preferably an integer of 0 to 2, more preferably 0 or 1.

The resin (A) may contain acid-decomposable group-containing repeating units in combination. Also, the composition of the present invention may contain a plurality of resins (A), and the resins may contain different acid-decomposable groups.

In this case, it is preferred to contain at least two different kinds of repeating units represented by formula (1), contain a repeating unit represented by formula (1) and a repeating unit represented by formula (2), or contain a repeating unit represented by formula (1-1) and a repeating unit represented by formula (2).

In the case of containing at least two kinds of repeating units represented by formula (1), preferred examples of the combination include a combination of a repeating unit where $R_2$ in formula (1) is an ethyl group and a repeating unit where the $R_2$ is a methyl group, a combination of a repeating unit where $R_2$ in formula (1) is an ethyl group and a repeating unit where the $R_2$ is a cycloalkyl group, and a combination of a repeating unit where $R_2$ in formula (1) is a methyl group or an ethyl group and the ring formed by R is adamantane and a repeating unit where $Rv_2$ in formula (1-1) is a methyl group or an ethyl group.

In the case of containing a repeating unit represented by formula (1) and a repeating unit represented by formula (2), examples of the combination include a combination of a repeating unit where $R_2$ in formula (1) is an ethyl group and a repeating unit where $R_4$ and $R_5$ in formula (2) are a methyl group and $R_6$ is an adamantyl group, and a combination of a repeating unit where $R_2$ in formula (1) is an ethyl group and a repeating unit where $R_4$ and $R_5$ in formula (2) are a methyl group and $R_6$ is a cyclohexyl group. In the case of containing a repeating unit represented by formula (1-1) and a repeating unit represented by formula (2), examples of the combination include a combination of a repeating unit where $Rv_2$ in formula (1-1) is an ethyl group and n is 1 and a repeating unit where $R_4$ and $R_5$ in formula (2) are a methyl group and $R_6$ is an adamantyl group, and a combination of a repeating unit where $Rv_2$ in formula (1-1) is an ethyl group and n is 2 and a repeating unit where $R_4$ and $R_5$ in formula (2) are a methyl group and $R_6$ is a cyclohexyl group.

In the resin (A), when acid-decomposable repeating units are used in combination, preferred examples of the combination are set forth below. In the following formulae, each R independently represents a hydrogen atom or a methyl group.

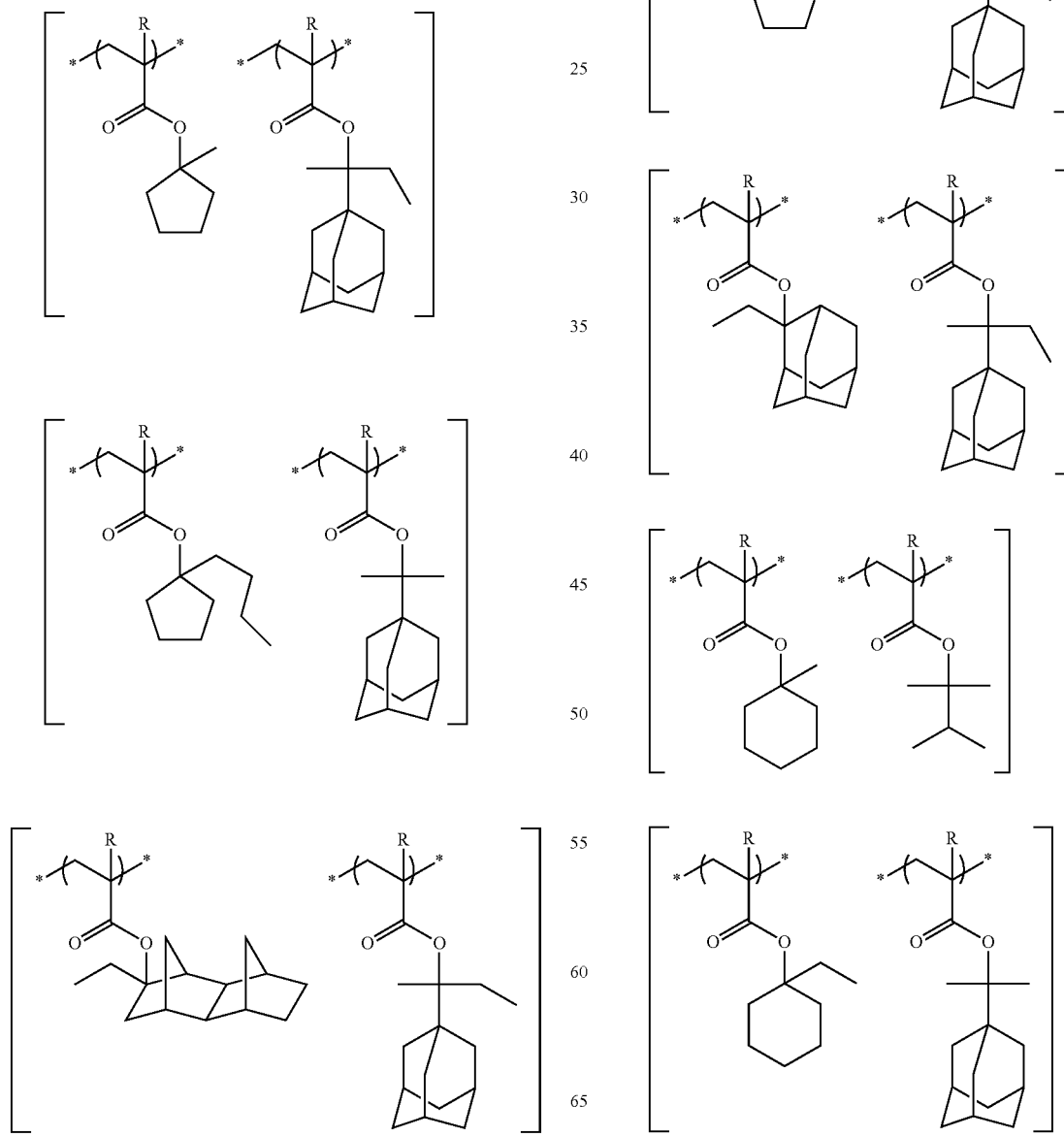

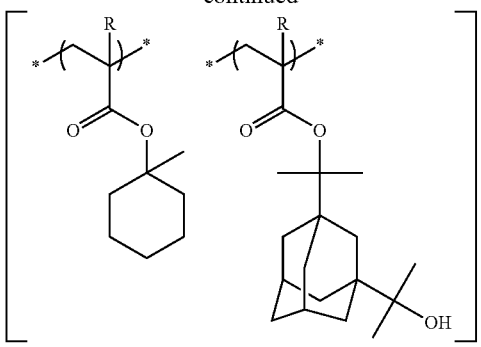
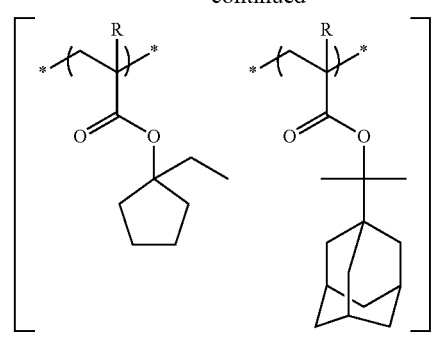
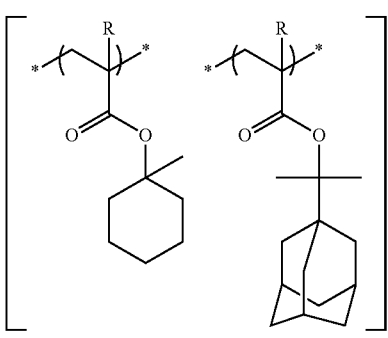
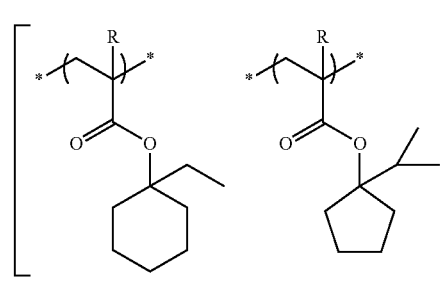
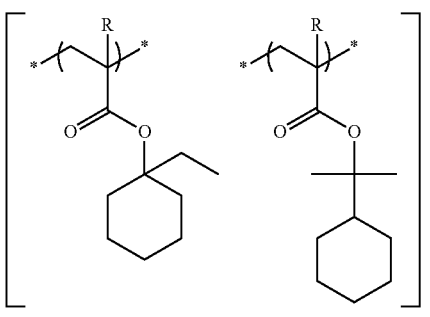
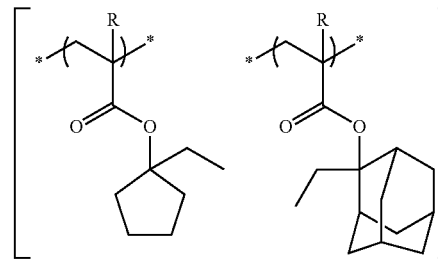
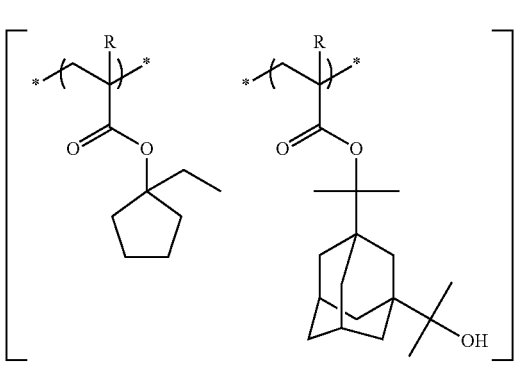
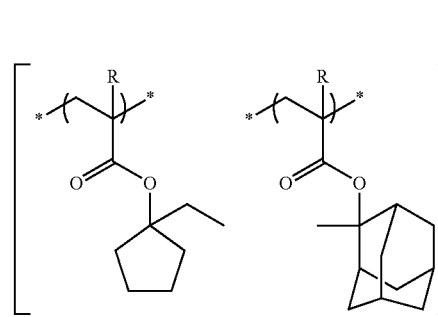
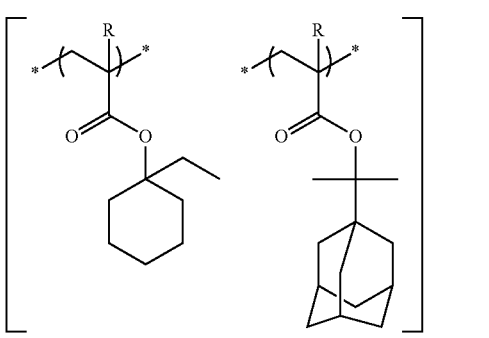
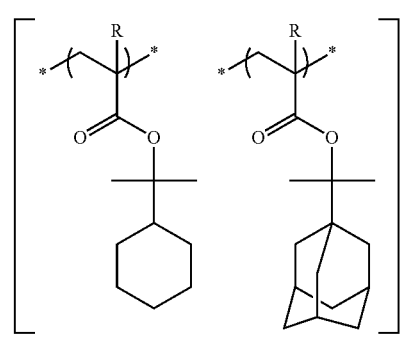

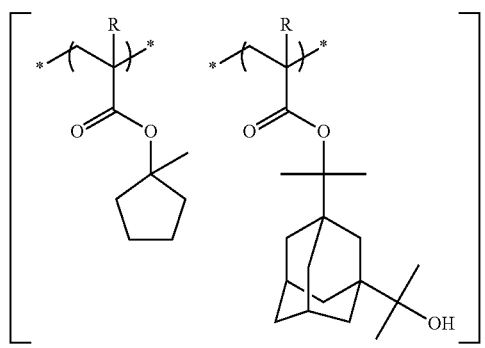
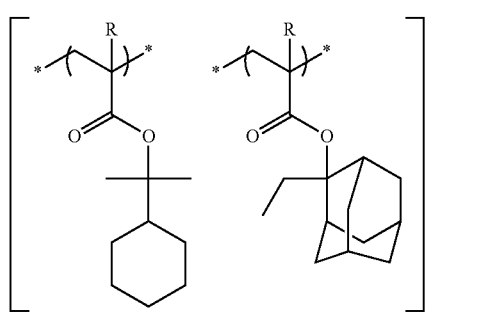
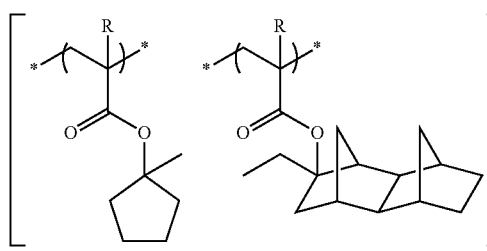
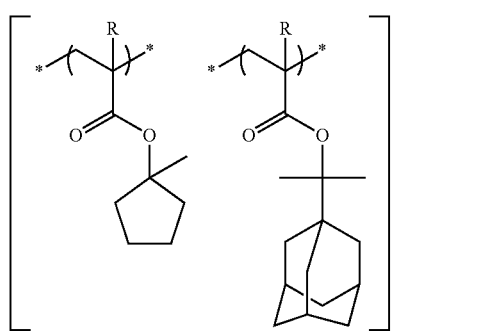

The resin (A) preferably contains a repeating unit having a lactone group.

As for the lactone group, any group may be used as long as it has a lactone structure, but the lactone structure is preferably a 5- to 7-membered ring lactone structure, and a structure where another ring structure is condensed with a 5- to 7-membered ring lactone structure in the form of forming a bicyclo or Spiro structure is preferred. The resin more preferably contains a repeating unit having a lactone structure represented by any one of the following formulae (LC1-1) to (LC1-17). The lactone structure may be bonded directly to the main chain. Among these lactone structures, preferred are (LC1-1), (LC1-4), (LC1-5), (LC1-6), (LC1-13), (LC1-14) and (LC1-17). By using a specific lactone structure, LER and development defect are improved.

LC1-1
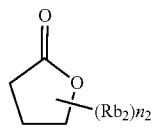

LC1-2
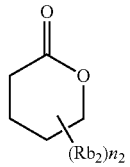

LC1-3
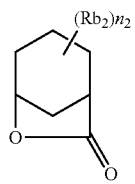

LC1-4
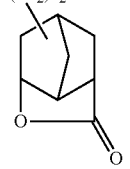

LC1-5
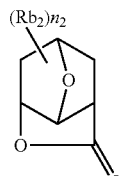

LC1-6
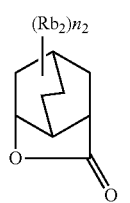

LC1-7
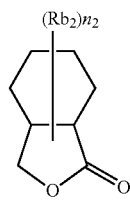

LC1-8
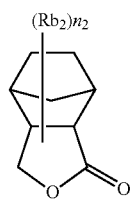

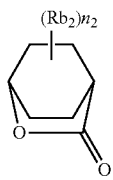

LC1-9

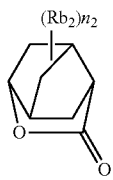

LC1-10

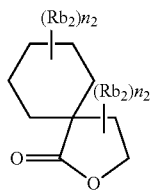

LC1-11

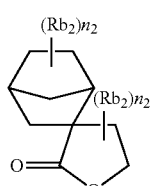

LC1-12

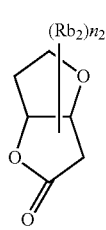

LC1-13

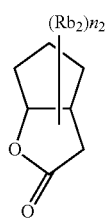

LC1-14

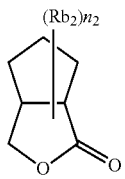

LC1-15

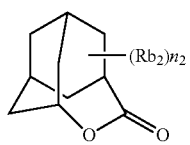

LC1-16

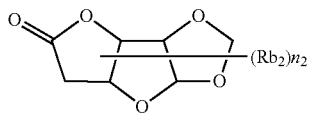

LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituent ($Rb_2$) and also, the plurality of substituents ($Rb_2$) may combine with each other to form a ring.

The repeating unit having a lactone structure is preferably a repeating unit represented by the following formula (AII):

(AII)

In formula (AII), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent linking group comprising a combination thereof, and is preferably a single bond or a divalent linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically represents a group having, for example, a structure represented by any one of formulae (LC1-1) to (LC1-17).

Out of units represented by formula (AII), the lactone group-containing repeating unit particularly preferred when Ab is a single bond includes the following repeating units. In specific examples, Rx is H, $CH_3$, $CH_2OH$ or $CF_3$. By selecting an optimal lactone group, the pattern profile and iso/dense bias are improved.

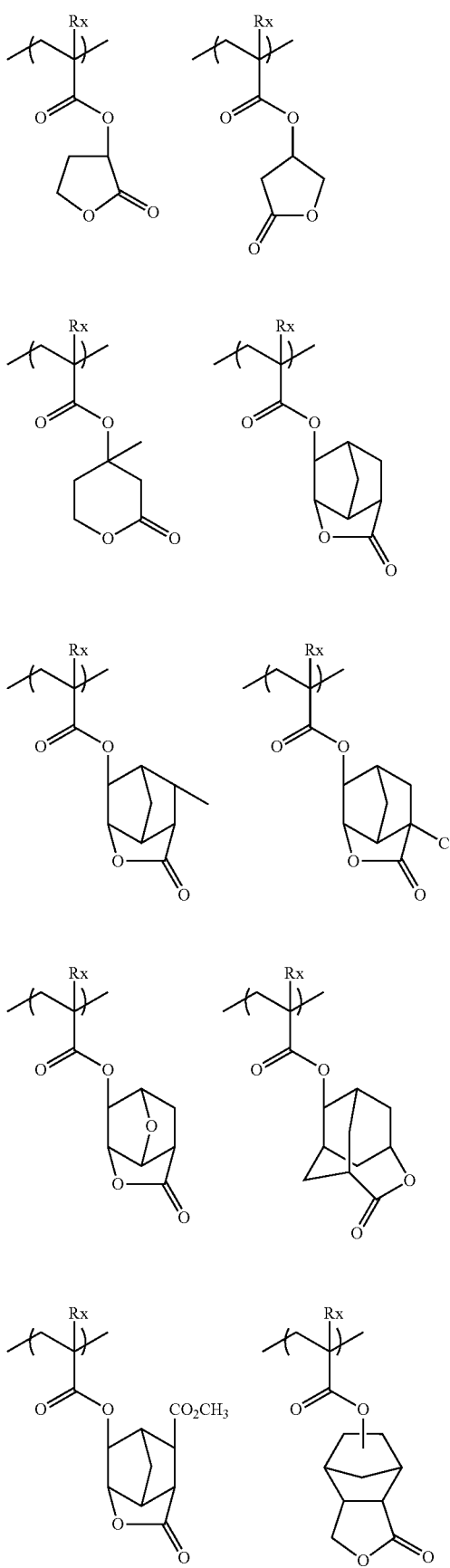

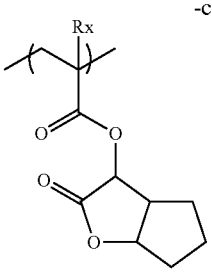 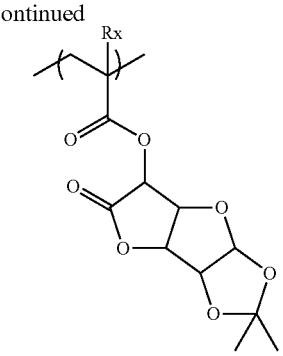

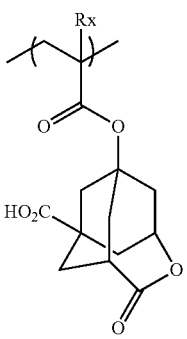 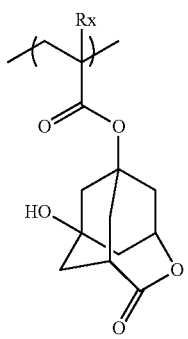

The resin (A) preferably contains a lactone structure-containing repeating unit represented by the following formula (3):

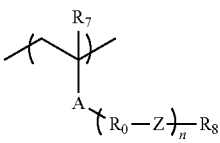

(3)

In formula (3), A represents an ester bond (a group represented by —COO—) or an amide bond (a group represented by —CONH—).

$R_0$ represents, when a plurality of $R_0$'s are present, each independently represents, an alkylene group, a cycloalkylene group or a combination thereof.

Z represents, when a plurality of Z's are present, each independently represents, an ether bond, an ester bond, an amide bond, a urethane bond or a urea bond.

$R_8$ represents a monovalent organic group having a lactone structure. n is a repetition number of the structure represented by —$R_0$—Z— in the repeating unit represented by formula (3) and represents an integer of 1 to 5.

$R_7$ represents a hydrogen atom, a halogen atom or an alkyl group.

The alkylene group and cyclic alkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group. The alkyl group in $R_7$ may be substituted, and examples of the substituent include a halogen atom such as fluorine atom, chlorine atom and bromine atom, a mercapto group, a hydroxy group, an alkoxy group such as methoxy group, ethoxy group, isopropoxy group, tert-butoxy group and benzyloxy group, and an acetoxy group such as acetyl group and propionyl group. $R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably a chain alkylene group having a carbon number of 1 to 5, and examples thereof include a methylene group, an ethylene group and a propylene group. The cyclic alkylene is preferably a cyclic alkylene having a carbon number of 3 to 20, and examples thereof include cyclohexylene, cyclopentylene, norbornylene and adamantylene. For bringing out the effects of the present invention, a chain alkylene group is more preferred, and a methylene group is still more preferred.

The lactone structure-containing substituent represented by $R_8$ is not limited as long as it has a lactone structure. Specific examples thereof include lactone structures represented by formulae (LC1-1) to (LC1-17) and of these, a structure represented by (LC1-4) is preferred. Structures where $n_2$ in (LC1-1) to (LC1-17) is an integer of 2 or less are more preferred.

$R_8$ is preferably a monovalent organic group having an unsubstituted lactone structure or a monovalent organic group containing a lactone structure having a methyl group, a cyano group or an alkoxycarbonyl group as the substituent, more preferably a monovalent organic group containing a lactone structure having a cyano group as the substituent (cyanolactone).

Specific examples of the repeating unit having a lactone structure-containing group represented by formula (3) are set forth below, but the present invention is not limited thereto.

In specific examples below, R represents a hydrogen atom, an alkyl group which may have a substituent, or a halogen atom and is preferably a hydrogen atom, a methyl group, or an alkyl group having a substituent, that is, a hydroxymethyl group or an acetoxymethyl group.

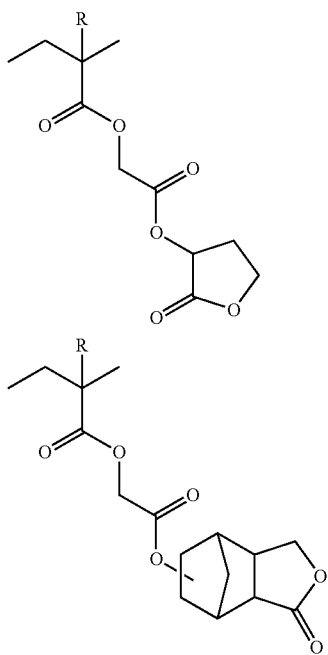

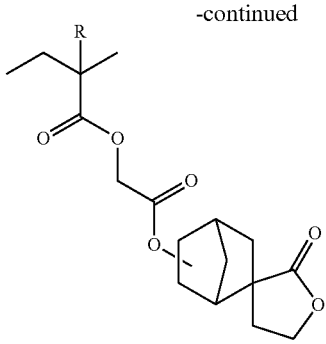

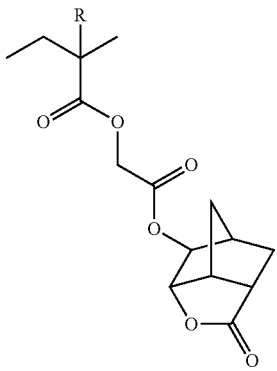

The lactone structure-containing repeating unit is preferably a repeating unit represented by the following formula (3-1):

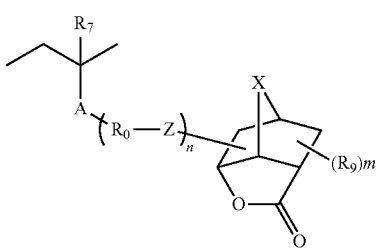

(3-1)

In formula (3-1), $R_7$, A, $R_0$, Z and n have the same meanings as in formula (3).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine with each other to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. Examples of the ester group include a methoxycarbonyl group, an ethoxycarbonyl group, an n-butoxycarbonyl group and a tert-butoxycarbonyl group. Examples of the substituent include a hydroxyl group, an alkoxy group such as methoxy group and ethoxy group, a cyano group, and a halogen atom such as fluorine atom.

R₉ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is 1, R₉ is preferably substituted on the α-position or β-position, more preferably on the α-position, of the carbonyl group of lactone Specific examples of the repeating unit having a lactone structure-containing group represented by formula (3-1) are set forth below, but the present invention is not limited thereto. In the formulae, R represents a hydrogen atom, an alkyl group which may have a substituent, or a halogen atom, preferably a hydrogen atom, a methyl group, or an alkyl group having a substituent, that is, a hydroxymethyl group or an acetoxymethyl group.

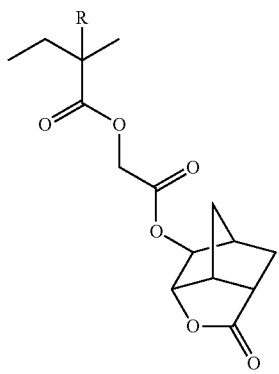

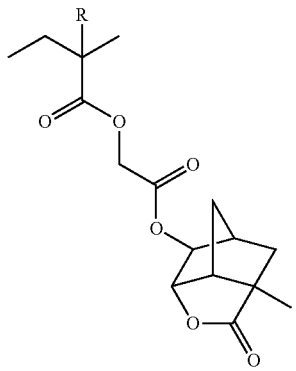

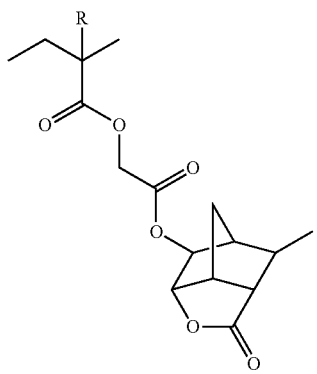

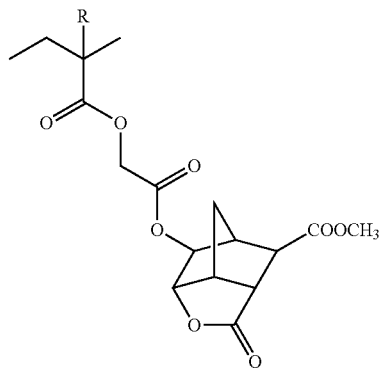

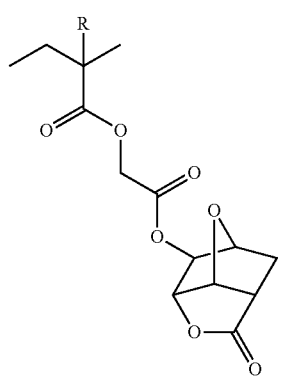

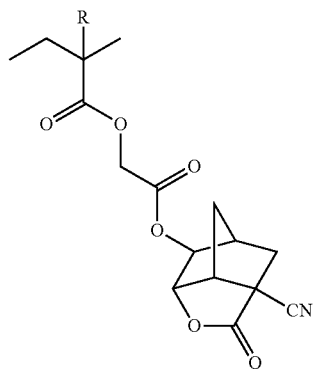

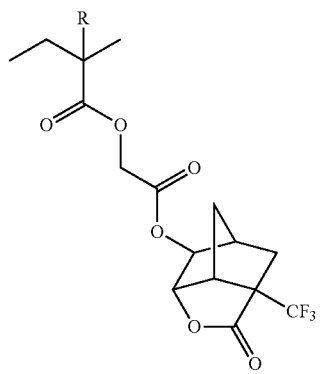

35
-continued
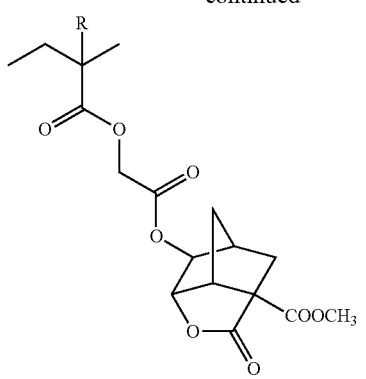
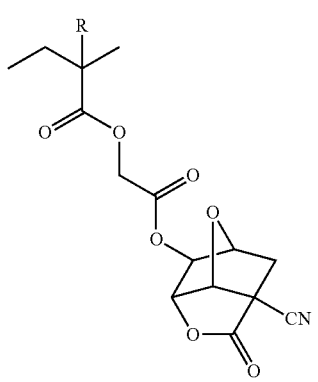
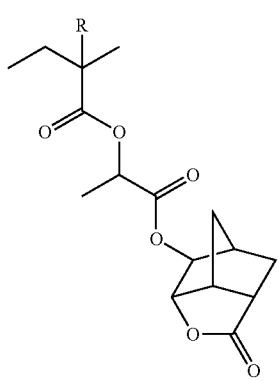
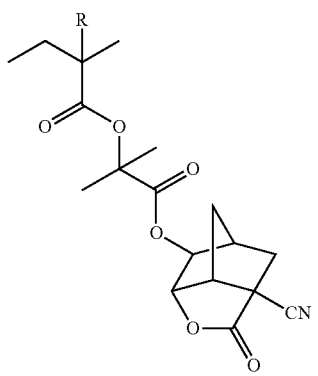
36
-continued
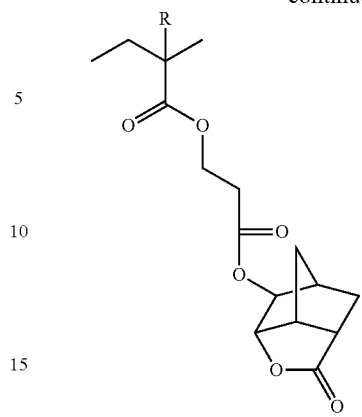
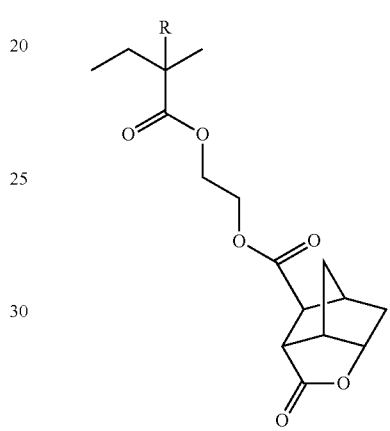
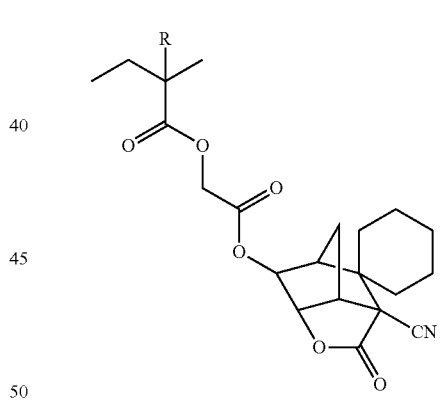
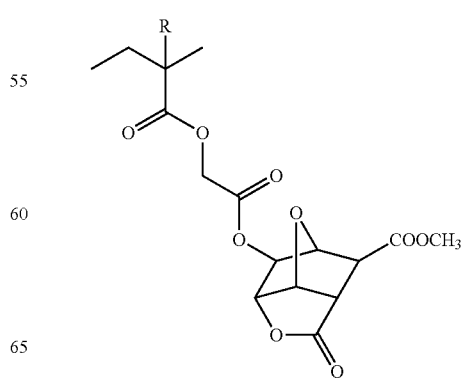

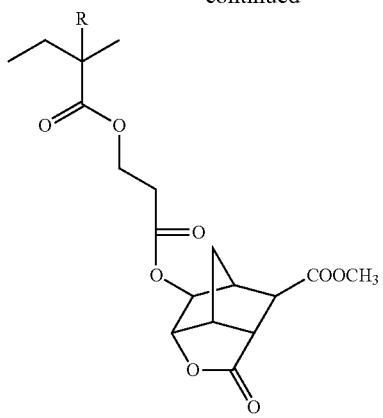
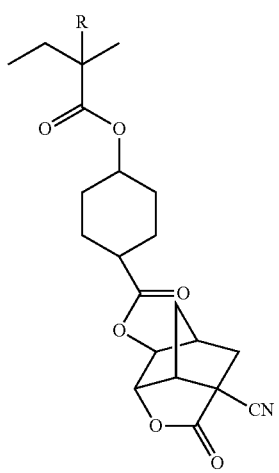
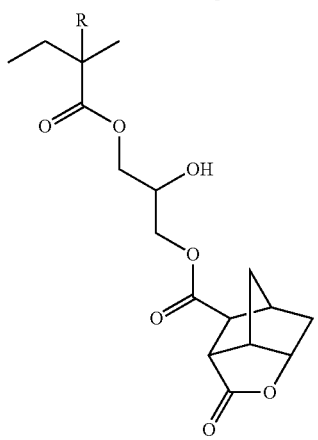
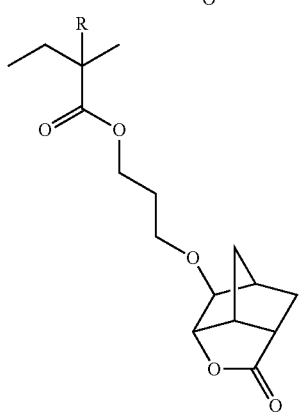
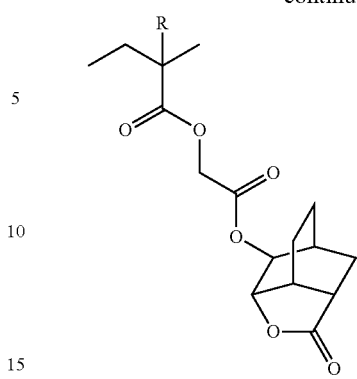

The repeating unit having a lactone group usually has an optical isomer, but any optical isomer may be used.

The content of the repeating unit having a lactone group is preferably from 15 to 60 mol %, more preferably from 20 to 50 mol %, still more preferably from 30 to 50 mol %, based on all repeating units in the resin.

Two or more kinds of lactone structure repeating units selected from formula (3) may also be used in combination for raising the effects of the present invention. In the case of combination use, two or more kinds of lactone repeating units where n is 1 out of formula (3) are preferably selected and used in combination. It is also preferred to use in combination a lactone repeating unit where Ab in formula (AII) is a single bond and a lactone repeating unit where n is 1 out of formula (3).

The resin (A) preferably contains a repeating unit having a hydroxyl group or a cyano group (when, for example, a repeating unit represented by formula (3) or (AI) contains a hydroxyl group or a cyano group, this is not included in the repeating unit above). Thanks to this repeating unit, the adherence to substrate and the affinity for developer are enhanced. The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornyl group. Preferred examples of the alicyclic hydrocarbon structure substituted by a hydroxyl group or a cyano group include a monohydroxyadamantyl group, a dihydroxyadamantyl group, a monohydroxydiamantyl group, a dihydroxydiamantyl group and a cyano group-substituted norbornyl group.

The repeating unit having the above-described atomic group includes repeating units represented by the following formulae (AIIa) to (AIId):

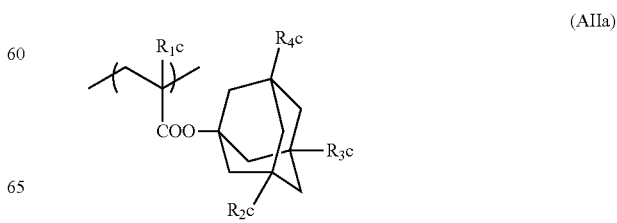

(AIIa)

-continued

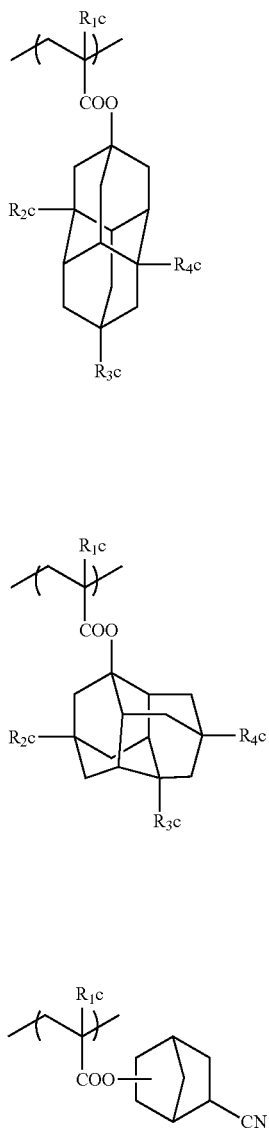

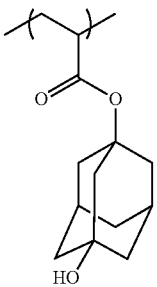 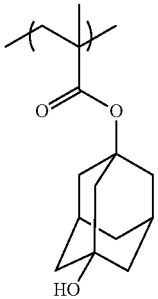

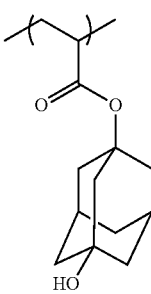 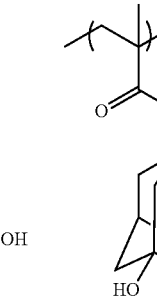

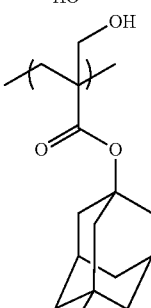

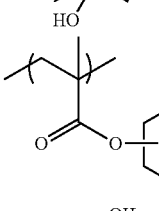

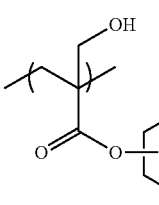

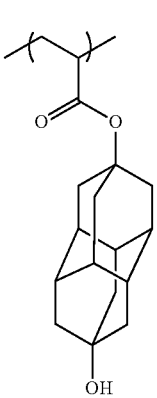 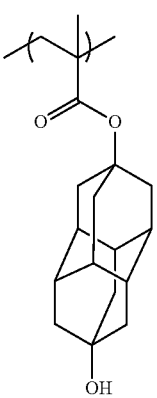

In formulae (AIIa) to (AIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, provided that at least one of $R_2c$ to $R_4c$ represents a hydroxyl group or a cyano group. A structure where one or two members out of $R_2c$ to $R_4c$ are a hydroxyl group with the remaining being a hydrogen atom is preferred. In formula (AIIa), it is more preferred that two members out of $R_2c$ to $R_4c$ are a hydroxyl group and the remaining is a hydrogen atom.

The content of the repeating unit having a hydroxyl group or a cyano group is preferably from 5 to 40 mol %, more preferably from 5 to 30 mol %, still more preferably from 10 to 25 mol %, based on all repeating units in the resin (A).

Specific examples of the repeating unit having a hydroxyl group or a cyano group are set forth below, but the present invention is not limited thereto.

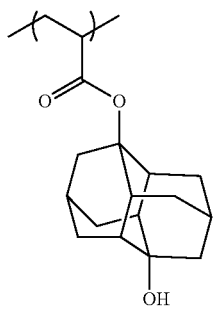 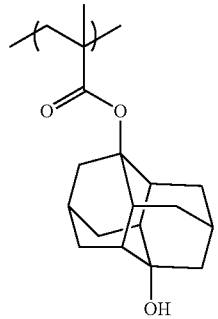

The resin for use in the actinic ray-sensitive or radiation-sensitive resin composition of the present invention may contain a repeating unit having an alkali-soluble group. The alkali-soluble group includes a carboxyl group, a sulfonamide group, a sulfonylimide group, a bissulfonylimide group, and an aliphatic alcohol with the α-position being substituted by an electron-withdrawing group, such as hexafluoroisopropanol group. It is more preferred to contain a repeating unit having a carboxyl group. By virtue of containing a repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic hydrocarbon structure. Above all, a repeating unit by an acrylic acid or a methacrylic acid is preferred.

The content of the repeating unit having an alkali-soluble group is preferably from 0 to 20 mol %, more preferably from 3 to 15 mol %, still more preferably from 5 to 10 mol %, based on all repeating units in the resin (A).

Specific examples of the repeating unit having an alkali-soluble group are set forth below, but the present invention is not limited thereto. In specific examples, Rx is H, $CH_3$, $CH_2OH$ or $CF_3$.

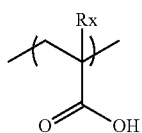 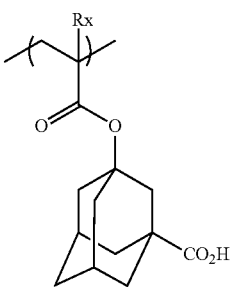

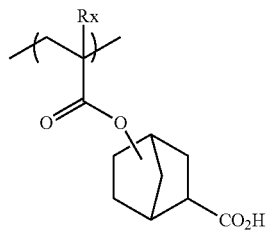 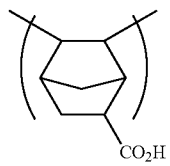

 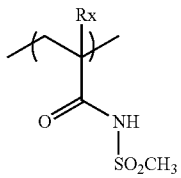

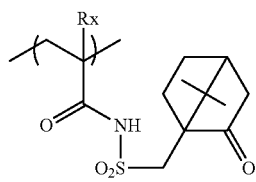 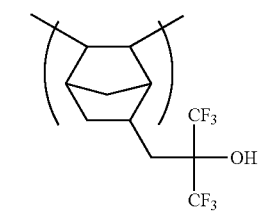

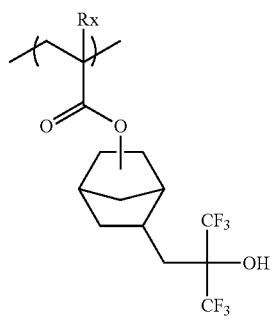

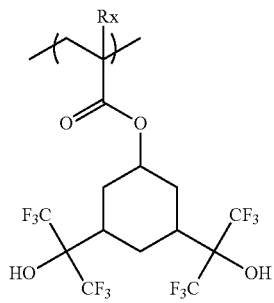

The resin (A) for use in the present invention preferably further contains a repeating unit having a polar group-free alicyclic hydrocarbon structure and not exhibiting acid decomposability. Thanks to this repeating unit, elution of a low molecular component into the immersion liquid from the film formed of the actinic ray-sensitive or radiation-sensitive resin composition can be reduced at the immersion exposure. Such a repeating unit includes a repeating unit represented by formula (4):

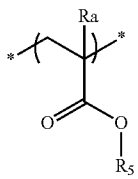

(4)

In formula (4), $R_5$ represents a hydrocarbon group having at least one cyclic structure and having neither a hydroxyl group nor a cyano group.

Ra represents a hydrogen atom, an alkyl group or a —$CH_2$—O—$Ra_2$ group, wherein $Ra_2$ represents a hydrogen atom, an alkyl group or an acyl group. Ra is preferably a hydrogen atom, a methyl group, a hydroxymethyl group or a trifluoromethyl group, more preferably a hydrogen atom or a methyl group.

The cyclic structure of $R_5$ includes a monocyclic hydrocarbon group and a polycyclic hydrocarbon group. Examples of the monocyclic hydrocarbon group include a cycloalkyl group having a carbon number of 3 to 12 and a cycloalkenyl group having a carbon number of 3 to 12. The monocyclic hydrocarbon group is preferably a monocyclic hydrocarbon group having a carbon number of 3 to 7.

The polycyclic hydrocarbon group includes a ring gathered hydrocarbon group and a crosslinked cyclic hydrocarbon group. Examples of the crosslinked cyclic hydrocarbon ring include a bicyclic hydrocarbon ring, a tricyclic hydrocarbon ring and a tetracyclic hydrocarbon ring. The crosslinked cyclic hydrocarbon ring also includes a condensed cyclic hydrocarbon ring (for example, a condensed ring formed by condensing a plurality of 5- to 8-membered cycloalkane rings). As for the crosslinked cyclic hydrocarbon ring, a norbornyl group and an adamantyl group are preferred.

These alicyclic hydrocarbon groups may have a substituent, and preferred examples of the substituent include a halogen atom, an alkyl group, a hydroxyl group protected by a protective group, and an amino group protected by a protective group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom, an alkyl group, a hydroxyl group protected by a protective group, and an amino group protected by a protective group.

Examples of the protective group include an alkyl group, a cycloalkyl group, an aralkyl group, a substituted methyl group, a substituted ethyl group, an alkoxycarbonyl group and an aralkyloxycarbonyl group. The alkyl group is preferably an alkyl group having a carbon number of 1 to 4; the substituted methyl group is preferably a methoxymethyl group, a methoxythiomethyl group, a benzyloxymethyl group, a tert-butoxymethyl group or a 2-methoxyethoxymethyl group; the substituted ethyl group is preferably a 1-ethoxyethyl group or a 1-methyl-1-methoxyethyl group; the acyl group is preferably an aliphatic acyl group having a carbon number of 1 to 6, such as formyl group, acetyl group, propionyl group, butyryl group, isobutyryl group, valeryl group and pivaloyl group; and the alkoxycarbonyl group is preferably an alkoxycarbonyl group having a carbon number of 1 to 4.

The content of the repeating unit having a polar group-free alicyclic hydrocarbon structure and not exhibiting acid decomposability is preferably from 0 to 40 mol %, more preferably from 0 to 20 mol %, based on all repeating units in the resin (A).

Specific examples of the repeating unit having a polar group-free alicyclic hydrocarbon structure and not exhibiting acid decomposability are set forth below, but the present invention is not limited thereto. In the formulae, Ra represents H, $CH_3$, $CH_2OH$ or $CF_3$.

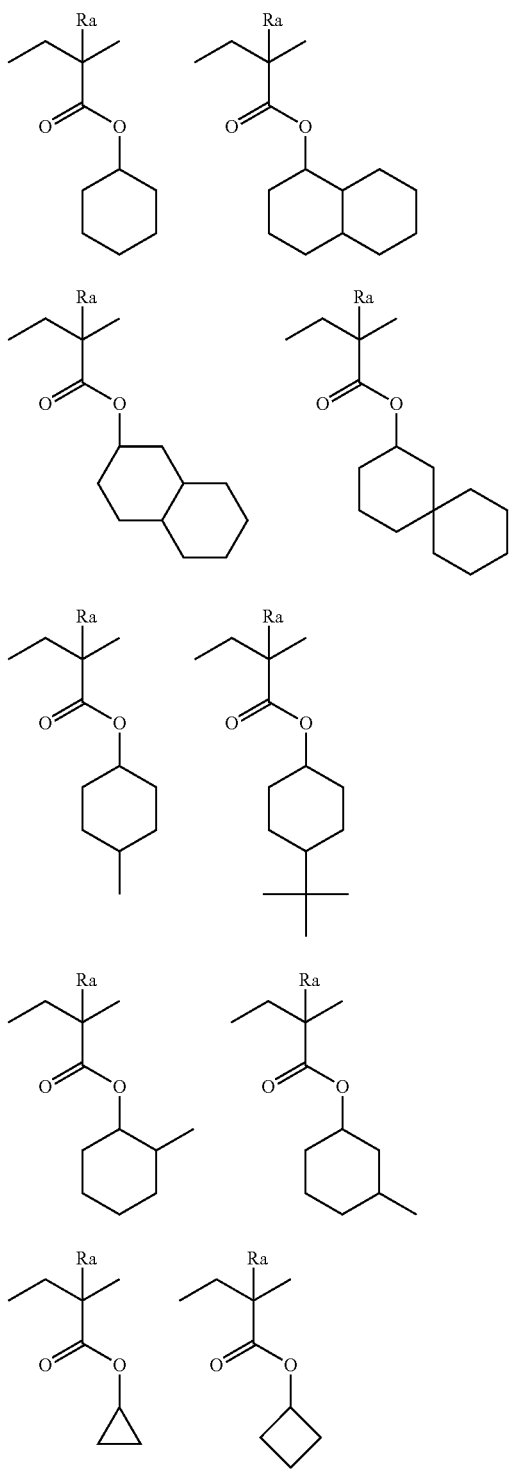

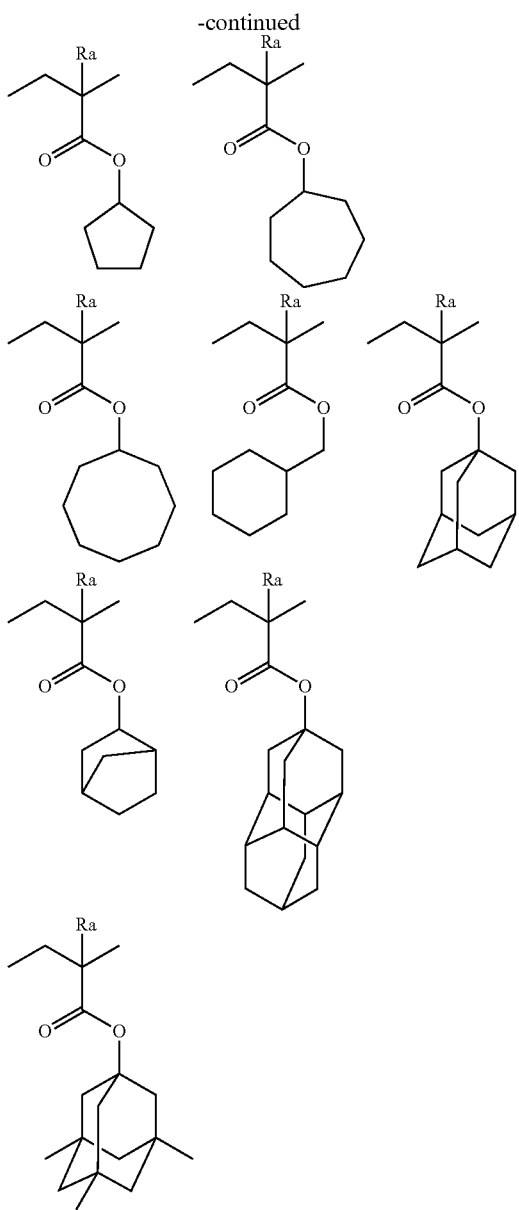

The resin for use in the actinic ray-sensitive or radiation-sensitive resin composition of the present invention may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to such a repeating structural unit, the performance required of the resin for use in the actinic ray-sensitive or radiation-sensitive resin composition of the present invention, particularly (1) solubility in the coating solvent, (2) film-forming property (glass transition point), (3) alkali developability, (4) film loss (selection of hydrophilic, hydrophobic or alkali-soluble group), (5) adherence of unexposed area to substrate, (6) dry etching resistance and the like can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A) for use in the actinic ray-sensitive or radiation-sensitive resin composition of the present invention, the molar ratio of respective repeating structural units contained is appropriately determined to control the dry etching resistance of resist, suitability for standard developer, adherence to substrate, resist profile and performances generally required of a resist, such as resolution, heat resistance and sensitivity.

In the case where the actinic ray-sensitive or radiation-sensitive resin composition of the present invention is used for ArF exposure, the resin (A) for use in the actinic ray-sensitive or radiation-sensitive resin composition of the present invention preferably has no aromatic group in view of transparency to ArF light.

Also, the resin (A) preferably contains no fluorine atom and no silicon atom in view of compatibility with the later-described hydrophobic resin (C).

The resin (A) for use in the actinic ray-sensitive or radiation-sensitive resin composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit or an acrylate-based repeating unit, but the content of the acrylate-based repeating unit is preferably 50 mol % or less based on all repeating units.

Incidentally, from the standpoint of enhancing the etching resistance of the resist film, the proportion of the acrylate-based repeating unit is preferably larger, and the content of the acrylate-based repeating unit is preferably from 40 to 100 mol %, more preferably from 60 to 100 mol %.

Also, the resin is preferably a copolymerized polymer containing from 20 to 50 mol % of an acid decomposable group-containing (meth)acrylate-based repeating unit, from 20 to 50 mol % of a lactone group-containing (meth)acrylate-based repeating unit, from 5 to 30 mol % of a (meth)acrylate-based repeating unit having an alicyclic hydrocarbon structure substituted by a hydroxyl group or a cyano group, and from 0 to 20 mol % of other (meth)acrylate-based repeating units.

The resin (A) for use in the present invention can be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is collected by a method such as powder or solid recovery. The concentration at the reaction is from 5 to 50 mass %, preferably from 10 to 30 mass %, and the reaction temperature is usually from 10 to 150° C., preferably from 30 to 120° C., more preferably from 60 to 100° C. (In this specification, mass ratio is equal to weight ratio).

The weight average molecular weight of the resin (A) for use in the present invention is preferably from 1,000 to 200,000, more preferably from 2,000 to 20,000, still more preferably from 3,000 to 15,000, yet still more preferably from 3,000 to 10,000, in terms of polystyrene by the GPC method. When the weight average molecular weight is in the range above, deterioration of heat resistance, dry etching resistance and developability can be avoided and the film-forming property can be prevented from deteriorating due to increase in the viscosity.

The polydispersity (molecular weight distribution) is usually from 1 to 3, preferably from 1 to 2.6, more preferably from 1 to 2, still more preferably from 1.4 to 2.0. As the molecular weight distribution is smaller, the resolution and resist profile are more excellent, the side wall of the resist pattern is smoother, and the roughness is more improved.

The amount of the resin blended in the entire composition of the actinic ray-sensitive or radiation-sensitive resin composition of the present invention is generally from 68 to 90 mass %, preferably from 68 to 88 mass %, more preferably from 68 to 80 mass %, still more preferably from 68 to 78 mass %, particularly preferably from 72 to 78 mass %, based on the entire solid content.

As for the resin of the present invention, one kind may be used or a plurality of kinds may be used in combination.

[2] (B) Compound Capable of Generating an Acid Upon Irradiation with an Actinic Ray or Radiation The composition of the present invention contains a compound capable of generating an acid upon irradiation with an actinic ray or radiation (hereinafter sometimes referred to as an "acid generator"), in an amount of 10 to 30 mass % based on the entire solid content of the actinic ray-sensitive or radiation-sensitive resin composition.

The amount of the acid generator added is preferably from 18 to 30 mass %, more preferably from 20 to 30 mass %, still more preferably from 20 to 26 mass % based on the entire solid content of the actinic ray-sensitive or radiation-sensitive resin composition.

In the present invention, the acid generator is preferably a compound represented by the following formula (1-1) or (1-2).

These compounds can maintain high the transmittance of the film formed for ArF light at a wavelength of 193 nm, in the above-described range of amount added. For example, in the case of a film having a film thickness of 100 nm, the transmittance for light at a wavelength of 193 nm can be made as high as from 60 to 85%. High transmittance for ArF light ensures good performance in the patterning by ArF light.

The transmittance for light at a wavelength of 193 nm can be calculated, for example, by applying the actinic ray-sensitive or radiation-sensitive resin composition on a quartz glass substrate by spin coating, prebaking the coating at 100° C. to form a film having a film thickness of 100 nm, and determining the absorbance at a wavelength of 193 nm of the film by Ellipsometer EPM-222 (manufactured by J.A. Woollam Co., Inc.).

The ratio of the compound represented by formula (1-1) or (1-2) is preferably 50 mass % or more, more preferably 75 mass % or more, still more preferably 80 mass % or more, yet still more preferably 90 mass % or more, and most preferably 95 mass % or more, based on the total amount of acid generators.

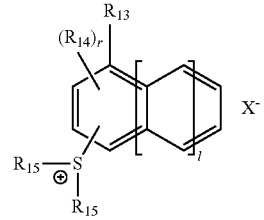

(1-1)

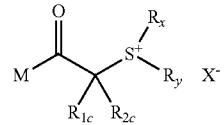

(1-2)

In formula (1-1), $R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton.

$R_{14}$ represents, when a plurality of $R_{14}$'s are present, each independently represents, an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton.

Each $R_{15}$ independently represents an alkyl group, a cycloalkyl group or a naphthyl group, and two $R_{15}$'s may combine with each other to form a ring.

l represents an integer of 0 to 2.

r represents an integer of 0 to 8.

$X^-$ represents a non-nucleophilic anion.

In formula (1-2), M represents an alkyl group, a cycloalkyl group, an aryl group or a benzyl group and in the case of having a ring structure, the ring structure may contain an oxygen atom, a sulfur atom, an ester bond, an amide bond or a carbon-carbon double bond.

Each of $R_{1c}$ and $R_{2c}$ independently represents a hydrogen atom, an alkyl group, a cycloalkyl group, a halogen atom, a cyano group or an aryl group, and $R_{1c}$ and $R_{2c}$ may combine with each other to form a ring.

Each of $R_x$ and $R_y$ independently represents an alkyl group, a cycloalkyl group, a 2-oxoalkyl group, an alkoxycarbonylalkyl group, an allyl group or a vinyl group.

$R_x$ and $R_y$ may combine with each other to form a ring, at least two members of M, $R_{1c}$ and $R_{2c}$ may combine with each other to form a ring, and the ring structure may contain a carbon-carbon double bond.

$X^-$ represents a non-nucleophilic anion.

In formula (1-1), the alkyl group of $R_{13}$, $R_{14}$ and $R_{15}$ is a linear or branched alkyl group preferably having a carbon number of 1 to 10, and examples thereof include a methyl group, an ethyl group, an n-propyl group, an i-propyl group, an n-butyl group, a 2-methylpropyl group, a 1-methylpropyl group, a tert-butyl group, an n-pentyl group, a neopentyl group, an n-hexyl group, an n-heptyl group, an n-octyl group, a 2-ethylhexyl group, an n-nonyl group and an n-decyl group. Among these alkyl groups, a methyl group, an ethyl group, an n-butyl group and a tert-butyl group are preferred.

The cycloalkyl group of $R_{13}$, $R_{14}$ and $R_{15}$ may be monocyclic or polycyclic, and examples thereof include cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl and adamantyl. Above all, cyclopropyl, cyclopentyl, cyclohexyl and cyclooctyl are preferred.

The alkoxy group of $R_{13}$ and $R_{14}$ is a linear, branched or cyclic alkoxy group preferably having a carbon number of 1 to 10, and examples thereof include a methoxy group, an ethoxy group, an n-propoxy group, an i-propoxy group, an n-butoxy group, a 2-methylpropoxy group, a 1-methylpropoxy group, a tert-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, a cycloheptyloxy group and a cyclooctyloxy group. Among these alkoxy groups, a methoxy group, an ethoxy group, an n-propoxy group and an n-butoxy group are preferred.

The cyclic alkoxy group may be monocyclic or polycyclic, and the total carbon number of the cyclic alkoxy group is preferably 7 or more, more preferably from 7 to 15.

Specific examples of the cyclic alkoxy group include groups formed by bonding an oxygen atom to the above-described specific examples of the cycloalkyl group.

The alkoxycarbonyl group of $R_{13}$ and $R_{14}$ is a linear, branched or cyclic alkoxycarbonyl group preferably having a carbon number of 2 to 11, and examples thereof include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a tert-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group, a norbornyloxycarbonyl group and an adamatyloxycarbonyl group. Among these alkoxycarbonyl groups, a methoxycarbonyl group, an ethoxycarbonyl group and an n-butoxycarbonyl group are preferred.

The group having a monocyclic or polycyclic cycloalkyl skeleton of $R_{13}$ is, for example, a linear or branched alkoxy group substituted by a monocyclic or polycyclic cycloalkyl group which may have a substituent, or an alkyl group substituted by a monocyclic or polycyclic cycloalkyl group, preferably a linear or branched alkoxy group substituted by a monocyclic or polycyclic cycloalkyl group. The total carbon number of $R_{13}$ is preferably 7 or more, more preferably from 7 to 15.

The alkoxy group having a monocyclic or polycyclic cycloalkyl skeleton of $R_{14}$ is a group formed by substituting the above-described monocyclic or polycyclic cycloalkyl group for the above-described linear or branched alkoxy group, preferably a group formed by substituting a monocyclic cycloalkyl group. The total carbon number thereof is preferably 7 or more, more preferably from 7 to 15.

The monocyclic alkoxy group as $R_{13}$ and $R_{14}$ indicates a monocyclic cycloalkoxy group where a cycloalkyloxy group (e.g., cyclopropyloxy, cyclobutyloxy, cyclopentyloxy, cyclohexyloxy, cycloheptyloxy, cyclooctyloxy, cyclododecanyloxy) arbitrarily has a substituent such as alkyl group (e.g., methyl, ethyl, propyl, butyl, pentyl, hexyl, heptyl, octyl, dodecyl, 2-ethylhexyl, isopropyl, sec-butyl, tert-butyl, isoamyl), hydroxyl group, halogen atom (e.g., fluorine, chlorine, bromine, iodine), nitro group, cyano group, amide group, sulfonamide group, alkoxy group (e.g., methoxy, ethoxy, hydroxyethoxy, propoxy, hydroxypropoxy, butoxy), alkoxycarbonyl group (e.g., methoxycarbonyl, ethoxycarbonyl), acyl group (e.g., formyl, acetyl, benzoyl), acyloxy group (e.g., acetoxy, butyryloxy) and carboxy group and where the total carbon number including the arbitrary substituent on the cycloalkyl group is 7 or more.

Examples of the polycyclic alkoxy group of $R_{13}$ and $R_{14}$ include a norbornyloxy group and an adamantyloxy group.

The alkoxy group having a total carbon number of 7 or more and containing a monocyclic or polycyclic cycloalkyl group which may have a substituent indicates a group where the above-described monocyclic or polycyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and iso-amyloxy, where the total carbon number including the substituent is 7 or more. Examples thereof include a cyclopropylethoxy group, a cyclohexylmethoxy group, a cyclopentylethoxy group and a cyclohexylethoxy group, with a cyclohexylmethoxy group being preferred.

Specific examples of the alkyl group in the alkylcarbonyl group of $R_{14}$ are the same as those of the alkyl group as $R_{13}$ to $R_{15}$ described above.

Specific examples of the alkoxy group in the alkoxycarbonyl group of $R_{14}$ are the same as those of the alkoxy group as $R_{13}$ to $R_{14}$ described above.

The alkylsulfonyl group and cycloalkylsulfonyl group of $R_{14}$ are a linear, branched or cyclic alkylsulfonyl group preferably having a carbon number of 1 to 10, and examples thereof include a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group and a cyclohexanesulfonyl group. Among these alkylsulfonyl groups and cycloalkylsulfonyl groups, a methanesulfonyl group, an ethanesulfonyl group, an n-propanesulfonyl group, an n-butanesulfonyl group, a cyclopentanesulfonyl group and a cyclohexanesulfonyl group are preferred.

l is preferably 0 or 1, more preferably 1, and r is preferably an integer of 0 to 2.

Each of the groups above may have a substituent, and examples of the substituent include a halogen atom (e.g., fluorine), a hydroxyl group, a carboxyl group, a cyano group, a nitro group, an alkoxy group, an alkoxyalkyl group, an alkoxycarbonyl group and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyl group and cyclohexyloxycarbonyl group.

The ring structure which may be formed by combining two $R_{15}$'s with each other is a 5- or 6-membered ring formed by two divalent $R_{15}$'s together with the sulfur atom in formula (1-1), preferably a 5-membered ring (that is, a tetrahydrothiophene ring), and may be condensed with an aryl group or a cycloalkyl group. The divalent $R_{15}$ may have a substituent, and examples of the substituent include a hydroxyl group, a carboxyl group, a cyano group, a nitro group, an alkoxy group, an alkoxyalkyl group, an alkoxycarbonyl group and an alkoxycarbonyloxy group. $R_{15}$ in formula (1-1) is preferably, for example, a methyl group, an ethyl group, a naphthyl group, or a divalent group of forming a tetrahydrothiophene ring structure together with the sulfur atom when two $R_{15}$'s are combined.

The substituent which $R_{13}$ and $R_{14}$ may have is preferably a hydroxyl group, an alkoxy group, an alkoxycarbonyl group or a halogen atom (particularly a fluorine atom).

Specific examples of the cation in a compound represented by formula (1-1) of the present invention are set forth below.

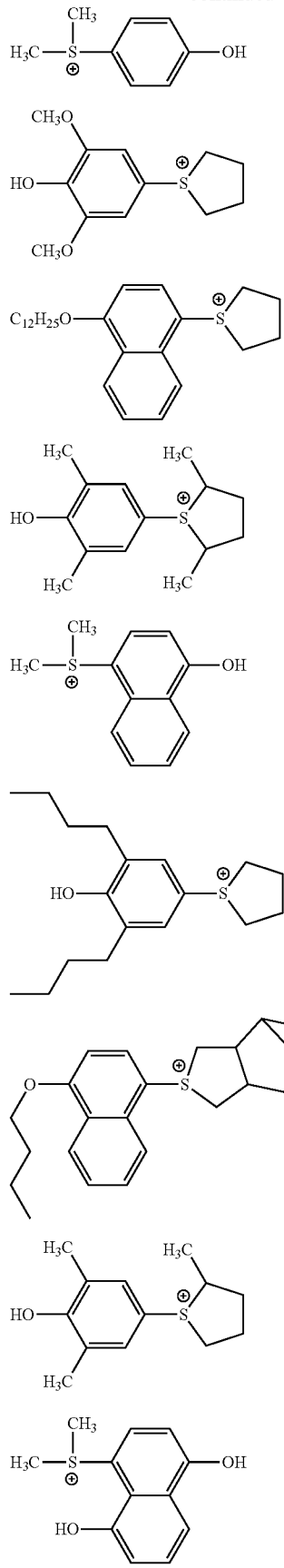

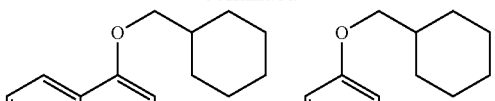
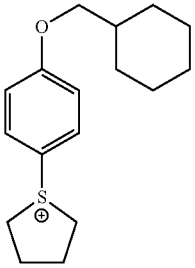
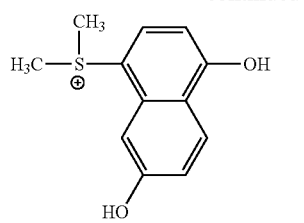
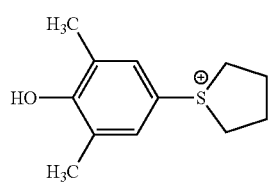
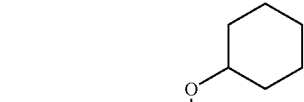
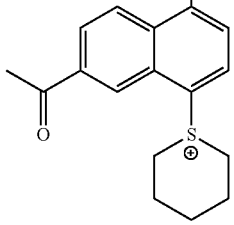
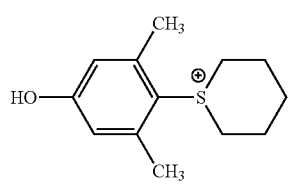
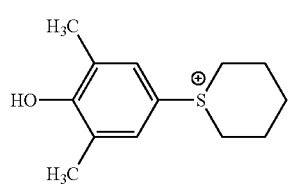
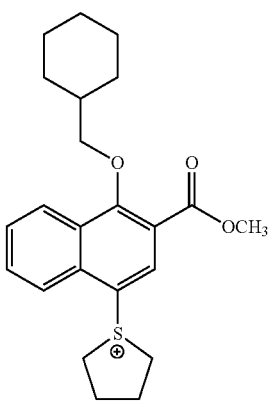
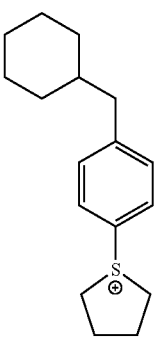
From the standpoint of suppressing the development defect, an acid generator represented by formula (1-1) where $R_{13}$ is a group having a monocyclic cycloalkyl skeleton is particularly preferred. Specific preferred examples of the cation in such a compound represented by formula (1-1) are set forth below, but the present invention is not limited thereto.
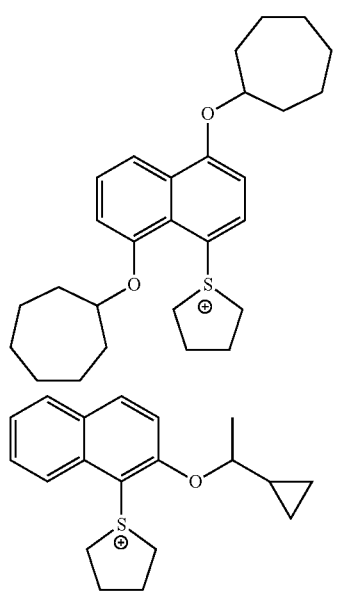

55
-continued
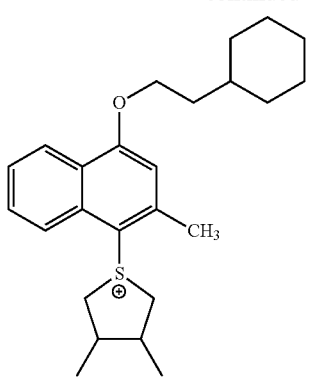
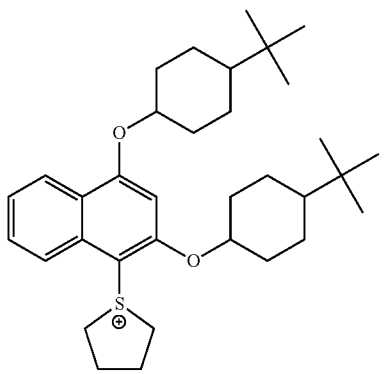
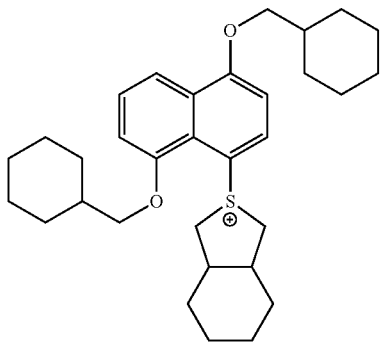
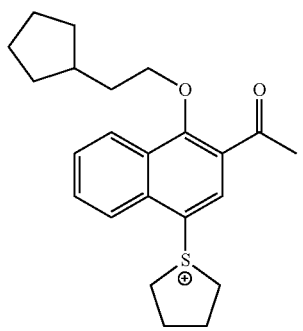
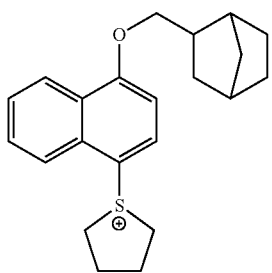
56
-continued
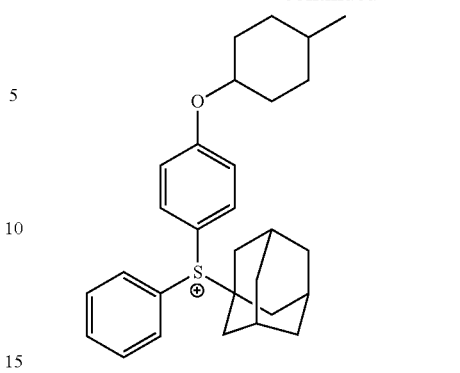
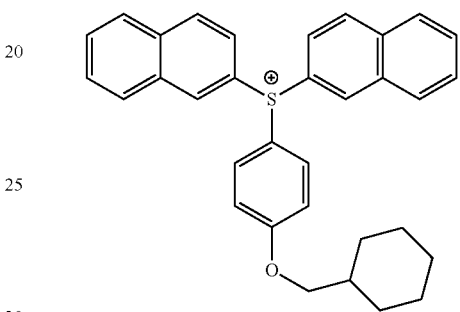
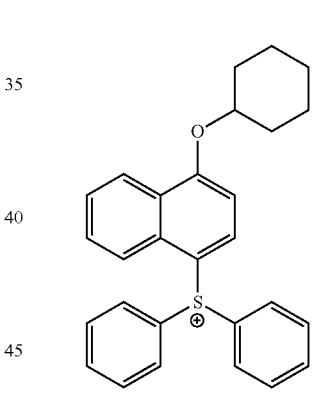
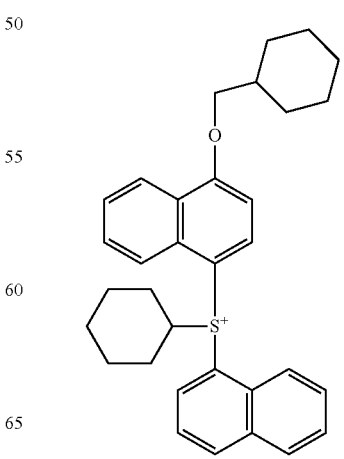

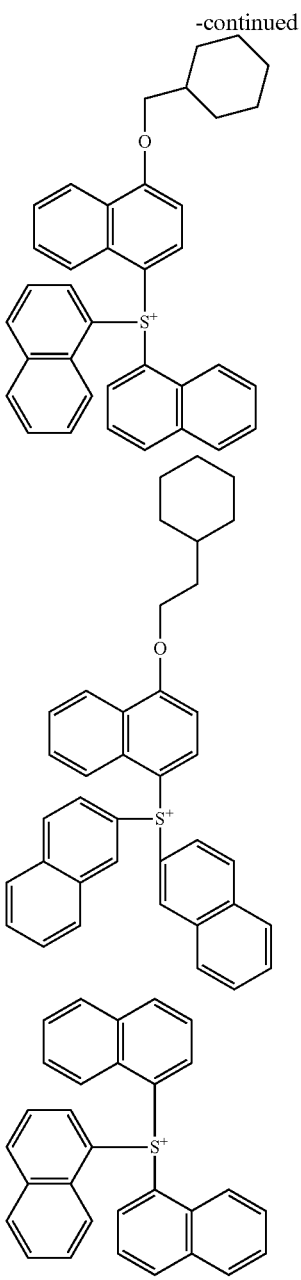

In formula (1-2), M represents an alkyl group, a cycloalkyl group, an aryl group or a benzyl group and in the case of having a ring structure, the ring structure may contain an oxygen atom, a sulfur atom, an ester bond, an amide bond or a carbon-carbon double bond.

Each of $R_{1c}$ and $R_{2c}$ independently represents a hydrogen atom, an alkyl group, a cycloalkyl group, a halogen atom, a cyano group or an aryl group, and $R_{1c}$ and $R_{2c}$ may combine with each other to form a ring.

Each of $R_x$ and $R_y$ independently represents an alkyl group, a cycloalkyl group, a 2-oxoalkyl group, an alkoxycarbonylalkyl group, an allyl group or a vinyl group.

$R_x$ and $R_y$ may combine with each other to form a ring, at least two members of M, $R_1$, and $R_2$, may combine with each other to form a ring, and the ring structure may contain a carbon-carbon double bond.

$X^-$ represents a non-nucleophilic anion.

The alkyl group as M may be either linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl).

The cycloalkyl group as M, $R_{1c}$, $R_{2c}$, $R_x$ and $R_y$ includes a cyclic alkyl group having a carbon number of 3 to 8 (e.g., cyclopentyl, cyclohexyl).

The aryl group as M, $R_{1c}$ and $R_{2c}$ is an aryl group preferably having a carbon number of 5 to 15, and examples thereof include a phenyl group and a naphthyl group.

Each of the groups as M may have, as the substituent, an alkyl group, a cycloalkyl group, an alkoxy group, a halogen atom, a phenylthio group or the like. The cycloalkyl group and aryl group as M may have, further as the substituent, an alkyl group. The carbon number of the substituent is preferably 15 or less.

The alkyl group as $R_{1c}$ and $R_{2c}$ is, for example, an alkyl group having a carbon number of 1 to 10, preferably a linear or branched alkyl group having a carbon number of 1 to 5 (e.g., methyl, ethyl, linear or branched propyl).

When M is a phenyl group, it is preferred to have, as the substituent, at least one linear, branched or cyclic alkyl group or at least one linear, branched or cyclic alkoxy group, and more preferably, the total of carbon numbers of substituents is from 2 to 15. By satisfying these conditions, the solvent solubility is more enhanced and generation of particles during storage is suppressed.

The ring structure formed by combining at least two members of M, $R_{1c}$ and $R_{2c}$ is preferably a 3- to 10-membered ring, more preferably a 3- to 6-membered ring. The ring skeleton may have a carbon-carbon double bond.

The alkyl group as $R_x$ and $R_y$ is the same as the alkyl group of $R_{1c}$ and $R_{2c}$.

The 2-oxoalkyl group includes a group having $>C=O$ at the 2-position of the alkyl group as $R_{1c}$ and $R_{2c}$.

The alkoxy group in the alkoxycarbonylmethyl group may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy) or a cyclic alkoxy group having a carbon number of 3 to 8 (e.g., cyclopentyloxy, cyclohexyloxy).

Examples of the group formed by combining $R_x$ and $R_y$ include a butylene group and a pentylene group. That is, the ring structure which may be formed by combining $R_x$ and $R_y$ with each other includes a 5- or 6-membered ring, preferably a 5-membered ring (that is, a tetrahydrothiophene ring), formed by divalent $R_x$, and $R_y$ (for example, a methylene group, an ethylene group or a propylene group) together with the sulfur atom in formula (1-2).

Each of $R_x$ and $R_y$ is preferably an alkyl group having a carbon number of 4 or more, more preferably 6 or more, still more preferably 8 or more.

Each of the groups as $R_x$ and $R_y$ and the ring structure which may be formed by combining $R_x$ and $R_y$ with each other may have a substituent, and examples of the substituent include substituents which each of the groups as M above may have.

Specific preferred examples of the cation in the compound represented by formula (1-2) are set forth below, but the present invention is not limited thereto.

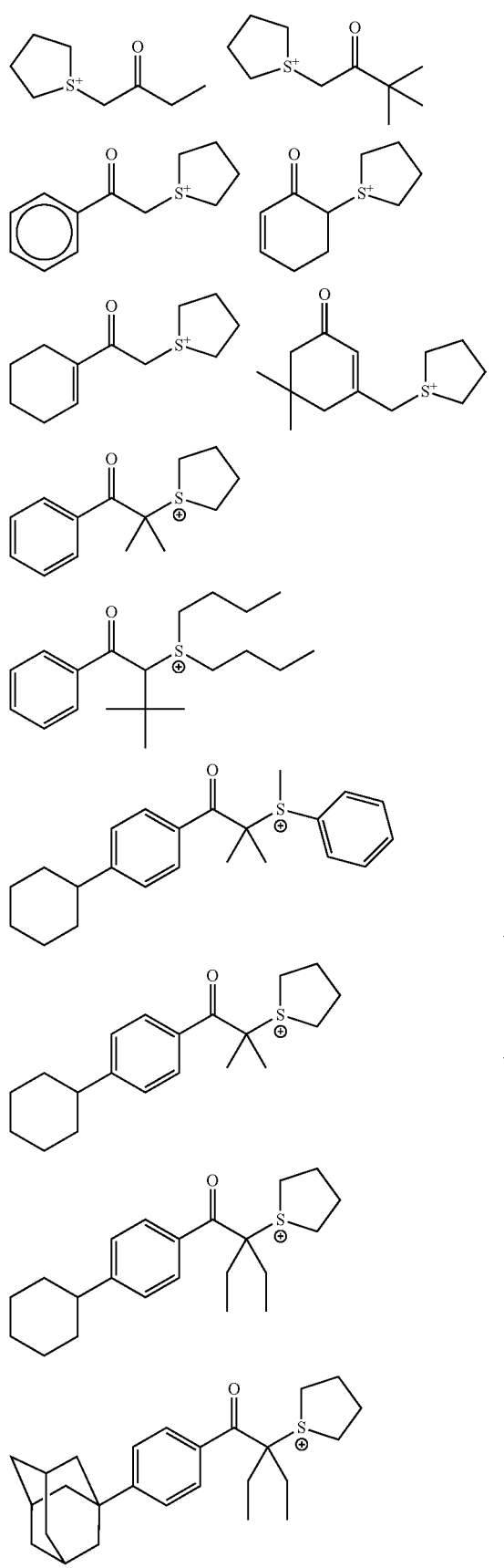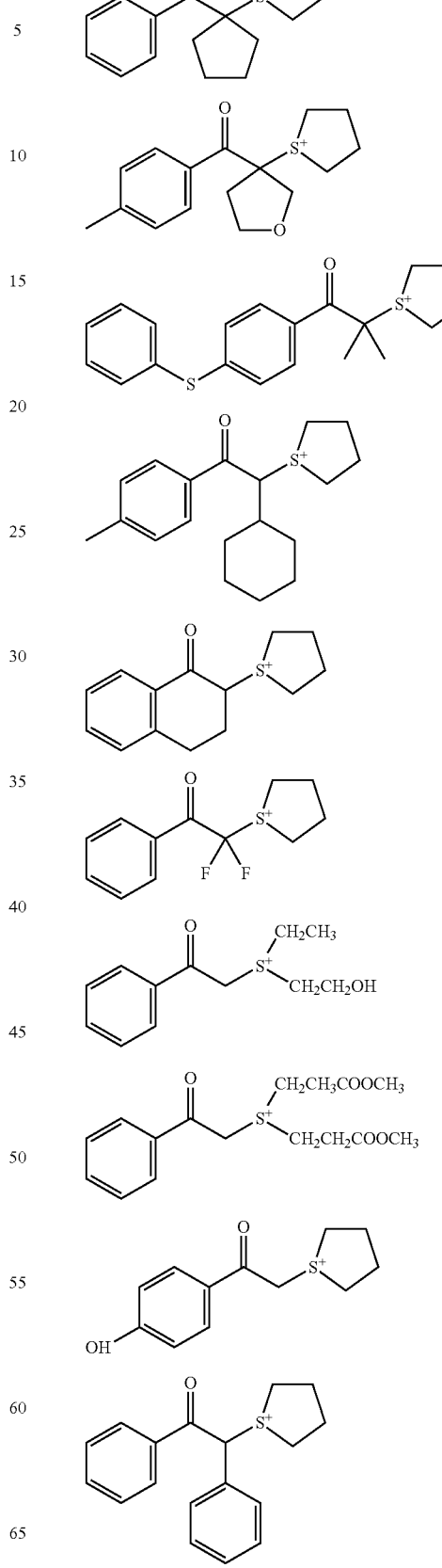

-continued

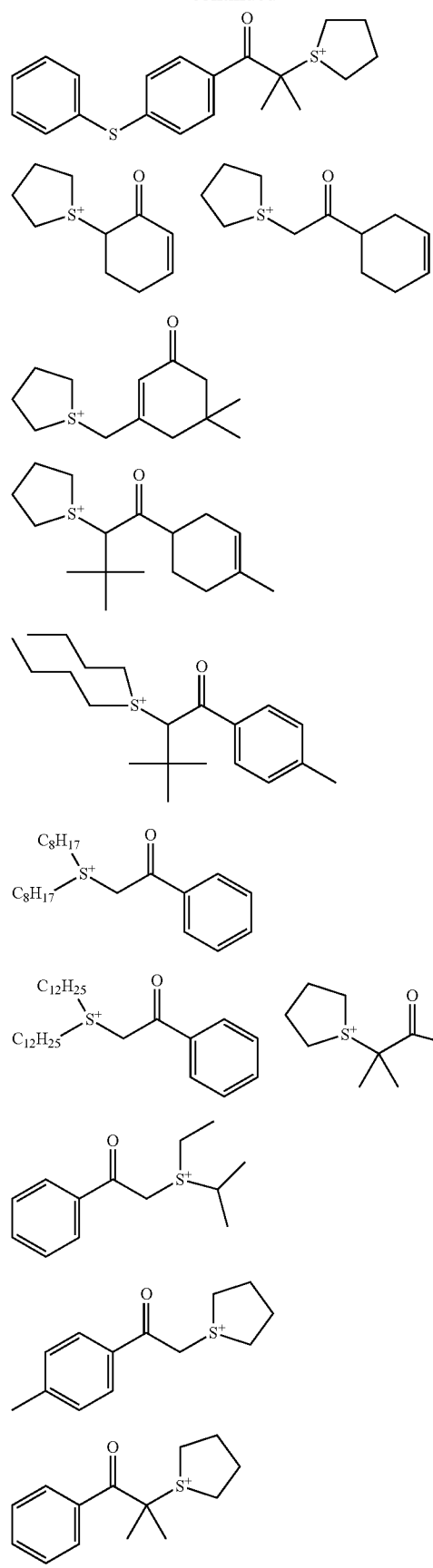

-continued

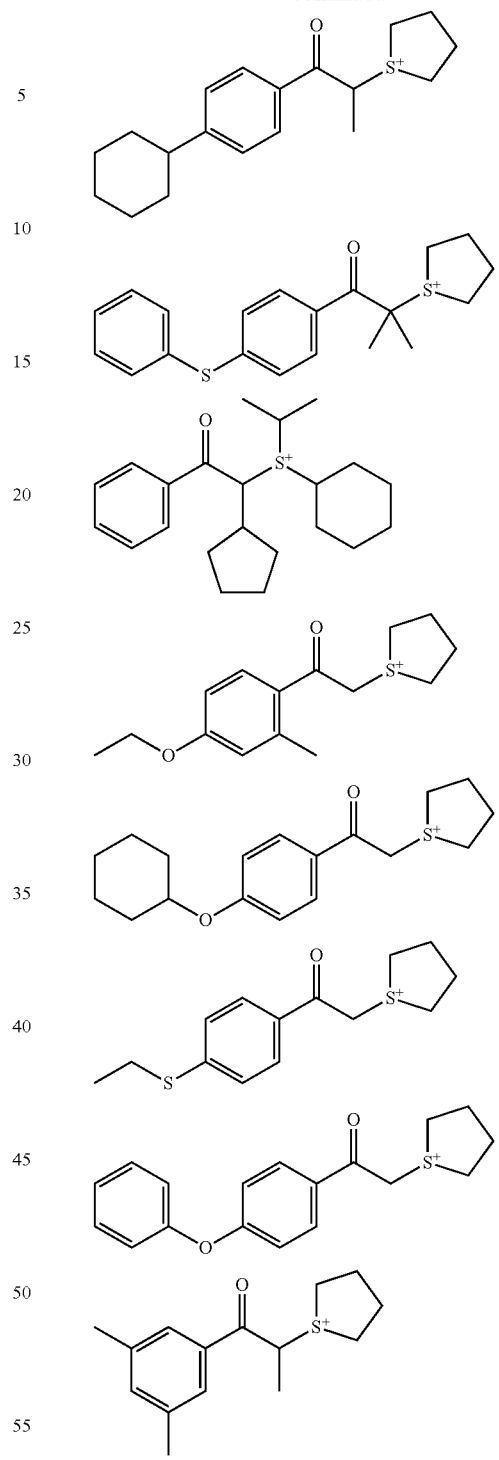

In formulae (1-1) and (1-2), $X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae:

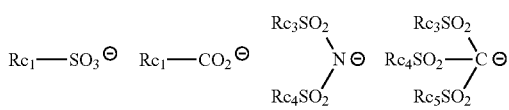

In the formulae, $Rc_1$ represents an organic group.

The organic group of $Rc_1$ includes an organic group having a carbon number of 1 to 30, and preferred examples thereof include an alkyl group which may have a substituent, an aryl group, and a group where a plurality of these groups are connected through a single bond or a linking group such as —O—, —CO$_2$—, —S—, —SO$_3$— and —SO$_2$N(Rd$_1$)—.

$Rd_1$ represents a hydrogen atom or an alkyl group.

Each of $Rc_3$, $Rc_4$ and $Rc_5$ independently represents an organic group.

Preferred organic groups of $Rc_3$, $Rc_4$ and $Rc_5$ are the same as preferred organic groups in $Rc_1$. The organic group is most preferably a perfluoroalkyl group having a carbon number of 1 to 4.

$Rc_3$ and $Rc_4$ may combine with each other to form a ring.

The group formed by combining $Rc_3$ and $Rc_4$ includes an alkylene group and an arylene group and is preferably a perfluoroalkylene group having a carbon number of 2 to 4.

The organic group of $Rc_1$ and $Rc_3$ to $Rc_5$ is most preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light rises and the sensitivity is enhanced.

Also, $X^-$ may be an anion represented by the following formula (A1):

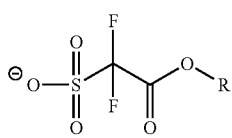

(A1)

In formula (A1), R represents a hydrogen atom or an organic group and is preferably an organic group having a carbon number of 1 to 40, more preferably an organic group having a carbon number of 3 to 20, and most preferably an organic group represented by the following formula (A1a).

The organic group of R is sufficient if it has one or more carbon atoms. The organic group is preferably an organic group where the atom bonded to the oxygen atom in the ester bond shown in formula (A1) is a carbon atom, and examples thereof include an alkyl group, a cycloalkyl group, an aryl group, an aralkyl group and a group having a lactone structure. The organic group may contain a heteroatom such as oxygen atom and sulfur atom in the chain. Also, one of these groups may have another as the substituent, or the organic group may have a substituent such as hydroxyl group, acyl group, acyloxy group, oxy group (=O) or halogen atom.

—(CH$_2$)$_n$—Rc—(Y)$_m$  (A1a)

In formula (A1a), Rc represents a monocyclic or polycyclic organic group having a carbon number of 3 to 30, which may contain a cyclic ether, cyclic thioether, cyclic ketone, cyclic carbonic acid ester, lactone or lactam structure. Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8. m is from 0 to 6, and when a plurality of Y's are present, each Y may be the same as or different from every other Y. n is from 0 to 10.

The total number of carbon atoms constituting the R group represented by formula (A1a) is preferably 40 or less.

It is preferred that n is from 0 to 3 and Rc is a monocyclic or polycyclic organic group having a carbon number of 7 to 16.

Also, $X^-$ may be an anion corresponding to an acid represented by the following formula (A2):

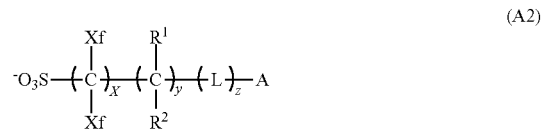

(A2)

In the formula, each Xf independently represents a fluorine atom or an alkyl group substituted by at least one fluorine atom.

Each of $R^1$ and $R^2$ independently represents a group selected from a hydrogen atom, a fluorine atom, an alkyl group and an alkyl group substituted by at least one fluorine atom, and when a plurality of $R^1$'s or $R^2$'s are present, these may be the same or different.

L represents a single bond or a divalent linking group, and when a plurality of L's are present, these may be the same or different.

A represents a group having a cyclic structure.

x represents an integer of 1 to 20, y represents an integer of 0 to 10, and z represents an integer of 0 to 10.

Formula (A2) is described in detail below.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples thereof include a fluorine atom, CF$_3$, C$_2$F$_5$, C$_3$F$_7$, C$_4$F$_9$, C$_5$F$_{11}$, C$_6$F$_{13}$, C$_7$F$_{15}$, C$_8$F$_{17}$, CH$_2$CF$_3$, CH$_2$CH$_2$CF$_3$, CH$_2$C$_2$F$_5$, CH$_2$CH$_2$C$_2$F$_5$, CH$_2$C$_3$F$_7$, CH$_2$CH$_2$C$_3$F$_7$, CH$_2$C$_4$F$_9$ and CH$_2$CH$_2$C$_4$F$_9$, with a fluorine atom and CF$_3$ being preferred.

The alkyl group of $R^1$ and $R^2$ and the alkyl group in the alkyl group substituted by at least one fluorine atom are preferably an alkyl group having a carbon number of 1 to 4, more preferably a perfluoroalkyl group having a carbon number of 1 to 4. Specific examples thereof include CF$_3$, C$_2$F$_5$, C$_3$F$_7$, C$_4$F$_9$, C$_5$F$_{11}$, C$_6$F$_{13}$, C$_7$F$_{15}$, C$_8$F$_{17}$, CH$_2$CF$_3$, CH$_2$CH$_2$CF$_3$, CH$_2$C$_2$F$_5$, CH$_2$CH$_2$C$_2$F$_5$, CH$_2$C$_3$F$_7$, CH$_2$CH$_2$C$_3$F$_7$, CH$_2$C$_4$F$_9$ and CH$_2$CH$_2$C$_4$F$_9$, with CF$_3$ being preferred.

y is preferably an integer of 0 to 4, more preferably 0, x is preferably an integer of 1 to 8, more preferably from 1 to 4, and z is preferably an integer of 0 to 8, more preferably from 0 to 4.

The divalent linking group of L is not particularly limited, and examples thereof include —COO—, —COO—, —CO—, —O—, —S—, —SO—, —SO$_2$—, an alkylene group, a cycloalkylene group and an alkenylene group.

Among these, —COO—, —CO— and —O— are preferred, and —COO— and —OCO— are more preferred.

The group having a cyclic structure of A is not particularly limited as long as it has a cyclic structure, and examples thereof include an alicyclic group, an aryl group and a group having a heterocyclic structure (including not only a structure having aromaticity but also a structure having no aromaticity, for example, tetrahydropyrane ring and lactone ring structures).

The alicyclic group may be monocyclic or polycyclic and is preferably a monocyclic cycloalkyl group such as cyclopentyl group, cylohexyl group and cyclooctyl group, or a polycyclic cycloalkyl group such as norbornyl group, tricyclodecanyl group, tetracyclodecanyl group, tetracyclododecanyl group and adamantyl group. Above all, a norbornyl group, a tricyclodecanyl group, a tetracyclodecanyl group, a tetracyclododecanyl group and an adamantyl group, which are an alicyclic group having a bulky structure with a carbon number of 7 or more, are preferred from the standpoint that diffusion in the film during the PEB (post-exposure baking) step can be suppressed and MEEF can be improved.

Examples of the aryl group include a benzene ring, a naphthalene ring, a phenanthrene ring and an anthracene ring. Among these, naphthalene having low absorbance is preferred in view of absorbance for light at 193 nm.

Examples of the group having a heterocyclic structure include a furan ring, a thiophene ring, a benzofuran ring, a benzothiophene ring, a dibenzofuran ring, a dibenzothiophene ring and a pyridine ring. Among these, a furan ring, a thiophene ring and a pyridine ring are preferred.

The group having a cyclic structure may have a substituent, and examples of the substituent include an alkyl group (linear, branched or cyclic, preferably having a carbon number of 1 to 12), an aryl group (preferably having a carbon number of 6 to 14), a hydroxy group, an alkoxy group, an ester group, an amido group, a urethane group, a ureido group, a thioether group, a sulfonamido group and a sulfonic acid ester group.

Furthermore, $X^-$ may be an anion represented by the following formula (A3) or (A4) described in JP-A-2005-221721.

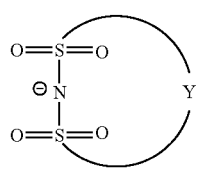
(A3)

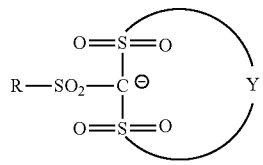
(A4)

In formulae (A3) and (A4), Y is an alkylene group substituted by at least one fluorine atom, preferably an alkylene group having a carbon number of 2 to 4. The alkylene chain may contain an oxygen atom. Y is more preferably a perfluoroalkylene group having a carbon number of 2 to 4, and most preferably a tetrafluoroethylene group, a hexafluoropropylene group or an octafluorobutylene group.

In formula (A4), R represents an alkyl group or a cycloalkyl group. The alkylene chain in the alkyl or cycloalkyl group may contain an oxygen atom.

Examples of the compound having an anion represented by formula (A3) or (A4) include those described as specific examples in JP-A-2005-221721.

Specific preferred examples of the compound represented by formula (1-1) are set forth below, but the present invention is not limited thereto.

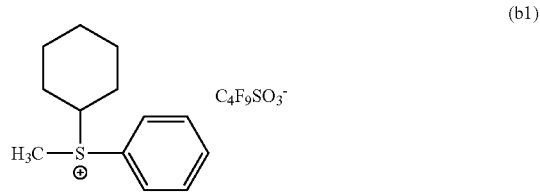
(b1)

(b2)

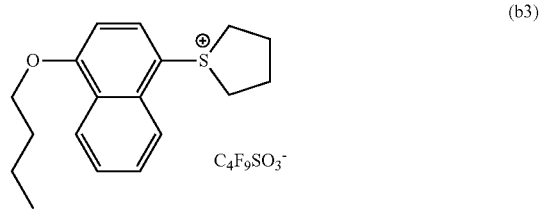
(b3)

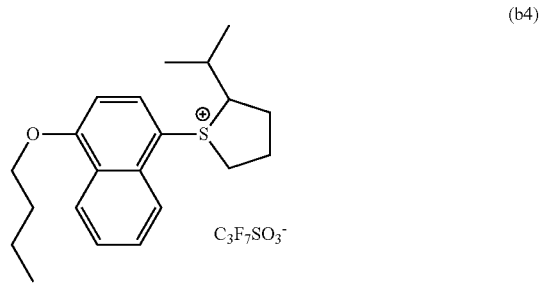
(b4)

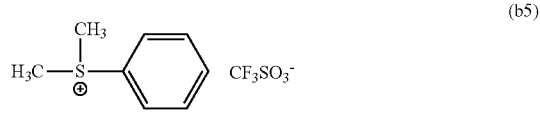
(b5)

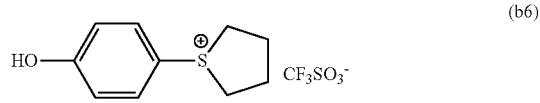
(b6)

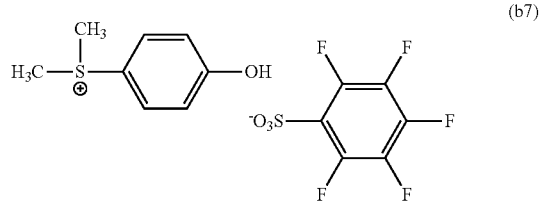
(b7)

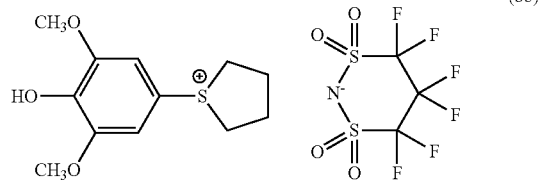
(b8)

(b9) 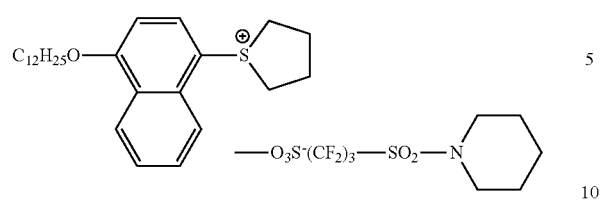
(b10) 
(b11) 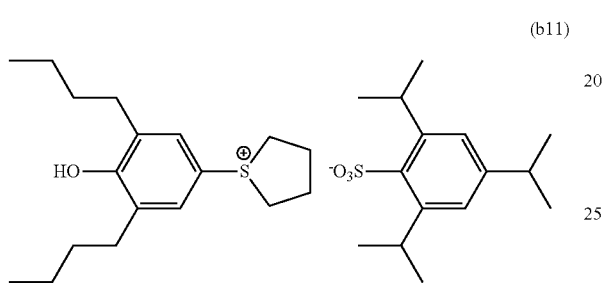
(b12) 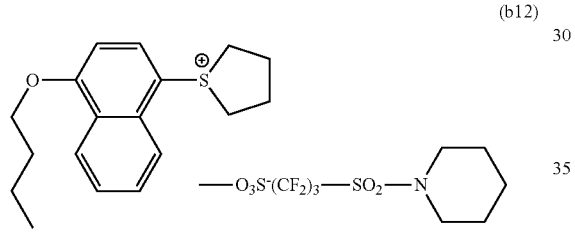
(b13) 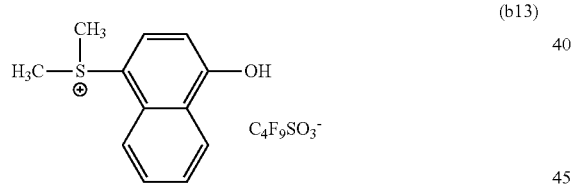
(b15) 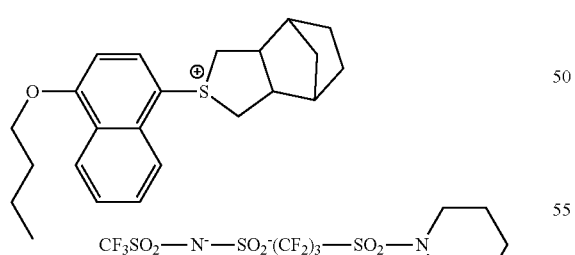
(b16) 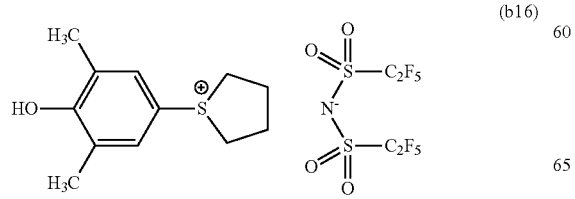
(b17) 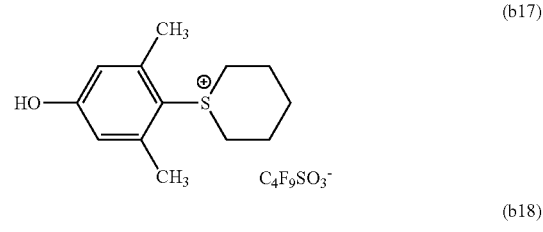
(b18) 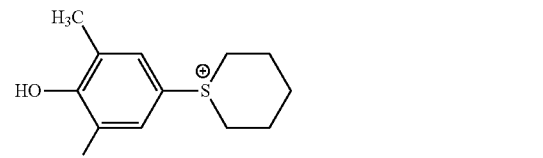
(b19) 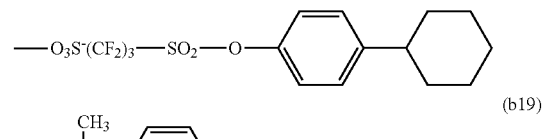
(b20) 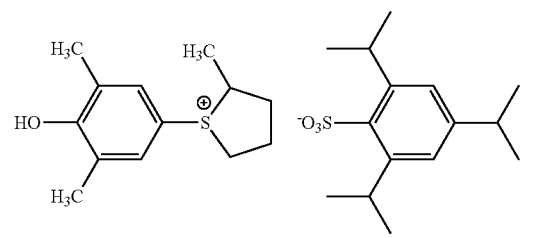
(b21) 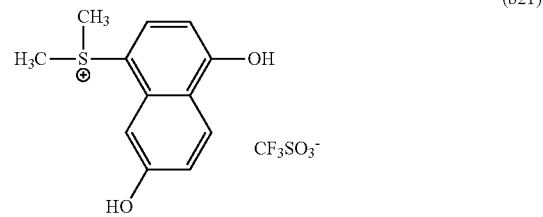
(b22) 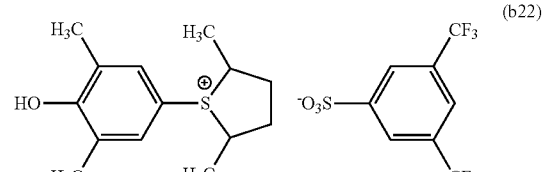
Specific preferred examples of the compound represented by formula (1-2) are set forth below, but the present invention is not limited thereto.
(b24) 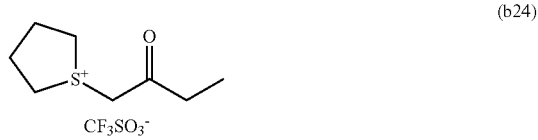

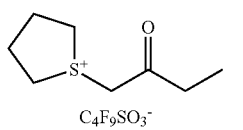
(b25)

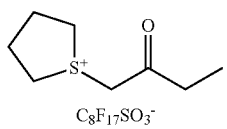
(b26)

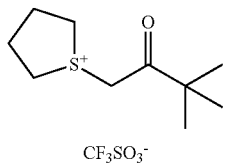
(b27)

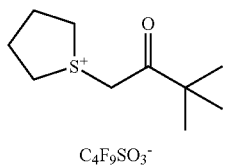
(b28)

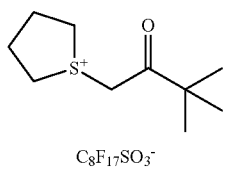
(b29)

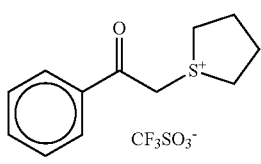
(b30)

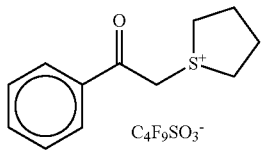
(b31)

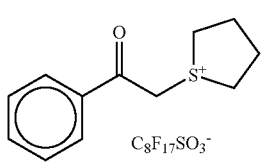
(b32)

(b33)

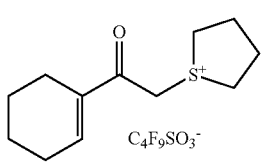
(b34)

(b35)

(b36)

(b37)

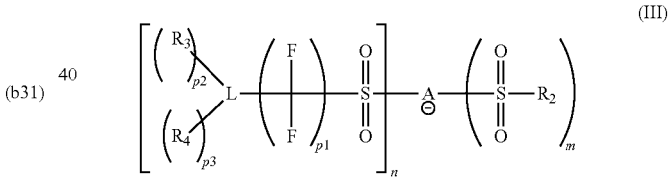

As for the acid generator represented by formula (1-1) or (1-2), one kind may be used alone, or two or more kinds may be used in combination. Also, the acid generator represented by formula (1-1) or (1-2) may be used in combination with other acid generators.

As the counter ion represented by X⁻, a structure represented by the following formula (III) is particularly preferred.

$$\left[ \left( \begin{matrix} (R_3)_{p2} \\ (R_4)_{p3} \end{matrix} \right) L - \left( \begin{matrix} F \\ F \end{matrix} \right)_{p1} - \overset{O}{\underset{O}{S}} - \right]_n \overset{\ominus}{A} \left( \overset{O}{\underset{O}{S}} - R_2 \right)_m \quad (III)$$

In formula (III), A represents an oxygen atom, a nitrogen atom or a carbon atom.

$R_2$ represents a fluorine atom, an alkyl group which may have a substituent, a cycloalkyl group which may have a substituent, or an aryl group which may have a substituent.

When A is an oxygen atom, n is 1 and m is 0; when A is a nitrogen atom, n+m is 2, n is 1 or 2, and m is 0 or 1; and when A is a carbon atom, n+m is 3, n is an integer of 1 to 3, and m is an integer of 0 to 2. When n is an integer of 2 or more, each $R_1$ may be the same as or different from every other $R_1$, and $R_1$'s may combine with each other to form a ring.

The alkyl group, cycloalkyl group or aryl group represented by $R_2$ is a chain alkyl group, a monocyclic alkyl group, a polycyclic hydrocarbon group or a monocyclic aryl group, and the chain alkyl group, monocyclic alkyl group, polycyclic hydrocarbon group and monocyclic aryl group may have a substituent. The substituent is preferably a fluorine atom.

The chain alkyl group may be linear or branched, and examples thereof include methyl, ethyl, propyl, butyl, pentyl, hexyl, heptyl, octyl, dodecyl, 2-ethylhexyl, isopropyl, sec-butyl, tert-butyl and iso-amyl.

The alkyl group above may have a substituent, and examples of the substituent include a hydroxyl group, a halogen atom (e.g., fluorine, chlorine, bromine, iodine), a nitro group, a cyano group, an amido group, a sulfonamido group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

Examples of the monocyclic alkyl group include cyclopropyl, cyclobutyl, cyclopentyl, cyclohexyl, cycloheptyl, cyclooctyl, cyclododecanyl, cyclopentenyl, cyclohexenyl and cyclooctadienyl. Above all, cyclopropyl, cyclopentyl, cyclohexyl and cyclooctyl are preferred.

The monocyclic alkyl group may have a substituent, and examples of the substituent include a halogen atom (e.g., fluorine, chlorine, bromine, iodine), a nitro group, a cyano group, an amido group, a sulfonamido group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

Examples of the polycyclic hydrocarbon group include bicyclo[4.3.0]nonanyl, decahydronaphtalenyl, tricycle [5.2.1.0(2,6)]decanyl, bornyl, isobornyl, norbormyl, adamantyl, noradamantyl, 1,7,7-trimethyltricyclo[2.2.1.0$^{2,6}$] heptanyl and 3,7,7-trimethylbicyclo[4.1.0]heptanyl. Among these, norbornyl, adamantyl and noradamantyl are preferred.

The monocyclic aryl group means a substituted or unsubstituted phenyl group, and examples of the substituent include a hydroxyl group, a halogen atom (e.g., fluorine, chlorine, bromine, iodine), a nitro group, a cyano group, an amido group, a sulfonamido group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

In view of acid strength, $R_2$ preferably has an electron-withdrawing group. The electron-withdrawing group is not particularly limited, but examples thereof include a cyano group, a trifluoromethyl group, a nitro group, a carboxyl group, a ketone group, an acyloxy group, a hydroxy group, a perfluoroalkyl group, an alkoxy group such as methoxy group, ethoxy group, isopropoxy group, tert-butoxy group and benzyloxy group, and a halogen atom such as fluorine atom and chlorine atom. In particular, it is preferred to have a fluorine atom. $R_2$ is more preferably a fluorine atom-containing group having a molecular weight of 220 or less, and $R_2$ is still more preferably a trifluoromethyl group.

$R_3$ represents, when a plurality of $R_3$'s are present, each independently represents, an alkyl group which may have a substituent, a cycloalkyl group which may have a substituent, or an aryl group which may have a substituent. $R_4$ represents a hydrogen atom.

L represents a single bond or a linking group.

p1 represents an integer of 1 to 8, p2 represents 1 or 2, and p3 represents 0 or 1.

When p2 is 2, two $R_3$'s may combine with each other to form a ring structure, and when n is an integer of 2 or more, the plurality of $R_3$'s may combine with each other to form a ring structure.

Specific examples of the alkyl group, cycloalkyl group and aryl group represented by $R_3$ are the same as those of respective groups of $R_2$.

In view of a low fluorine content, $R_3$ preferably has no fluorine atom.

L is preferably a single bond, an oxygen atom (—O—), a sulfur atom (—S—), a nitrogen atom (>N—), a carboxyl group (—OC=O—, —CO=O—), an amido group (>NC=O—) or a sulfonamido group (>NSO$_2$—). In particular, when p2 is 2 and two $R_3$' combine with each other to form a ring, L is preferably a nitrogen atom-containing linking group such as amido group and sulfonamido group and at this time, two $R_3$' combine with each other to formula cyclic amine residue having in the ring the nitrogen atom on L.

Examples of the cyclic amine residue structure include azilidine, azetidine, pyrrolidine, piperidine, hexamethyleneimine, heptamethyleneimine, piperazine, decahydroquinoline, 8-azabicyclo[3.2.1]octane, indole, oxazolidone, thiazolidine, 2-azanorbornane, 7-azanorbornane, morpholine and thiamopholine, and these may have a substituent. Examples of the substituent include a hydroxyl group, a halogen atom (e.g., fluorine, chlorine, bromine, iodine), a nitro group, a cyano group, an amido group, a sulfonamido group, an alkyl group such as methyl group, ethyl group, propyl group, n-butyl group, sec-butyl group, hexyl group, 2-ethylhexyl group and octyl group, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group, benzoyl group and carbonyl group on the carbon forming the ring, an acyloxy group such as acetoxy group and butyryloxy group, and a carboxy group.

Specific examples of the counter anion structure represented by formula (III) of the present invention are set forth below.

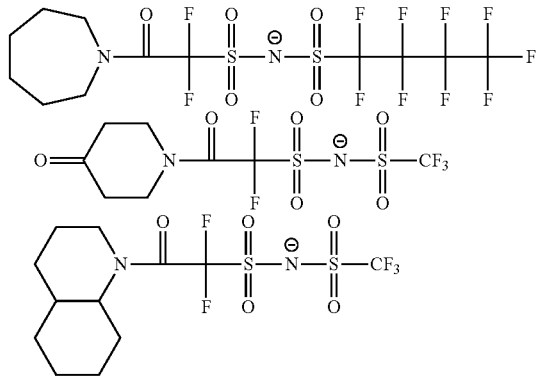

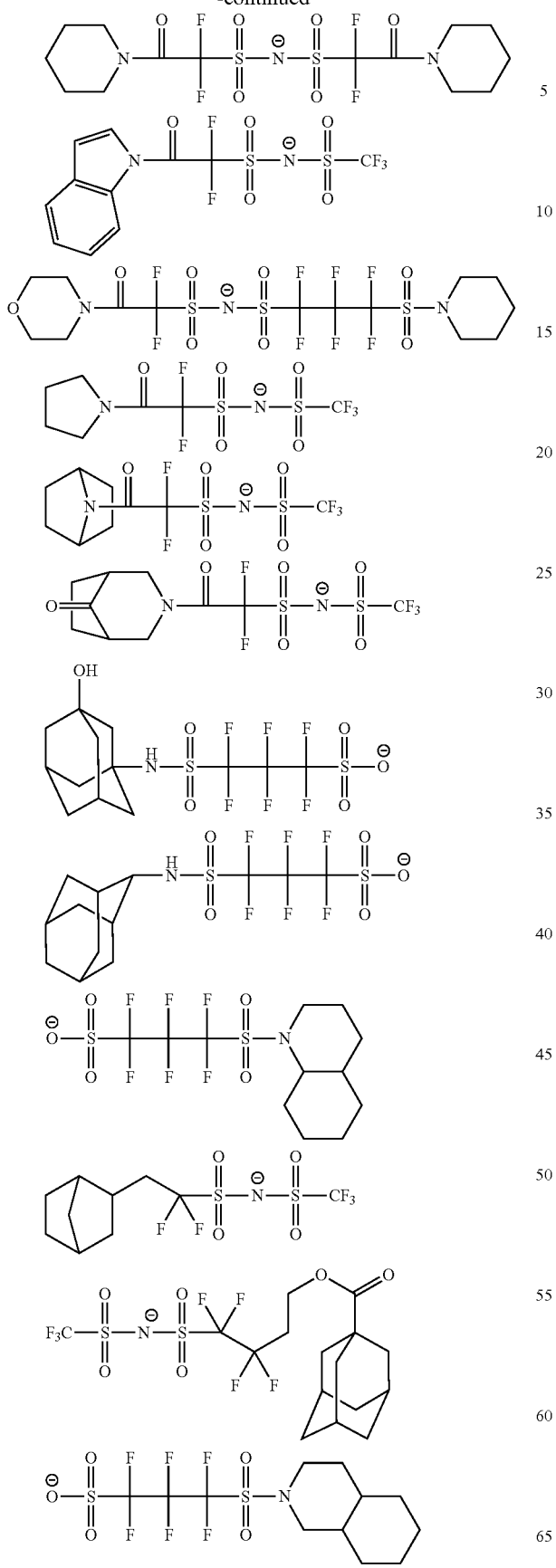
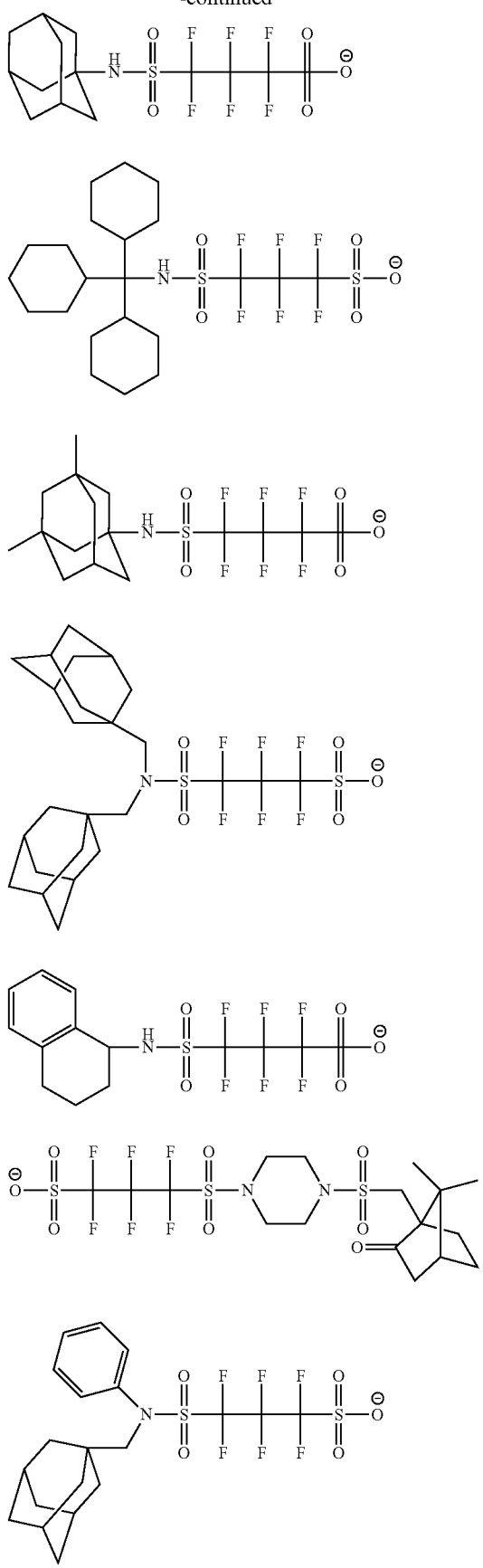

-continued

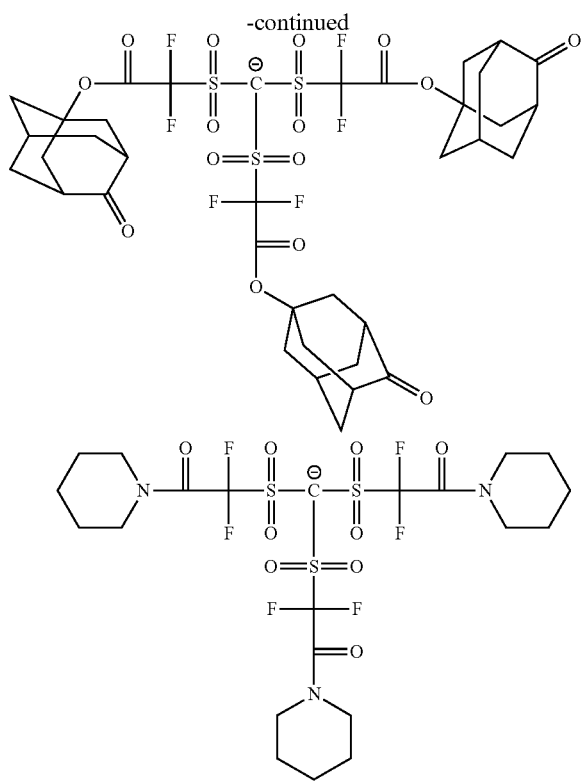

The acid generator also includes compounds represented by the following formulae (ZI), (ZII) and (ZIII), and the content thereof is, based on the total amount of acid generators represented by formula (1-1) or (1-2), 50 mass % or less, preferably 25 mass % or less, more preferably 20 mass % or less, and as a range capable of keeping good transmittance, still more preferably 10 mass % or less, yet still more preferably 5 mass % or less.

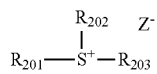           (ZI)

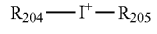           (ZII)

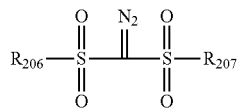           (ZIII)

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine with each other to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion (an anion having an extremely low ability of causing a nucleophilic reaction).

Examples of $Z^-$ include a sulfonate anion (e.g., aliphatic sulfonate anion, aromatic sulfonate anion, camphorsulfonate anion), a carboxylate anion (e.g., aliphatic carboxylate anion, aromatic carboxylate anion, aralkylcarboxylate anion), a sulfonylimide anion, a bis(alkylsulfonyl)imide anion and a tris(alkylsulfonyl)methide anion. Also, the anion may be an anion as $X^-$ which the acid generator represented by formula (1-1) or (1-2) may have.

The aliphatic moiety in the aliphatic sulfonate anion and aliphatic carboxylate may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

The alkyl group, cycloalkyl group and aryl group above may have a substituent. Specific examples thereof include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group and ring structure in each group, examples of the substituent further include an alkyl group (preferably having a carbon number of 1 to 15).

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5. Examples of the substituent of such an alkyl group include a halogen atom, a halogen atom-substituted alkyl group, an alkoxy group, an alkylthio group, an alkyloxysulfonyl group, an aryloxysulfonyl group and a cycloalkylaryloxysulfonyl group, with a fluorine atom and a fluorine atom-substituted alkyl group being preferred.

Other examples of $Z^-$ include fluorinated phosphorus, fluorinated boron and fluorinated antimony.

$Z^-$ is preferably an aliphatic sulfonate anion with at least the α-position of the sulfonic acid being substituted by a fluorine atom, an aromatic sulfonate anion substituted by a fluorine atom or a fluorine atom-containing group, a bis(alkylsulfonyl)imide anion with the alkyl group being substituted by a fluorine atom, or a tris(alkylsulfonyl)methide anion with the alkyl group being substituted by a fluorine atom. The non-nucleophilic anion is more preferably a perfluoroaliphatic sulfonate anion (more preferably having a carbon number of 4 to 8) or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl)benzenesulfonate anion.

In view of acid strength, the pKa of the acid generated is preferably −1 or less so as to enhance the sensitivity.

Examples of the organic group of $R_{201}$, $R_{202}$ and $R_{203}$ include an aryl group (preferably having a carbon number of 6 to 15), a linear or branched alkyl group (preferably having a carbon number of 1 to 10), and a cycloalkyl group (preferably having a carbon number of 3 to 15).

At least one of three members $R_{201}$, $R_{202}$ and $R_{203}$ is preferably an aryl group, and it is more preferred that these members all are an aryl group. The aryl group may be a heteroaryl group such as indole residue and pyrrole residue, other than a phenyl group or a naphthyl group. These aryl groups may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7).

Also, two members selected from $R_{201}$, $R_{202}$ and $R_{203}$ may combine with each other through a single bond or a linking group. Examples of the linking group include, but are not limited to, an alkylene group (preferably having a carbon number of 1 to 3), —O—, —S—, —CO— and —SO$_2$—.

The preferred structure when at least one of $R_{201}$, $R_{202}$ and $R_{203}$ is not an aryl group includes cation structures such as compounds described in JP-A-2004-233661, paragraphs 0046 and 0047, and JP-A-2003-35948, paragraphs 0040 to 0046, Compounds (1-1) to (1-70) set forth in U.S. Patent Application Publication 2003/0224288A1, and Compounds (IA-1) to (IA-54) and (IB-1) to (IB-24) set forth in U.S. Patent Application Publication 2003/0077540A1.

In formulae (ZII) and (ZIII), each of $R_{204}$ to $R_{207}$ independently represents an aryl group, an alkyl group or a cycloalkyl group.

The aryl group, alkyl group and cycloalkyl group of $R_{204}$ to $R_{207}$ are the same as the aryl group, alkyl group and cycloalkyl group of $R_{201}$ to $R_{203}$ above.

The aryl group, alkyl group and cycloalkyl group of $R_{204}$ to $R_{207}$ may have a substituent. Examples of the substituent include those which the aryl group, alkyl group and cycloalkyl group of $R_{201}$ to $R_{203}$ above may have.

Z⁻ represents a non-nucleophilic anion, and examples thereof are the same as those of the non-nucleophilic anion of Z⁻ in formula (ZI).

Other examples of the acid generator include compounds represented by the following formulae (ZIV), (ZV) and (ZVI):

$$Ar_3—SO_2—SO_2—Ar_4 \quad (ZIV)$$

$$R_{208}—SO_2O—N\underset{O}{\overset{O}{\diagup\diagdown}}A \quad (ZV)$$

$$\underset{R_{210}}{\overset{N}{\diagdown}}\underset{R_{209}}{\overset{O—SO_2—R_{208}}{\diagup}} \quad (ZVI)$$

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

In the case of using two or more kinds of acid generators in combination, acid generators having the same anion but differing in the cation are preferably used in combination, and a combination of an acid generator represented by formula (1-1) or (1-2) and an acid generator represented by formula (ZI) is preferred.

Preferred examples of the acid generator used in combination with the acid generator represented by formula (1-1) or (1-2) are set forth below.

(z1) triphenylsulfonium trifluoromethanesulfonate (z2) triphenylsulfonium nonafluorobutanesulfonate ($C_4F_9SO_3^-$)

(z3) triphenylsulfonium perfluorooctanesulfonate ($C_8F_{17}SO_3^-$)

(z4) triphenylsulfonium 2,4,6-triisopropylbenzenesulfonate (z5) triphenylsulfonium 3,5-bis(trifluoromethyl)benzenesulfonate (z6) diphenyl(4-methylphenyl)sulfonium perfluorooctanesulfonate ($C_8F_{17}SO_3^-$)

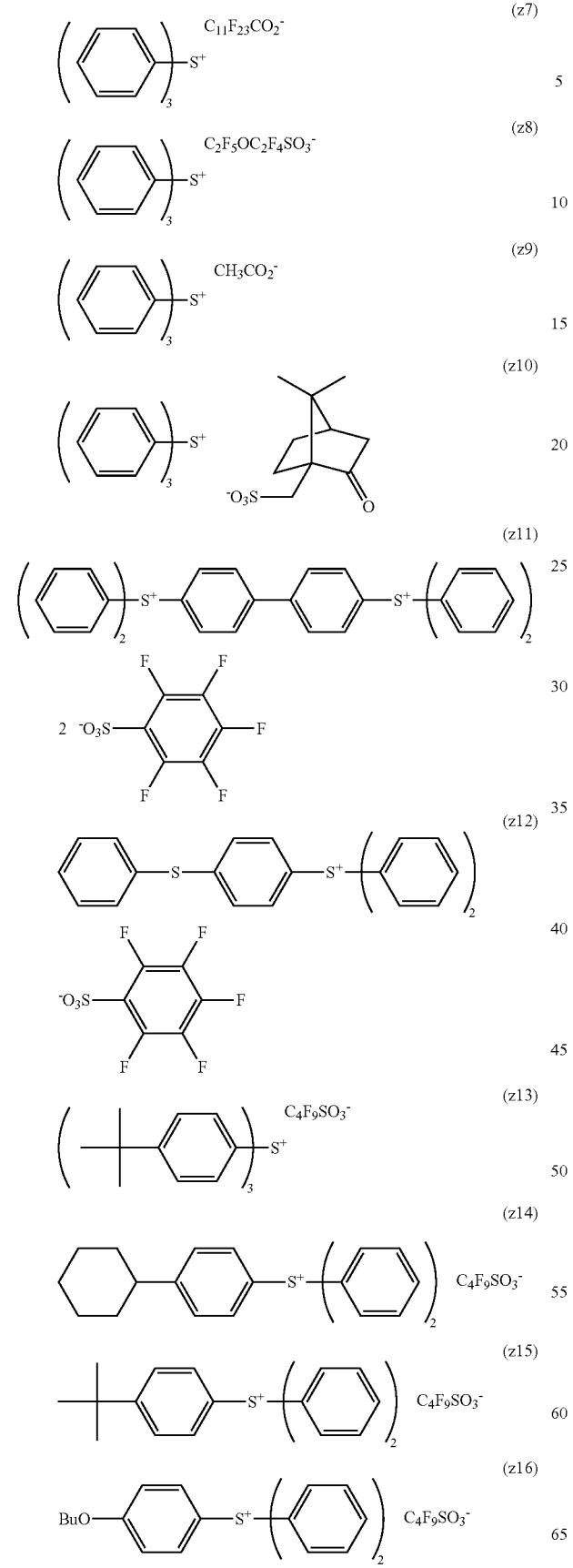
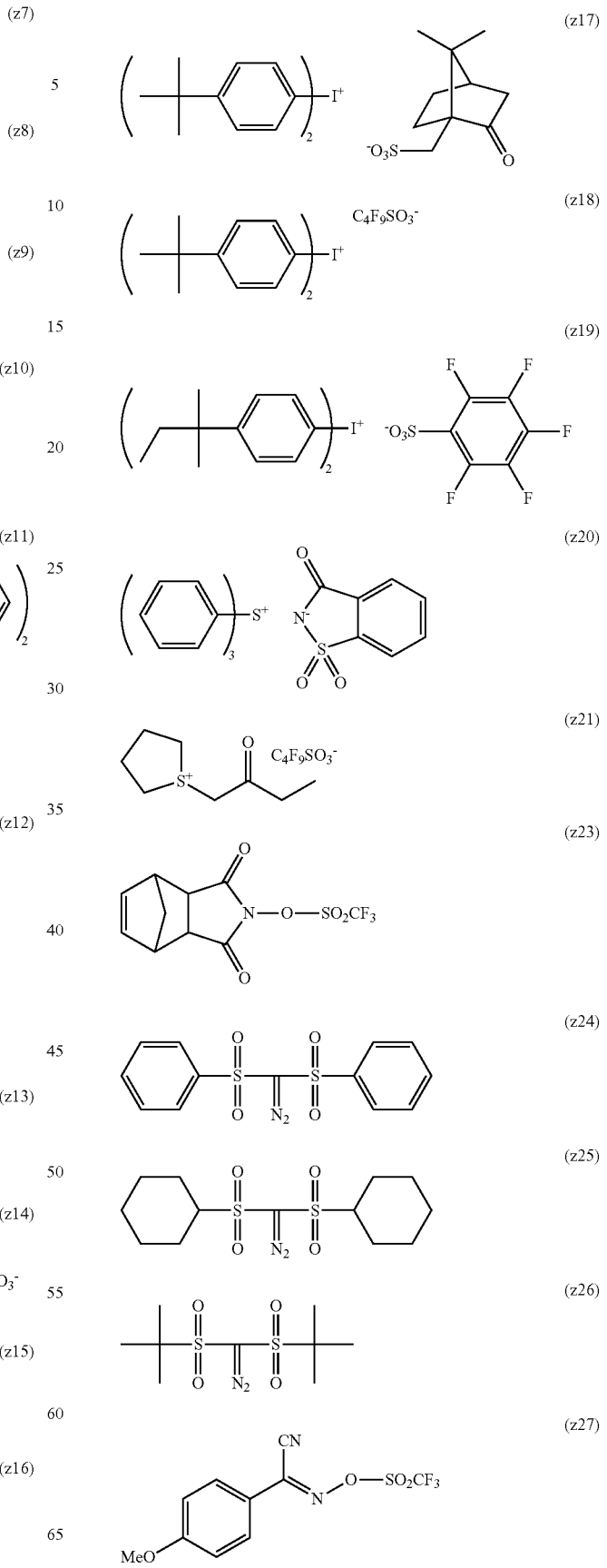

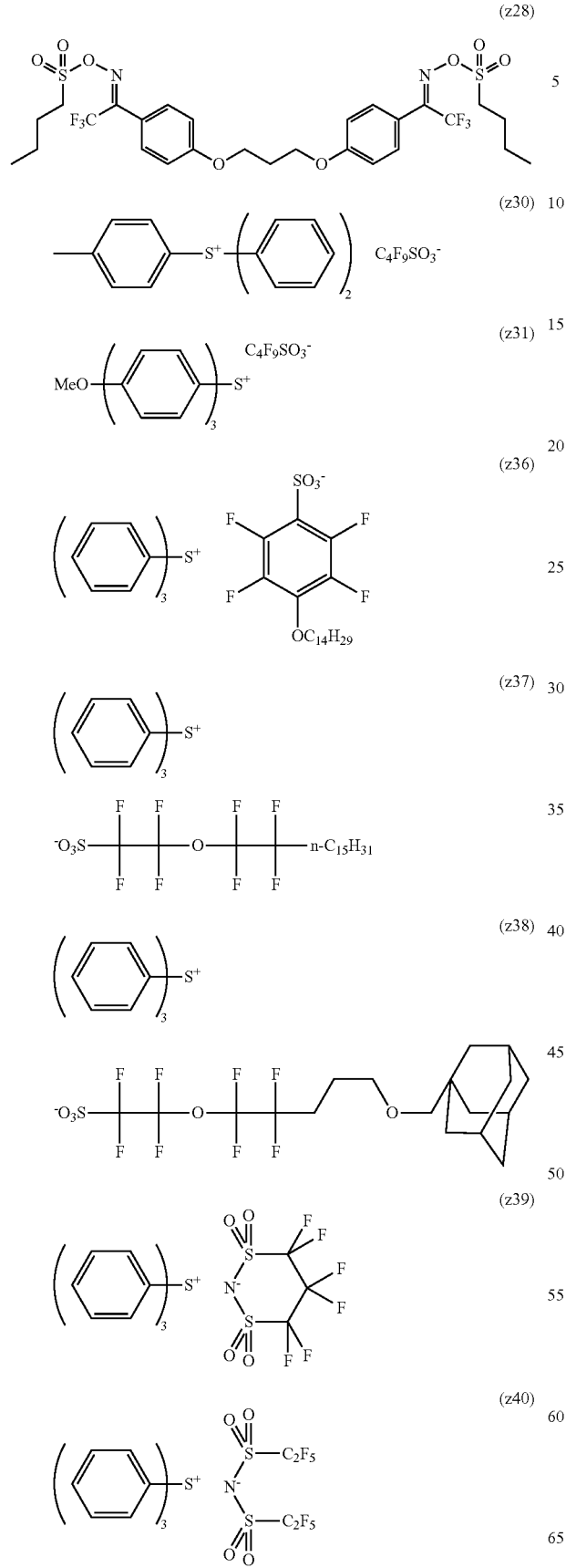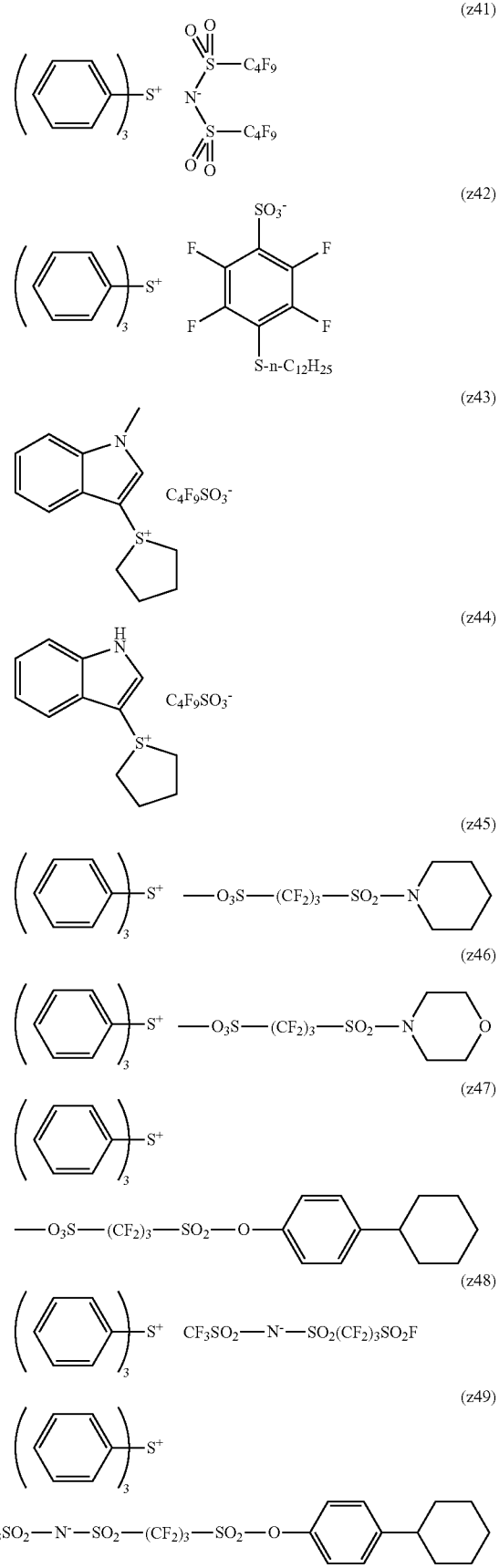

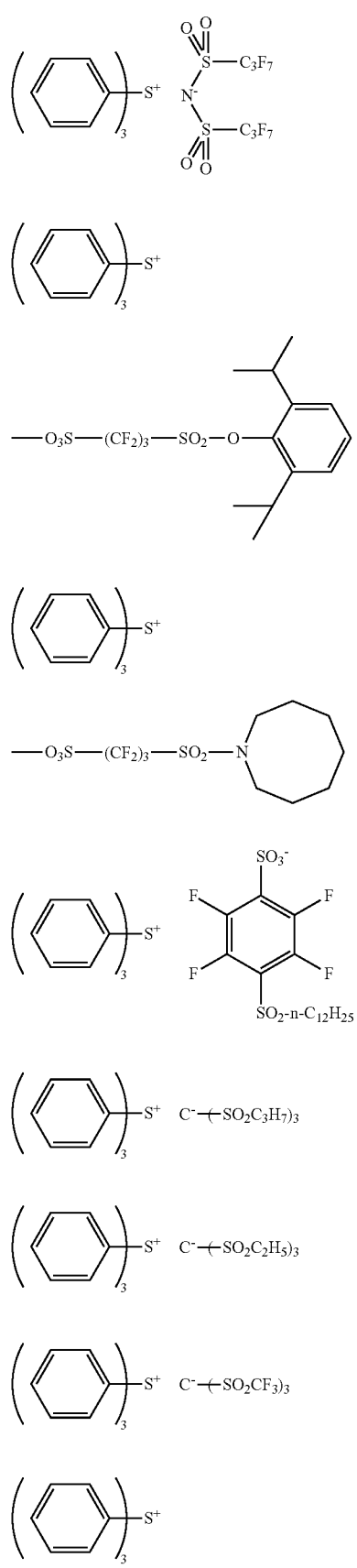
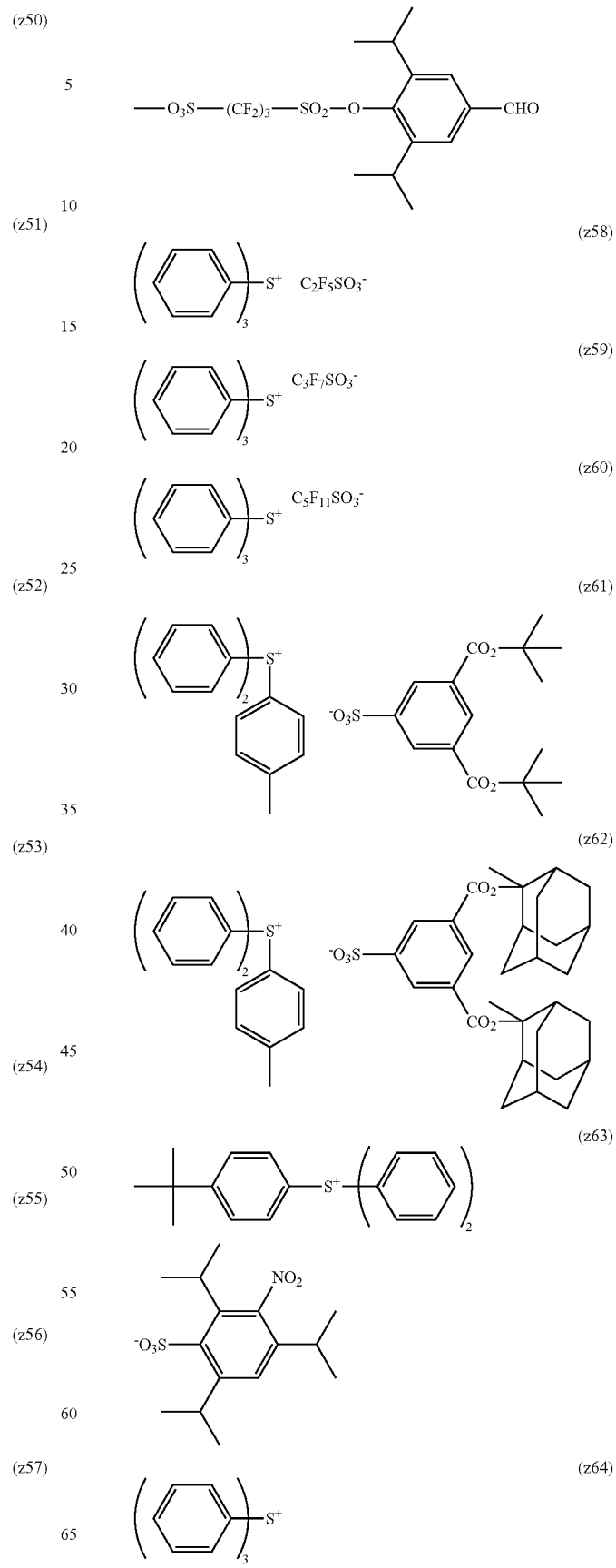

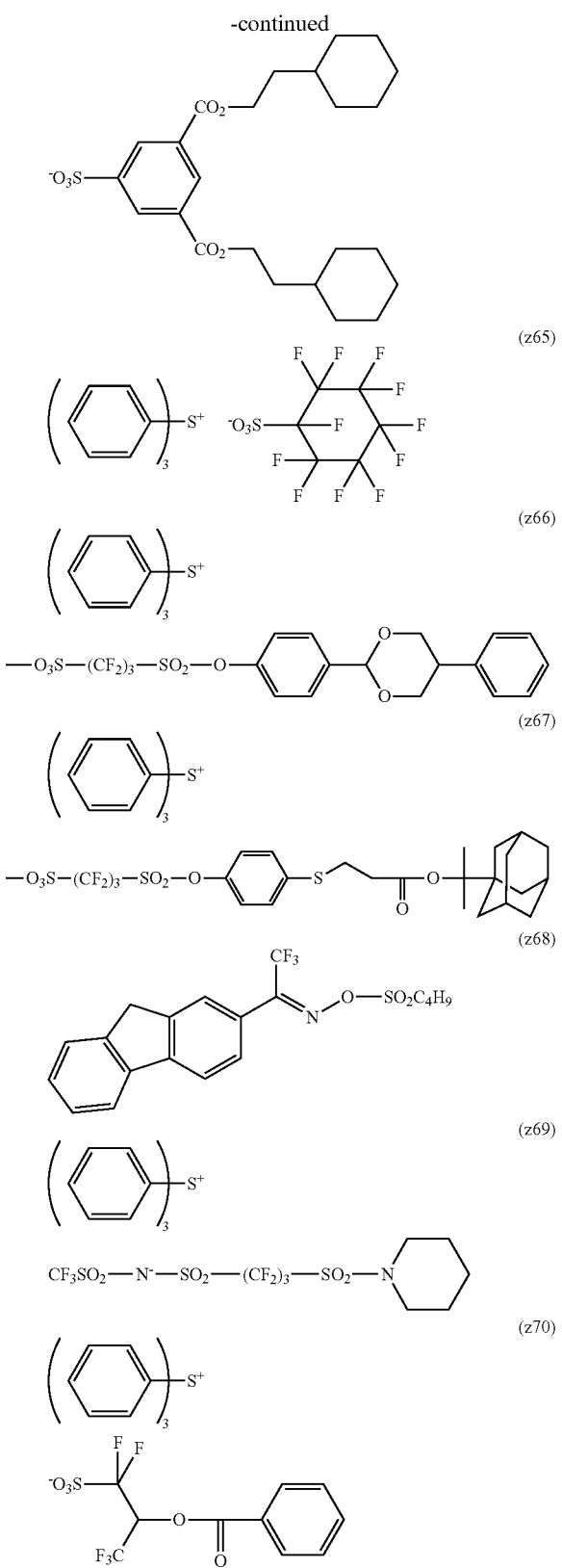

[3] Hydrophobic Resin

In the case of performing the exposure through an immersion medium, a hydrophobic resin (C) may be further added, if desired, to the composition of the present invention. The hydrophobic resin (C) when added is unevenly distributed to the surface layer of the actinic ray-sensitive or radiation-sensitive film and when the immersion medium is water, the film formed can be enhanced in the receding contact angle on the film surface for water as well as in the followability of the immersion liquid. The hydrophobic resin (C) may be any resin as long as the receding contact angle on the surface is enhanced by its addition, but a resin having at least either a fluorine atom or a silicon atom is preferred. The receding contact angle of the film is preferably from 60 to 90°, more preferably 70° or more.

The amount of the hydrophobic resin added may be appropriately adjusted to give a film having a receding contact angle in the range above but is preferably from 0.1 to 10 mass %, more preferably from 0.1 to 5 mass %, based on the entire solid content of the composition. The hydrophobic resin (C) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in a dynamic state. In a simple manner, the receding contact angle can be defined as a contact angle at the time of the liquid droplet interface receding when a liquid droplet ejected from a needle tip is landed on a substrate and then the liquid droplet is again suctioned into the needle. In general, the receding contact angle can be measured by a contact angle measuring method called an expansion/contraction method.

In the immersion exposure step, the immersion liquid needs to move on a wafer following the movement of an exposure head that is scanning the wafer at a high speed and forming an exposure pattern. Therefore, the contact angle of the immersion liquid with the film in a dynamic state is important, and the resist is required to have a performance of allowing a liquid droplet to follow the high-speed scanning of an exposure head with no remaining.

The fluorine atom or silicon atom in the hydrophobic resin (C) may be present in the main chain of the resin or may be substituted on the side chain.

The hydrophobic resin (C) is preferably a resin having a fluorine atom-containing alkyl group, a fluorine atom-containing cycloalkyl group or a fluorine atom-containing aryl group, as a fluorine atom-containing partial structure. The fluorine atom-containing alkyl group (preferably having a carbon number of 1 to 10, more preferably from 1 to 4) is a linear or branched alkyl group with at least one hydrogen atom being replaced by a fluorine atom and may further have other substituents.

The fluorine atom-containing cycloalkyl group is a monocyclic or polycyclic cycloalkyl group with at least one hydrogen atom being replaced by a fluorine atom and may further have other substituents.

The fluorine atom-containing aryl group is an aryl group (e.g., phenyl, naphthyl) with at least one hydrogen atom being replaced by a fluorine atom and may further have other substituents.

Preferred examples of the fluorine atom-containing alkyl group, fluorine atom-containing cycloalkyl group and fluorine atom-containing aryl group include groups represented by the following formulae (F2) to (F4), but the present invention is not limited thereto.

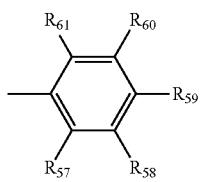
(F2)

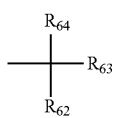
(F3)

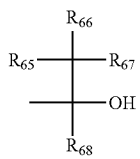
(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine together to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are set forth below, but the present invention is not limited thereto.

In specific examples, $X_1$ represents a hydrogen atom, —CH$_3$, —F or —CF$_3$. $X_2$ represents —F or —CF$_3$.

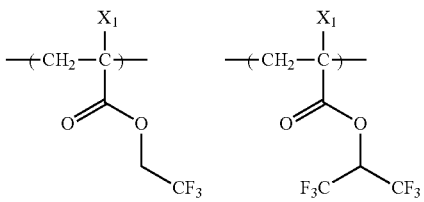

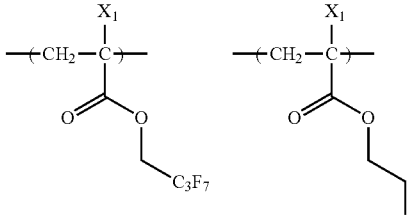

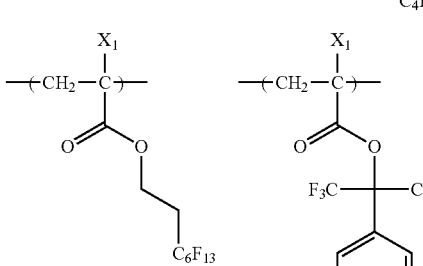

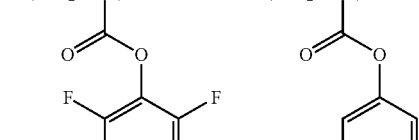

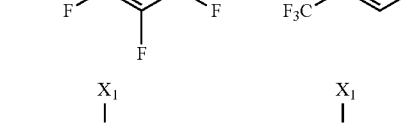

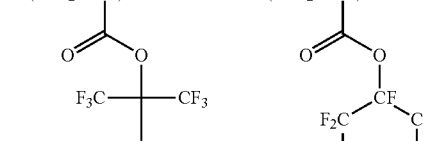

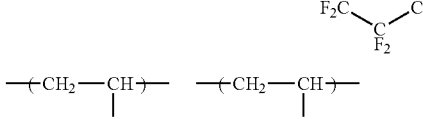

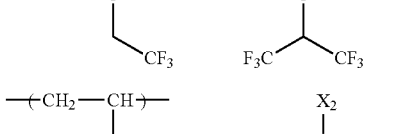

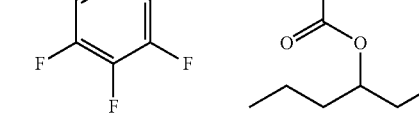

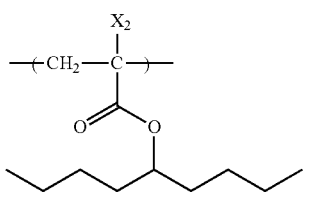
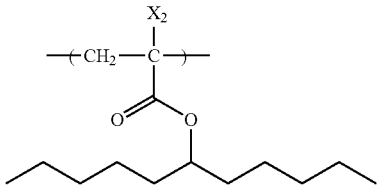
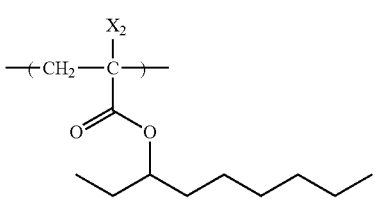
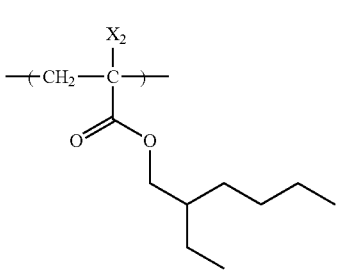
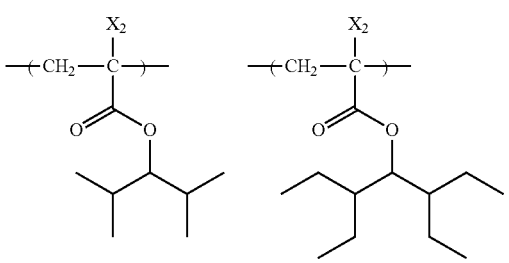
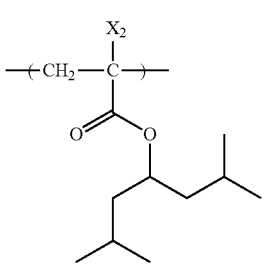
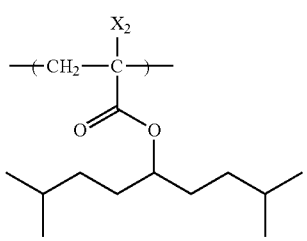

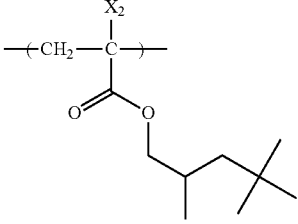
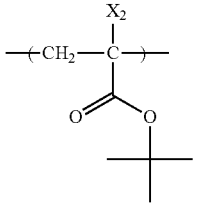

The hydrophobic resin (C) may contain a silicon atom. The hydrophobic resin (C) is preferably a resin having an alkylsilyl structure (preferably a trialkylsilyl group) or cyclic siloxane structure as a silicon-containing partial structure.

Specific examples of the alkylsilyl structure and cyclic siloxane structure include groups represented by the following formulae (CS-1) to (CS-3):

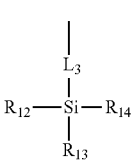

(CS-1)

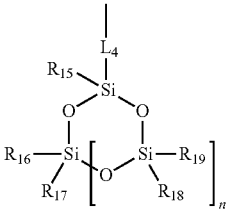

(CS-2)

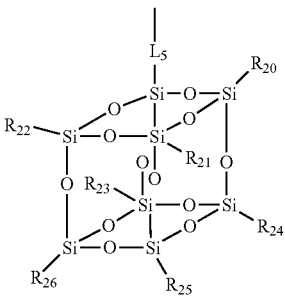

(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5. n is preferably an integer of 2 to 4.

Specific examples of the repeating unit having a group represented by formula (CS-1) to (CS-3) are set forth below, but the present invention is not limited thereto. In specific examples, $X_1$ represents a hydrogen atom, —$CH_3$, —F or —$CF_3$.

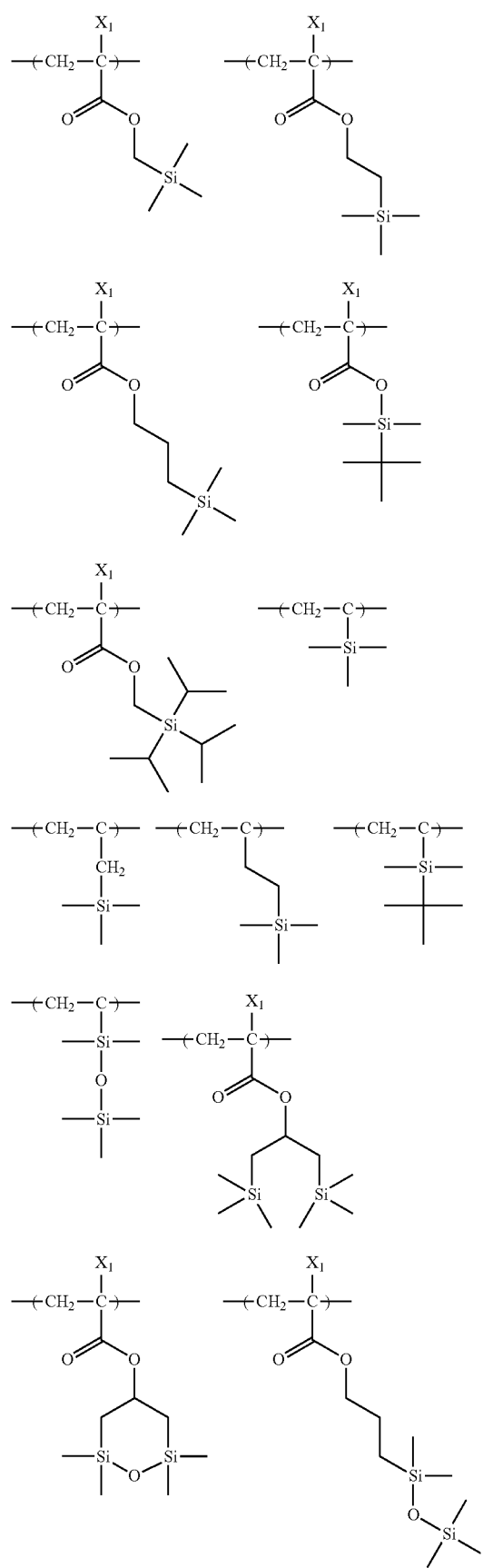

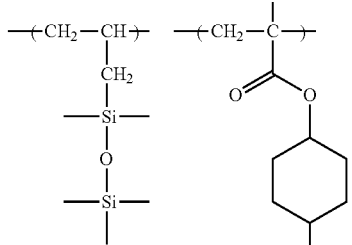

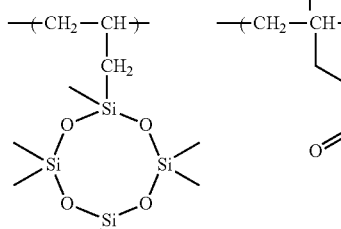

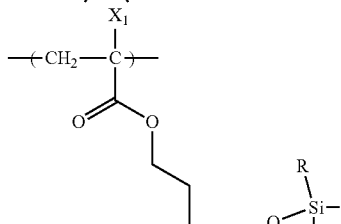

R = CH₃, C₂H₅, C₃H₇, C₄H₉

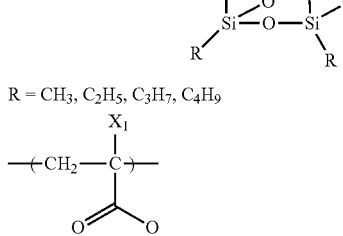

Furthermore, the hydrophobic resin (C) may contain at least one group selected from the group consisting of the following (x) to (z):

(x) an alkali-soluble group,
(y) a group capable of decomposing by the action of an alkali developer to increase the solubility in an alkali developer, and
(z) a group capable of decomposing by the action of an acid.

Examples of the alkali-soluble group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred alkali-soluble groups are a fluorinated alcohol group (preferably hexafluoroisopropanol), a sulfonimide group and a bis(carbonyl)methylene group.

The repeating unit having (x) an alkali-soluble group includes a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, and these repeating units all are preferred.

The content of the repeating unit having (x) an alkali-soluble group is preferably from 1 to 50 mol %, more preferably from 3 to 35 mol %, still more preferably from 5 to 20 mol %, based on all repeating units in the resin.

Specific examples of the repeating unit having (x) an alkali-soluble group are set forth below, but the present invention is not limited thereto.

In the formulae, Rx represents H, $CH_3$, $CF_3$ or $CH_2OH$.

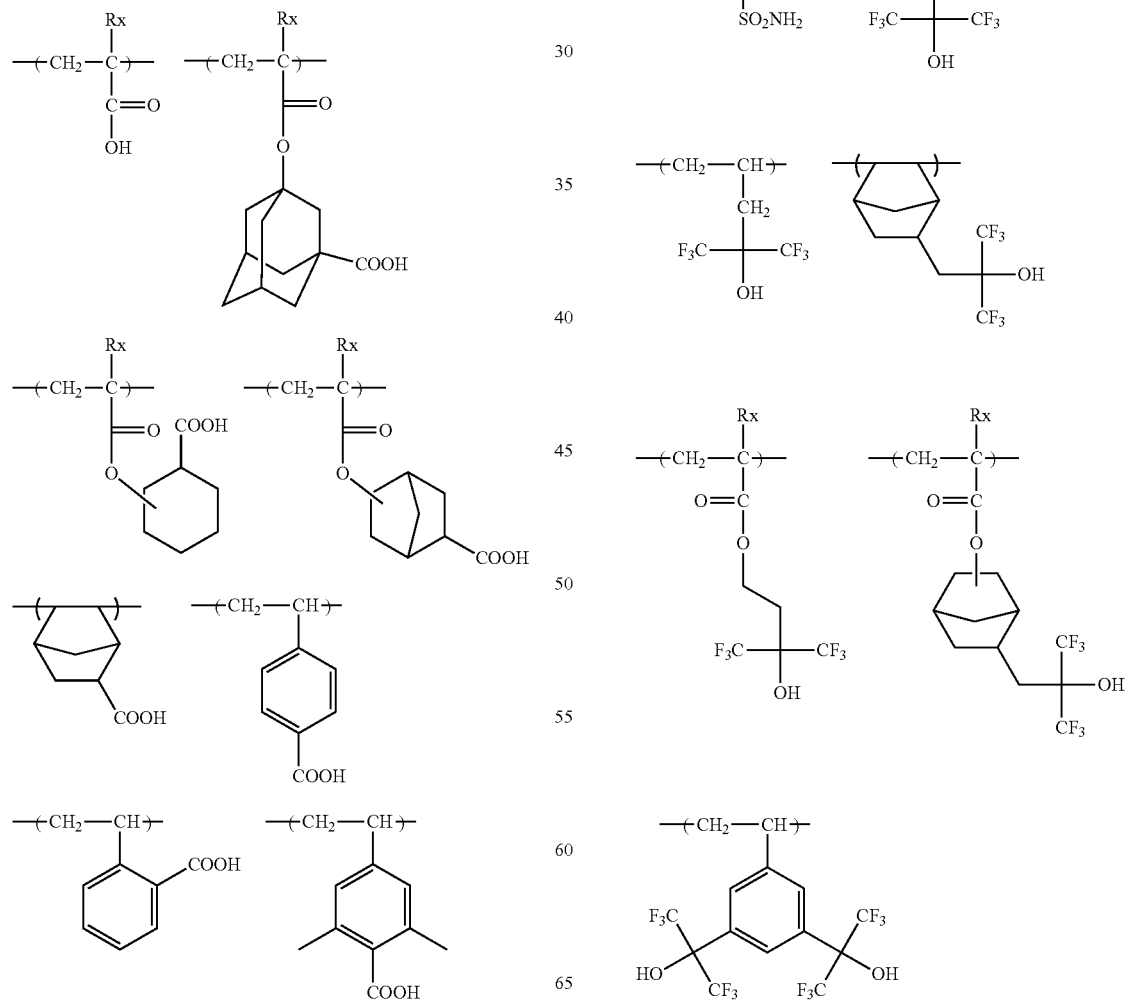

-continued

Examples of the (y) group capable of decomposing by the action of an alkali developer to increase the solubility in an alkali developer include a lactone structure-containing group, an acid anhydride group and an acid imide group, with a lactone structure-containing group being preferred.

As for the repeating unit having (y) a group capable of decomposing by the action of an alkali developer to increase the solubility in an alkali developer, both a repeating unit where (y) a group capable of decomposing by the action of an alkali developer to increase the solubility in an alkali developer is bonded to the resin main chain, such as repeating unit by an acrylic acid ester or a methacrylic acid ester, and a repeating unit where (y) a group capable of increasing the solubility in an alkali developer is introduced into the polymer chain terminal by using a polymerization initiator or chain transfer agent containing this group at the polymerization are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the resin.

Specific examples of the repeating unit having (y) a group capable of increasing the solubility in an alkali developer are the same as those of the repeating unit having a lactone structure described for the resin of the component (A).

Examples of the repeating unit having (z) a group capable of decomposing by the action of an acid, contained in the hydrophobic resin (C), are the same as those of the repeating unit having an acid-decomposable group described for the resin of the component (A). In the hydrophobic resin (C), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin.

The hydrophobic resin (C) may further contain a repeating unit represented by the following formula (III):

$$\left(\begin{matrix} H_2 \\ C \end{matrix} - \begin{matrix} R_{c31} \\ C \\ L_{c3} \\ R_{C32} \end{matrix}\right) \quad (III)$$

In formula (III), $R_{c31}$ represents a hydrogen atom, an alkyl group, an alkyl group which may be substituted by fluorine, a cyano group or a —$CH_2$—O—$R_{ac2}$ group, wherein $R_{ac2}$ represents a hydrogen atom, an alkyl group or an acyl group. $R_{ac}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group or a cycloalkenyl group. Each of these groups may be substituted by a fluorine atom or a silicon atom.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$R_{c32}$ is preferably an unsubstituted alkyl group or a fluorine atom-substituted alkyl group.

The divalent linking group of $L_{c3}$ is preferably an ester group, an alkylene group (preferably having a carbon number of 1 to 5), an oxy group, a phenylene group or an ester bond (a group represented by —COO—).

The hydrophobic resin (C) may further contain a repeating unit represented by the following formula (CII-AB):

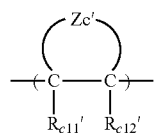

(CII-AB)

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure containing two bonded carbon atoms (C—C).

Specific examples of the repeating units represented by formulae (III) and (CII-AB) are set forth below, but the present invention is not limited thereto. In the formulae, Ra represents H, $CH_3$, $CH_2OH$, $CF_3$ or CN.

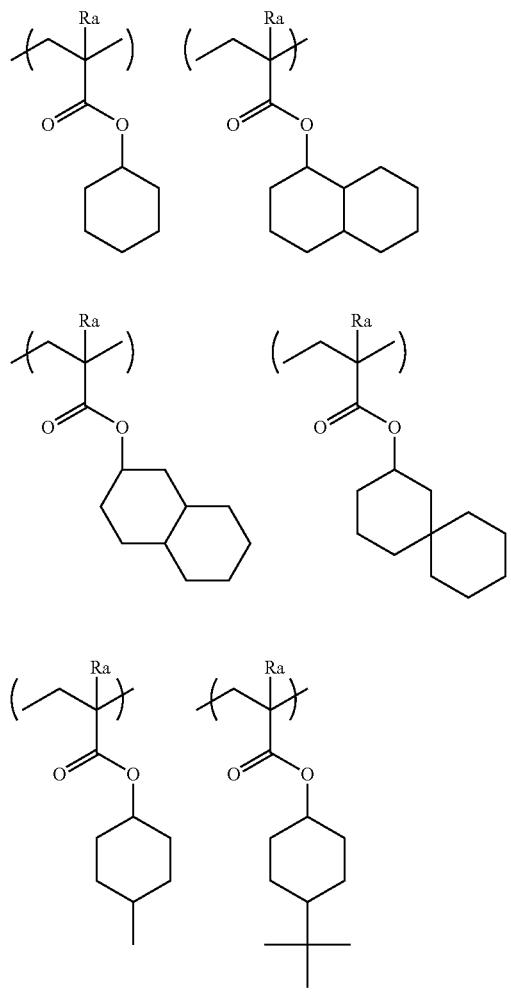

-continued

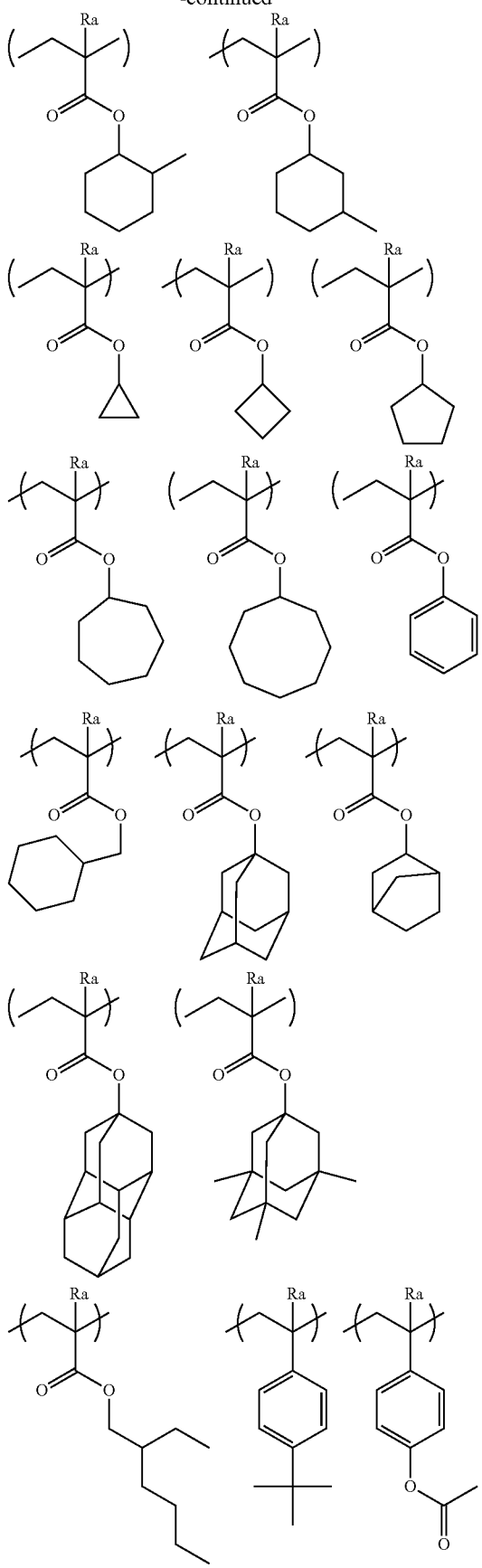

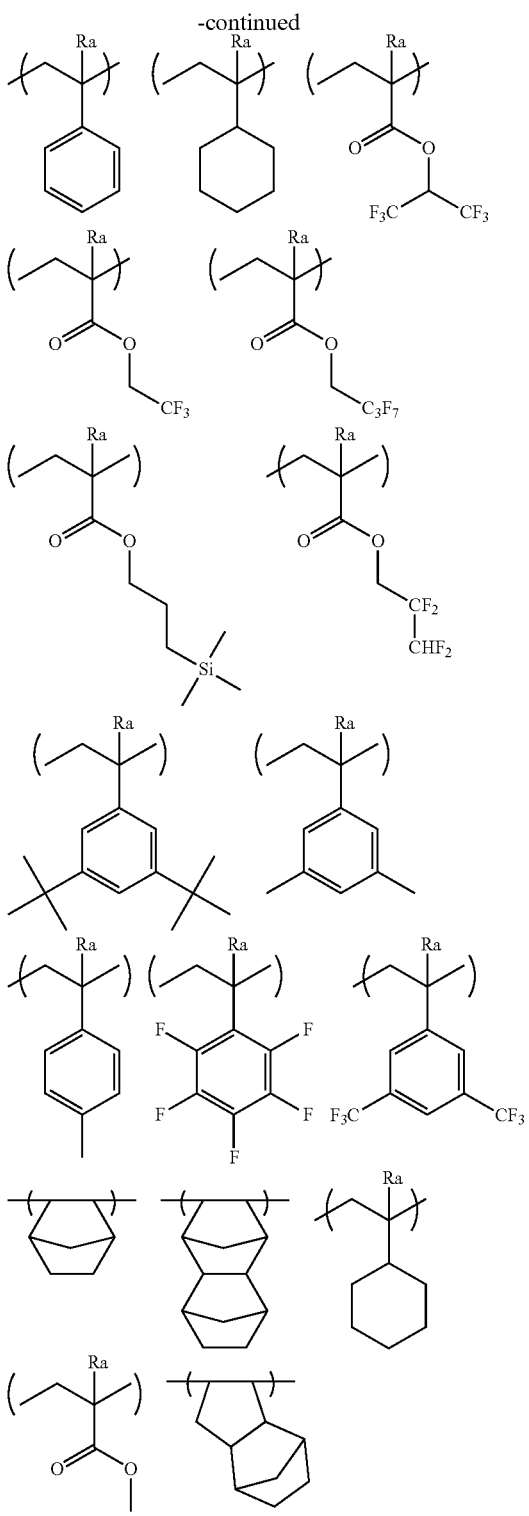

In the case where the hydrophobic resin (C) contains a fluorine atom, the fluorine atom content is preferably from 5 to 80 mass %, more preferably from 10 to 80 mass %, based on the weight average molecular weight of the hydrophobic resin (C). Also, the fluorine atom-containing repeating unit preferably occupies from 10 to 100 mol %, more preferably from 30 to 100 mol %, in the hydrophobic resin (C).

In the case where the hydrophobic resin (C) contains a silicon atom, the silicon atom content is preferably from 2 to 50 mass %, more preferably from 2 to 30 mass %, based on the weight average molecular weight of the hydrophobic resin (C). Also, the silicon atom-containing repeating unit preferably occupies from 10 to 100 mol %, more preferably from 20 to 100 mol %, in the hydrophobic resin (C).

The standard polystyrene-equivalent weight average molecular of the hydrophobic resin (C) is preferably from 1,000 to 100,000, more preferably from 1,000 to 50,000, still more preferably from 2,000 to 15,000.

In the hydrophobic resin (C), similarly to the resin of the component (A), it is of course preferred that the content of impurities such as metal is small, but also, the content of residual monomers or oligomer components is preferably from 0 to 10 mass %, more preferably from 0 to 5 mass %, still more preferably from 0 to 1 mass %. When these conditions are satisfied, a resist free of extraneous substances in the liquid or change with aging of sensitivity or the like can be obtained. Furthermore, in view of resolution, resist profile, side wall of pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (C), various commercially available products may be used, or the resin may be synthesized by an ordinary method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane and diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the composition of the present invention. By the use of this solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %. The reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of removing by extraction only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Specific examples of the hydrophobic resin (C) are set forth below. Also, the molar ratio of repeating units (corresponding to repeating units starting from the left), weight average molecular weight and polydispersity of each resin are shown in Table A later.

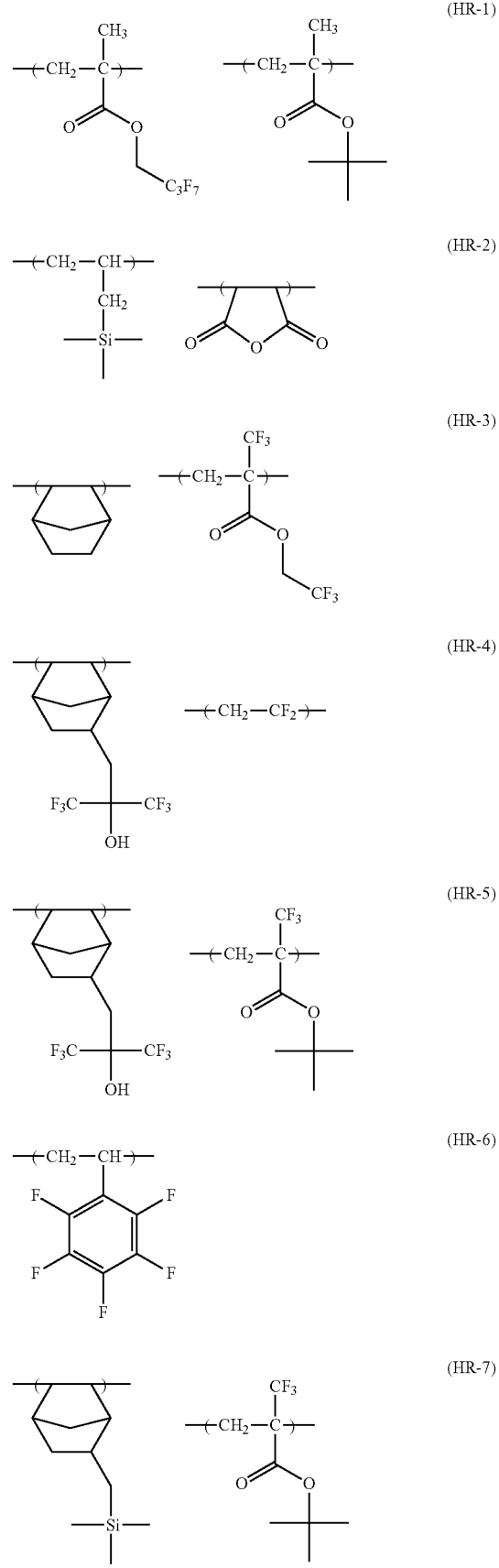

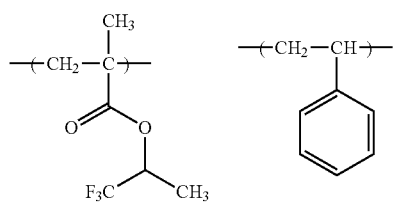
(HR-8)
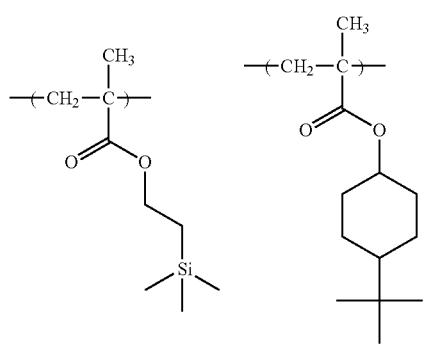
(HR-9)
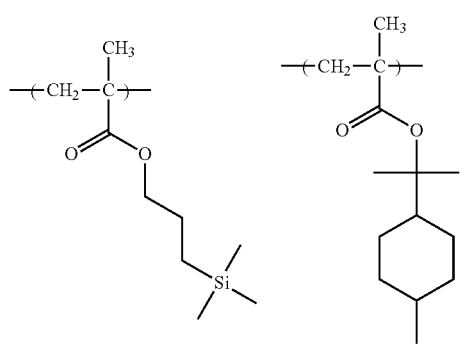
(HR-10)
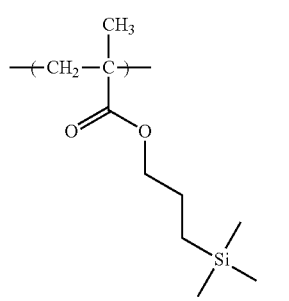
(HR-11)
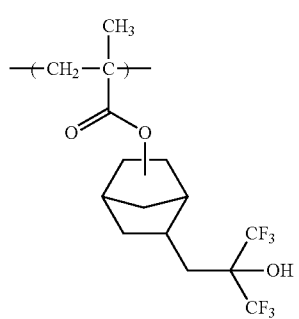
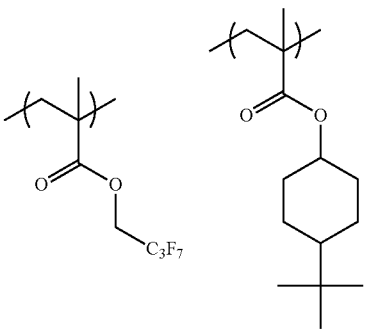
(HR-12)
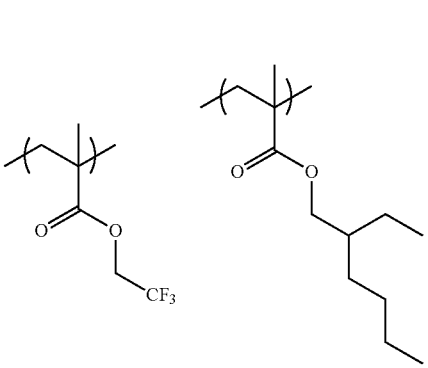
(HR-13)
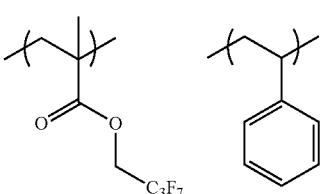
(HR-14)
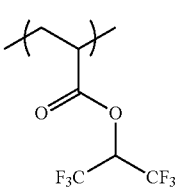
(HR-15)
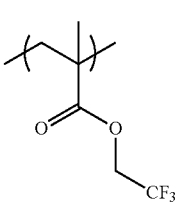
(HR-16)
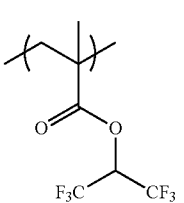
(HR-17)

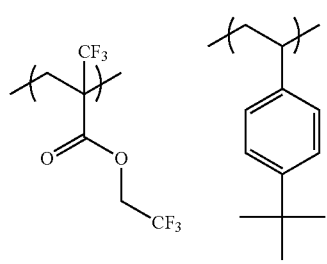 (HR-18)
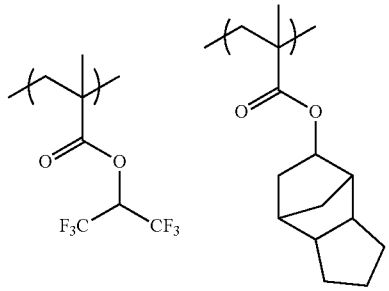 (HR-23)
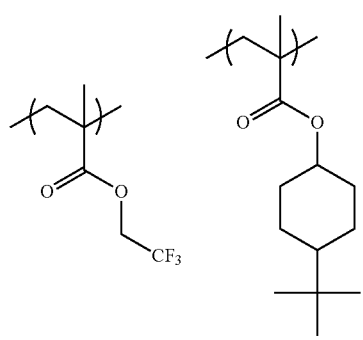 (HR-19)
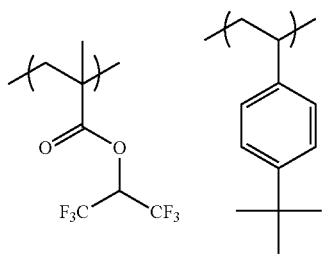 (HR-24)
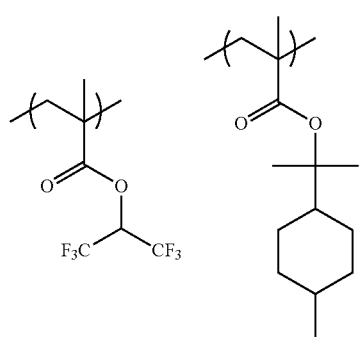 (HR-20)
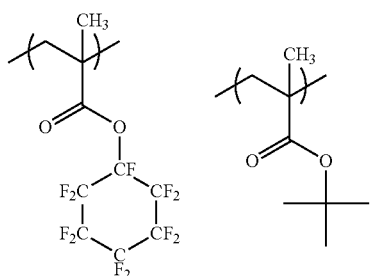 (HR-25)
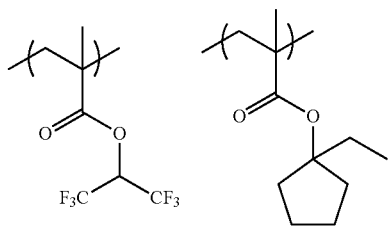 (HR-26)
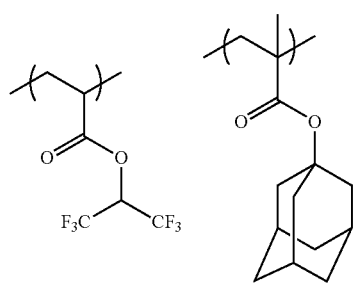 (HR-21)
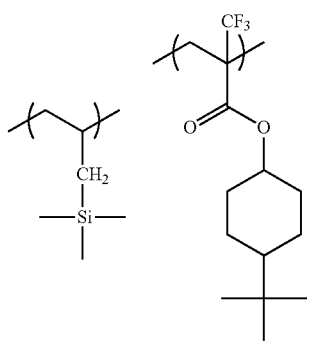 (HR-27)
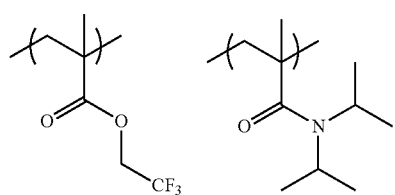 (HR-22)
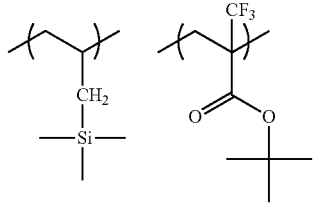 (HR-28)

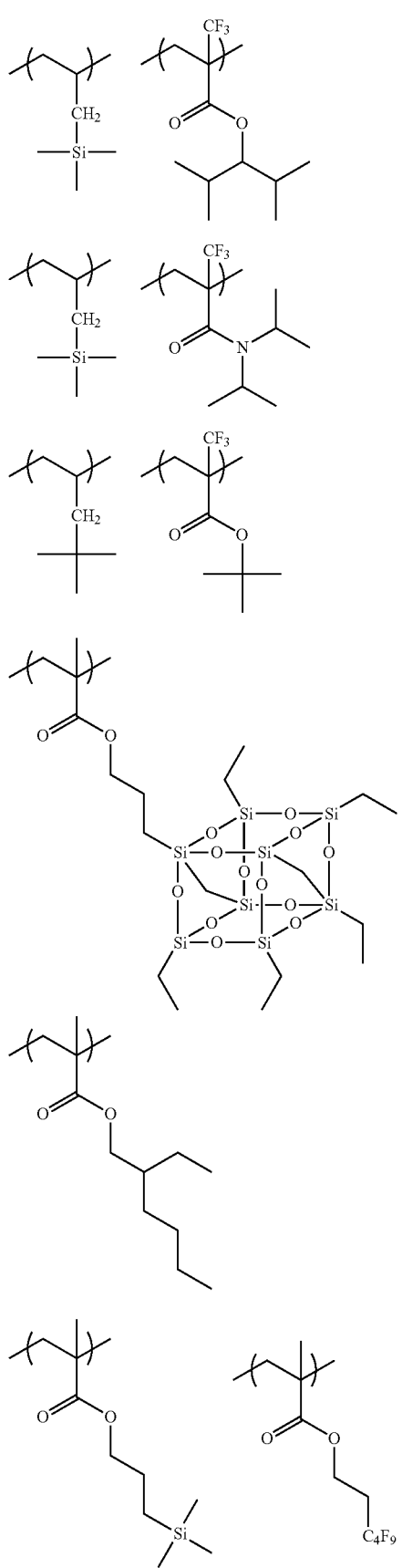
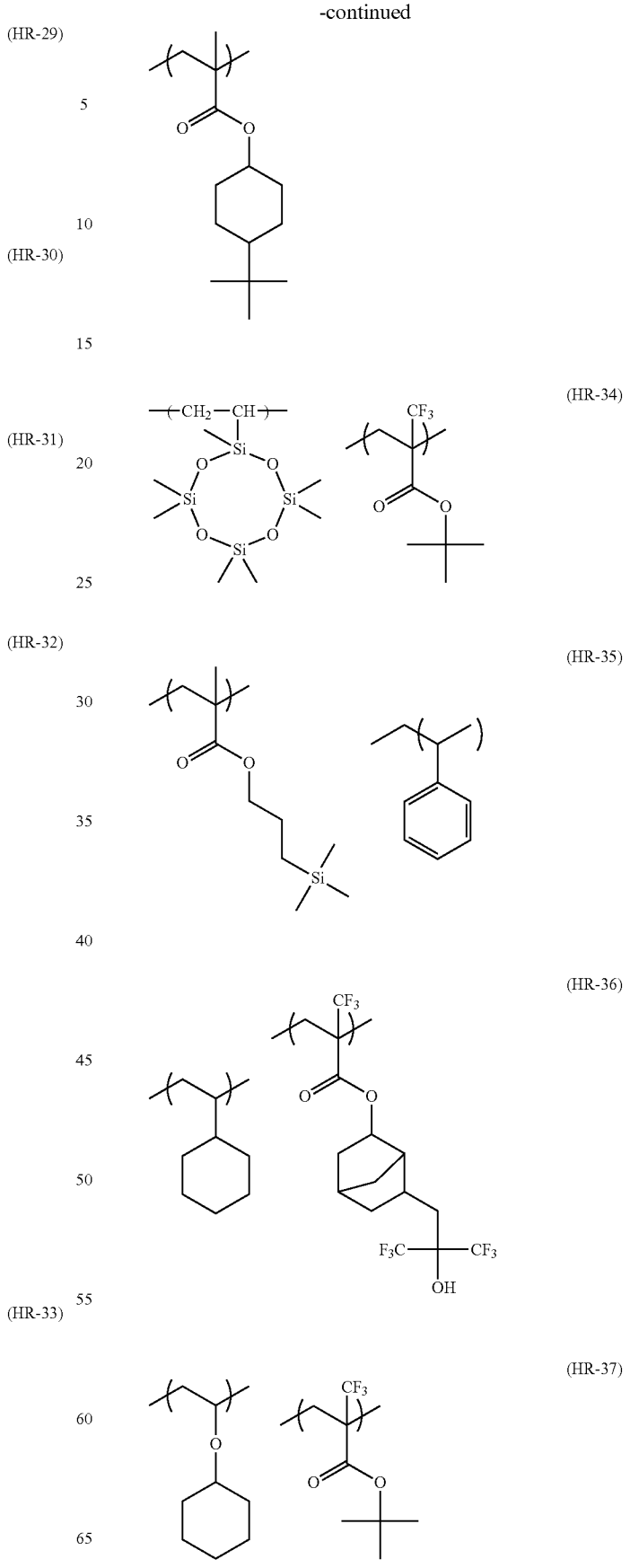

(HR-38) 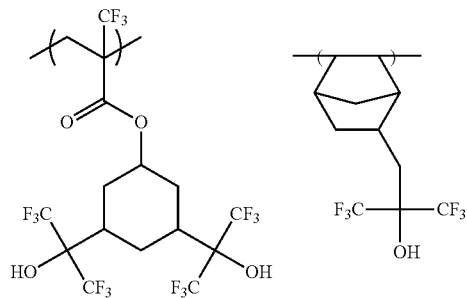
(HR-39) 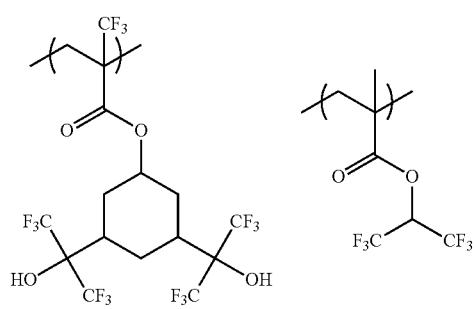
(HR-40) 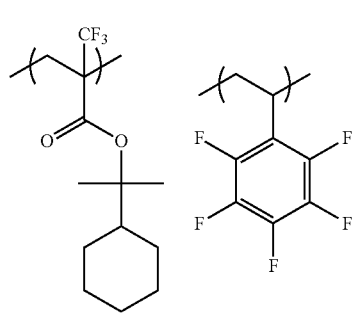
(HR-41)
(HR-42)
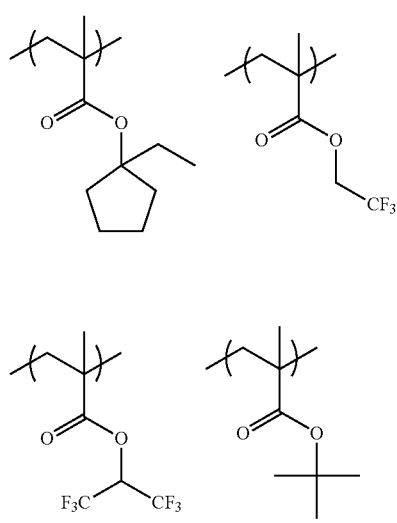
(HR-43) 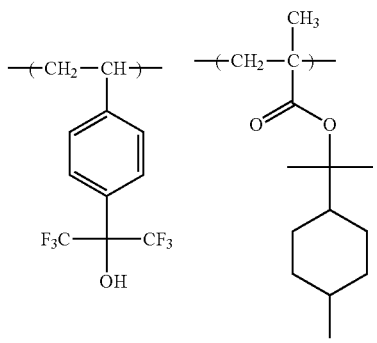
(HR-44) 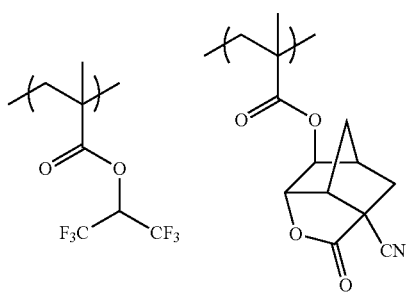
(HR-45) 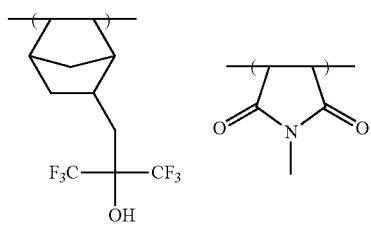
(HR-46) 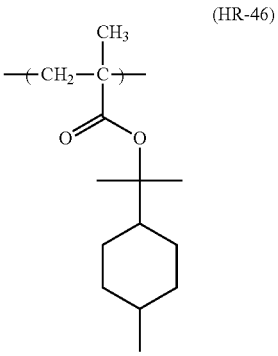

(HR-47)
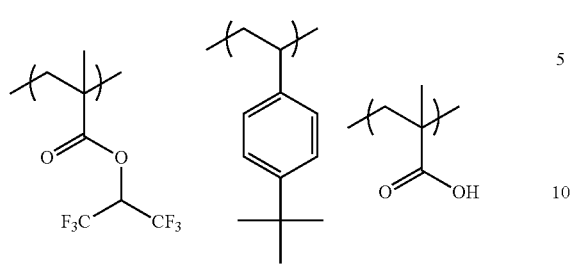
(HR-48)
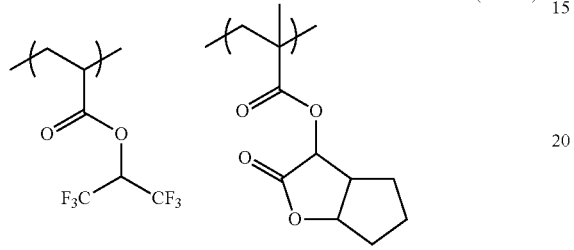
(HR-49)
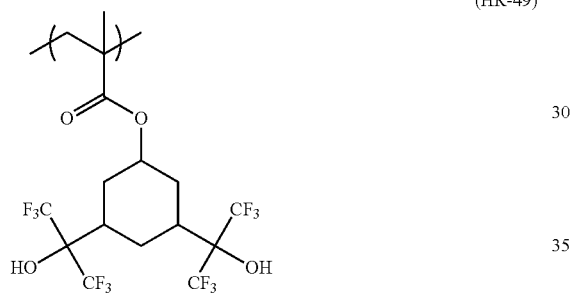
(HR-50)
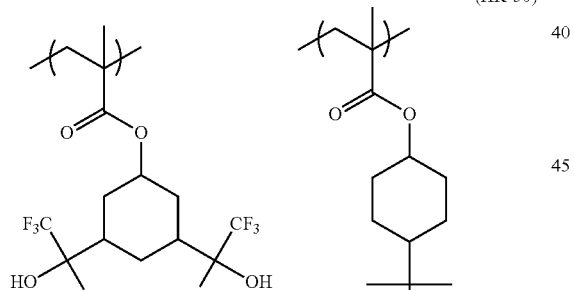
(HR-51)
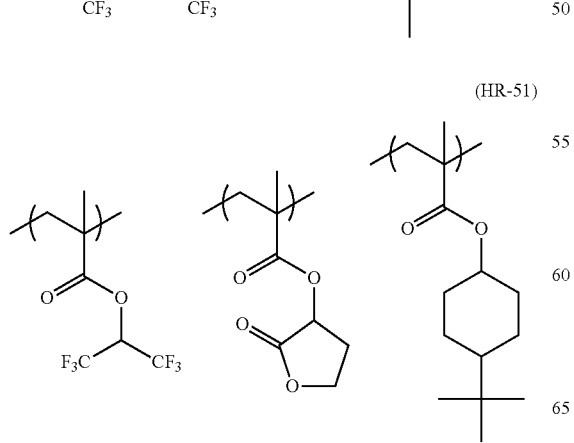
(HR-52)
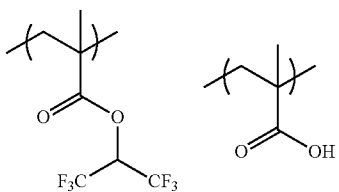
(HR-53)
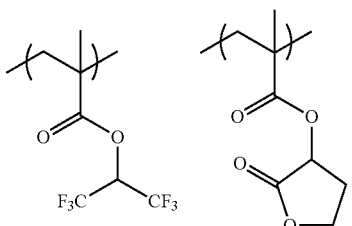
(HR-54)
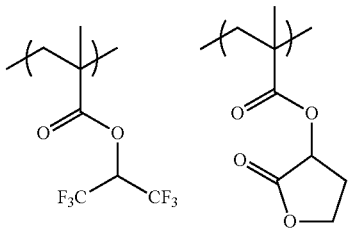
(HR-55)
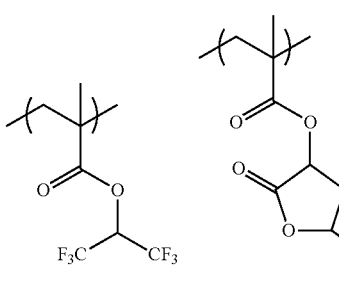

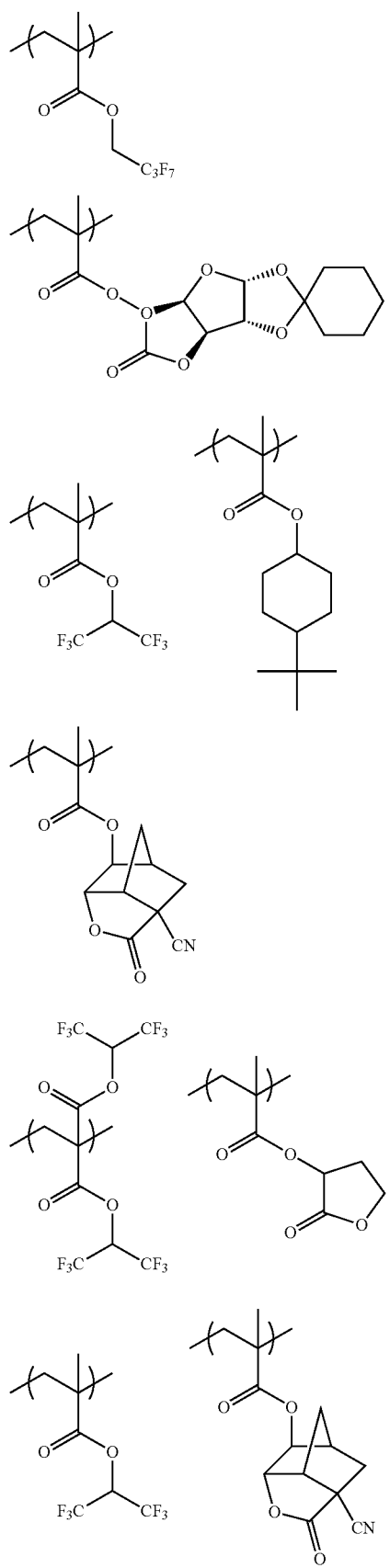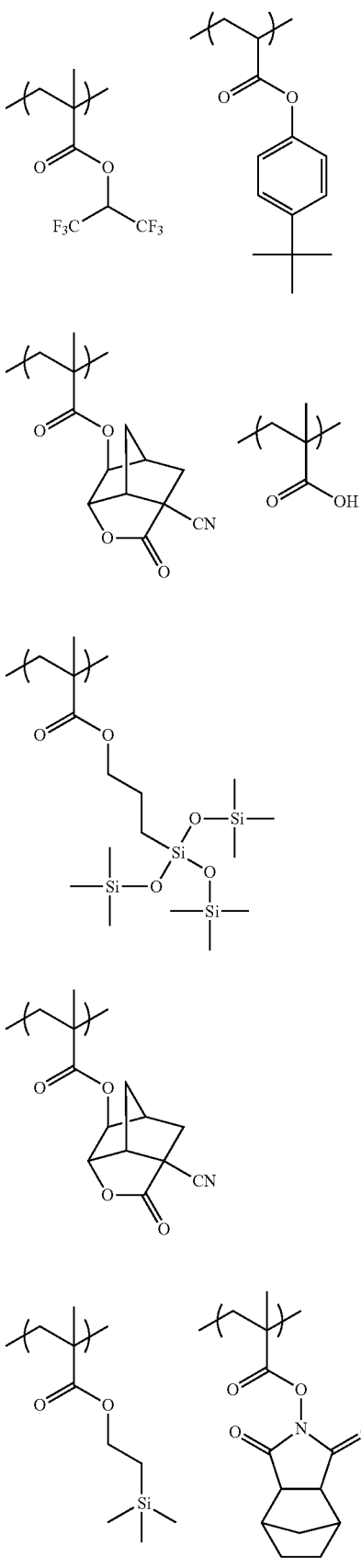

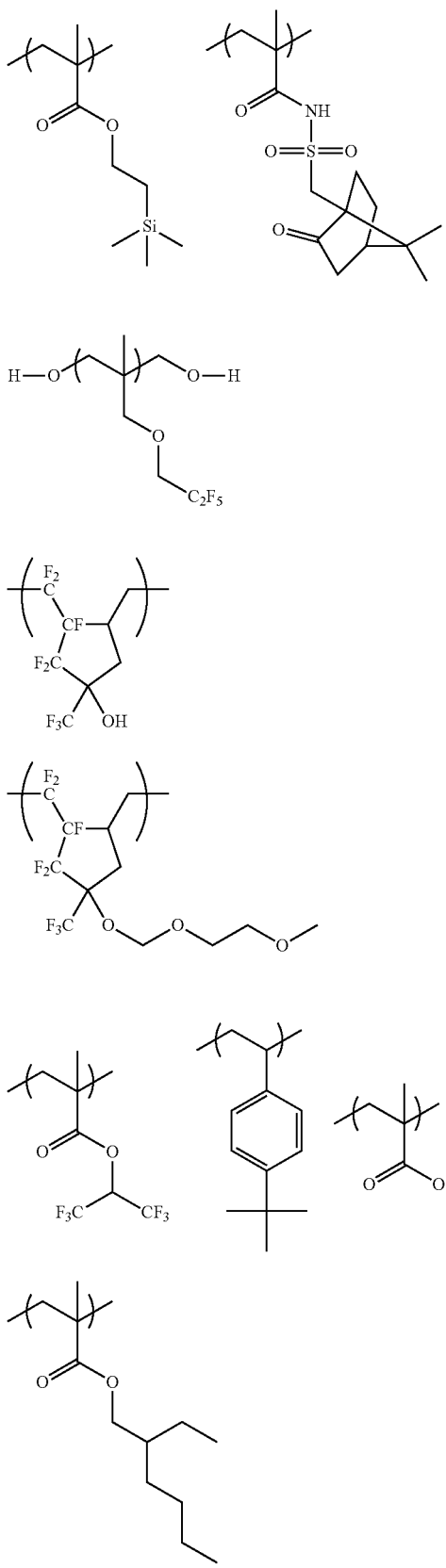

(HR-63)
(HR-64)
(HR-65)
(HR-66)

TABLE A

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
| HR-66 | 39/57/2/2 | 4200 | 1.35 |

In order to prevent the film from directly contacting with the immersion liquid, a film (hereinafter, sometimes referred to as a "topcoat") sparingly soluble in an immersion liquid may be provided between the immersion liquid and the film formed of the actinic ray-sensitive or radiation-sensitive resin composition of the present invention. The functions required of the topcoat are suitability for coating as an overlayer of the resist, transparency to radiation particularly at 193 nm, and scarce solubility in the immersion liquid. The topcoat is preferably unmixable with the resist and capable of being uniformly coated as an overlayer of the resist.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (C) is also suitable as the topcoat. If impurities are dissolved out into the immersion liquid from the topcoat, the optical lens is contaminated. In this viewpoint, the amount of residual monomer components of the polymer contained in the topcoat is preferably smaller.

On peeling off the topcoat, a developer may be used or a releasing agent may be separately used. The releasing agent is preferably a solvent less permeating the film. From the standpoint that the peeling step can be performed simultaneously with the development step of the film, the topcoat is preferably peelable with an alkali developer, whereas in view of peeling with an alkali developer, the topcoat is preferably acidic. However, in consideration of non-intermixing with the resist film, the topcoat may be even neutral or alkaline.

With no difference in the refractive index between the topcoat and the immersion liquid, the resolution is enhanced. In the case of using water as the immersion liquid at the exposure to an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably unmixable with the film and further unmixable with the immersion liquid. From this standpoint, when the immersion liquid is water, the solvent used in the topcoat is preferably a medium that is sparingly soluble in the solvent used for the composition of the present invention and at the same time, insoluble in water. Furthermore, when the immersion liquid is an organic solvent, the topcoat may be either water-soluble or water-insoluble.

[4] Solvent

Examples of the solvent that can be used at the time of preparing the actinic ray-sensitive or radiation-sensitive resin composition by dissolving the above-described components include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Preferred examples of the alkylene glycol monoalkyl ether carboxylate include propylene glycol monomethyl ether acetate (PGMEA, also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether (PGME, also known as 1-methoxy-2-propanol), propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent that can be preferably used includes a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent containing no hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) of the solvent containing a hydroxyl group to the solvent containing no hydroxyl group is from 1/99 to 99/1, preferably from 10/90 to 90/10, more preferably from 20/80 to 60/40. A mixed solvent in which a solvent containing no hydroxyl group is contained in an amount of 50 mass % or more is particularly preferred in view of coating uniformity.

The solvent is preferably a mixed solvent of two or more kinds of solvents containing propylene glycol monomethyl ether acetate (PGMEA).

[5] Basic Compound

The actinic ray-sensitive or radiation-sensitive resin composition of the present invention preferably contains a basic compound for reducing the change of performance with aging from exposure to heating.

The basic compound is preferably a compound having a structure represented by the following formulae (A) to (E):

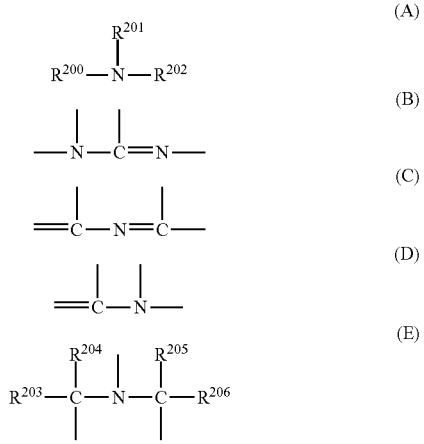

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include tetrabutylammonium hydroxide, triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, N-phenyldiethanolamine and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. The organic sulfonate includes an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring may have a substituent, and the substituent is preferably a linear or branched alkyl group having a carbon number of 1 to 6, or a cycloalkyl group having a carbon number of 3 to 6. Specific examples of the linear or branched alkyl group and cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The phenoxy group-containing amine compound and the phenoxy group-containing ammonium salt compound are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range of 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The sulfonic acid ester group in the sulfonic acid ester group-containing amine compound and sulfonic acid ester group-containing ammonium salt compound may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—CH$_2$CH$_2$O—) and an oxypropylene group (—CH(CH$_3$)CH$_2$O— or —CH$_2$CH$_2$CH$_2$O—) are preferred, and an oxyethylene group is more preferred.

The following compounds are also preferred as the basic compound.

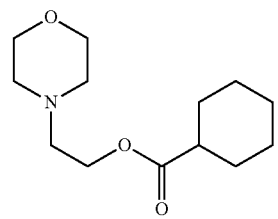
(MO-1)

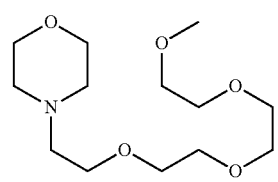
(MO-2)

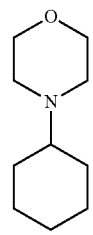
(MO-3)

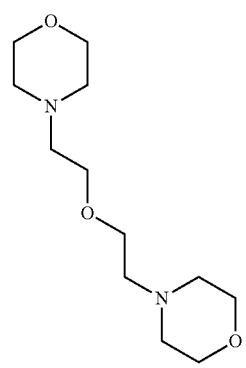
(MO-4)

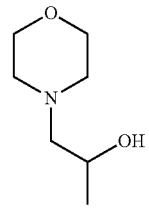
(MO-5)

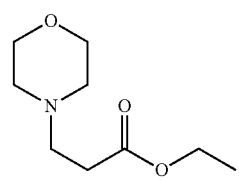
(MO-6)

One of these basic compounds is used alone, or two or more kinds thereof are used in combination.

The amount of the basic compound used is usually from 0.001 to 10 mass %, preferably from 0.01 to 5 mass %, based on the solid content of the actinic ray-sensitive or radiation-sensitive resin composition.

The ratio of acid generator and basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

Such a basic compound is preferably used, in terms of a ratio to the below-described (D) low molecular compound having a group capable of leaving by the action of an acid, in a molar ratio ((D) low molecular compound having a group capable of leaving by the action of an acid/basic compound) of 100/0 to 10/90, more specifically in a molar ratio ((D) low molecular compound having a group capable of leaving by the action of an acid/basic compound) of 100/0 to 30/70, still more preferably in a molar ratio ((D) low molecular compound having a group capable of leaving by the action of an acid/basic compound) of 100/0 to 50/50.

Incidentally, the basic compound here does not include (D) a low molecular compound having a group capable of leaving by the action of an acid when this is also a basic compound.

[6] (D) Low Molecular Compound Having a Group Capable of Leaving by the Action of an Acid The composition of the present invention may contain (D) a low molecular compound having a group capable of leaving by the action of an acid (sometimes referred to as a component (D)). The group capable of leaving by the action of an acid is not particularly limited but is preferably an acetal group, a carbonate group, a carbamate group, a tertiary ester group, a tertiary hydroxyl group or a hemiaminal ether group, more preferably a carbamate group or a hemiaminal ether group.

The molecular weight of the low molecular compound having a group capable of leaving by the action of an acid is preferably from 100 to 1,000, more preferably from 100 to 700, still more preferably from 100 to 500.

In the case where the low molecular compound having a group capable of leaving by the action of an acid has a tertiary ester structure, the compound is preferably a carboxylic acid ester or unsaturated carboxylic acid ester represented by the following formula (1a):

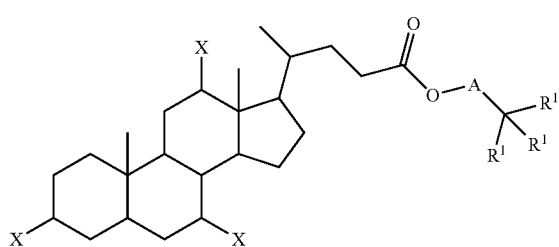

(1a)

In formula (1a), each $R^1$ independently represents a monovalent alicyclic hydrocarbon group (preferably having a carbon number of 4 to 20), a derivative thereof or an alkyl group (preferably having a carbon number of 1 to 4) and at the same time, at least one $R^1$ is the alicyclic hydrocarbon group or a derivative thereof, or while any two $R^1$'s are combined with each other to form a divalent alicyclic hydrocarbon group (preferably having a carbon number of 4 to 20) or a derivative thereof together with the carbon atom to which they are bonded, the remaining $R^1$ represents an alkyl group (preferably having a carbon number of 1 to 4), a monovalent alicyclic hydrocarbon group (preferably having a carbon number of 4 to 20) or a derivative thereof.

Each X independently represents a hydrogen atom or a hydroxy group, and at least one X is a hydroxy group.

A represents a single bond or a group represented by -D-COO—, wherein D represents an alkylene group (preferably having a carbon number of 1 to 4).

In formula (1a), A represents a single bond or a divalent linking group, and examples of the divalent linking group include a methylene group, a methylenecarbonyl group, a methylenecarbonyloxy group, an ethylene group, an ethylenecarbonyl group, an ethylenecarbonyloxy group, a propylene group, a propylenecarbonyl group and a propylenecarbonyloxy group, with a methylenecarbonyloxy group being preferred.

In formula (1a), examples of the monovalent alicyclic hydrocarbon group (preferably having a carbon number of 4 to 20) of $R^1$ and the divalent alicyclic hydrocarbon group (preferably having a carbon number of 4 to 20) formed by combining any two $R^1$'s with each other include a group composed of an alicyclic ring derived from norbornane, tricyclodecane, tetracyclododecane, adamantane or cycloalkanes such as cyclobutane, cyclopentane, cyclohexane, cycloheptane and cyclooctane; and a group where the group composed of an alicyclic ring is substituted by one or more in kind or number of an alkyl group having a carbon number of 1 to 4, such as methyl group, ethyl group, n-propyl group, i-propyl group, n-butyl group, 2-methylpropyl group, 1-methylpropyl group and tert-butyl group, and a cycloalkyl group. Among these alicyclic hydrocarbon groups, preferred are a group composed of an alicyclic ring derived from norbornane, tricyclodecane, tetracyclododecane, adamantane, cyclopentane or cyclohexane, and a group where the group composed of an alicyclic ring is substituted by the alkyl group above.

Examples of the derivative of the alicyclic hydrocarbon group include a group having one or more in kind or number of substituents such as a hydroxyl group; a carboxyl group; an oxo group (i.e., =O); a hydroxyalkyl group having a carbon number of 1 to 4, e.g., hydroxymethyl group, 1-hydroxyethyl group, 2-hydroxyethyl group, 1-hydroxypropyl group, 2-hydroxypropyl group, 3-hydroxypropyl group, 1-hydroxybutyl group, 2-hydroxybutyl group, 3-hydroxybutyl group and 4-hydroxybutyl group; an alkoxyl group having a carbon number of 1 to 4, e.g., methoxy group, ethoxy group, n-propoxy group, i-propoxy group, n-butoxy group, 2-methylpropoxy group, 1-methylpropoxy group and tert-butoxy group; and a cyanoalkyl group having a carbon number of 2 to 5, e.g., cyanomethyl group, 2-cyanoethyl group, 3-cyanopropyl group and 4-cyanobutyl group. Among these substituents, a hydroxyl group, a carboxyl group, a hydroxymethyl group, a cyano group and a cyanomethyl group are preferred.

Examples of the alkyl group of $R^1$ include an alkyl group having a carbon number of 1 to 4, such as methyl group, ethyl group, n-propyl group, i-propyl group, n-butyl group, 2-methylpropyl group, 1-methylpropyl group and tert-butyl group. Among these alkyl groups, a methyl group, an ethyl group, an n-propyl group and an i-propyl group are preferred.

Specific preferred examples include the following compounds.

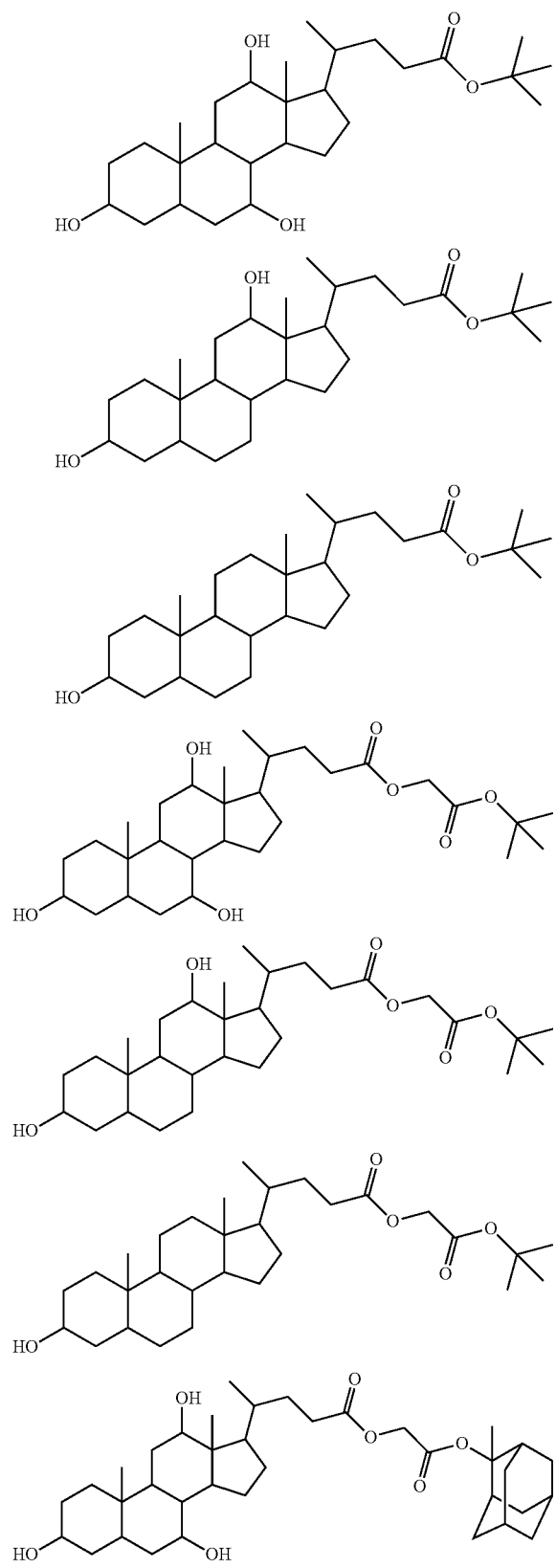

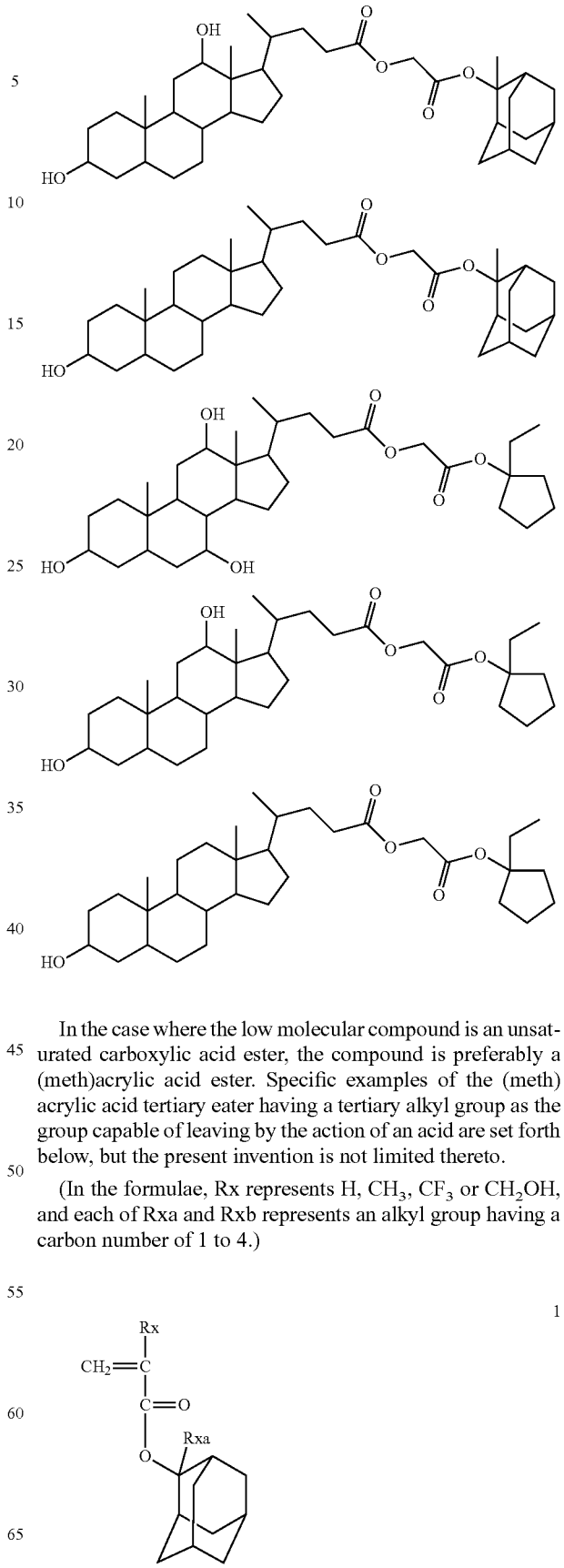

In the case where the low molecular compound is an unsaturated carboxylic acid ester, the compound is preferably a (meth)acrylic acid ester. Specific examples of the (meth)acrylic acid tertiary eater having a tertiary alkyl group as the group capable of leaving by the action of an acid are set forth below, but the present invention is not limited thereto.

(In the formulae, Rx represents H, $CH_3$, $CF_3$ or $CH_2OH$, and each of Rxa and Rxb represents an alkyl group having a carbon number of 1 to 4.)

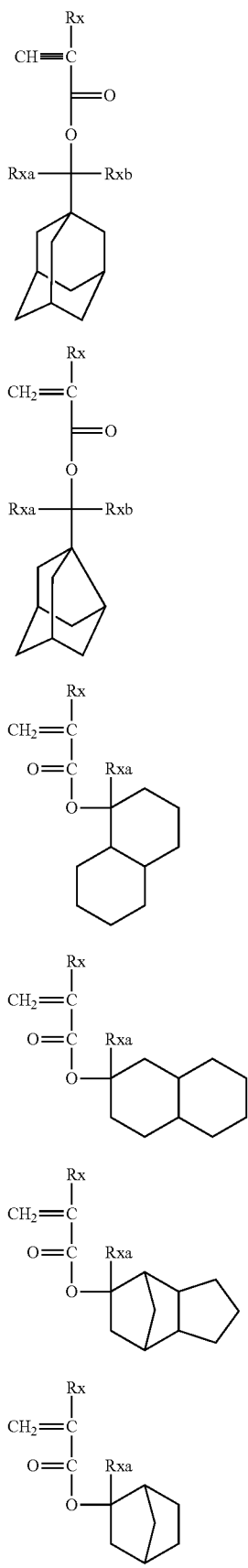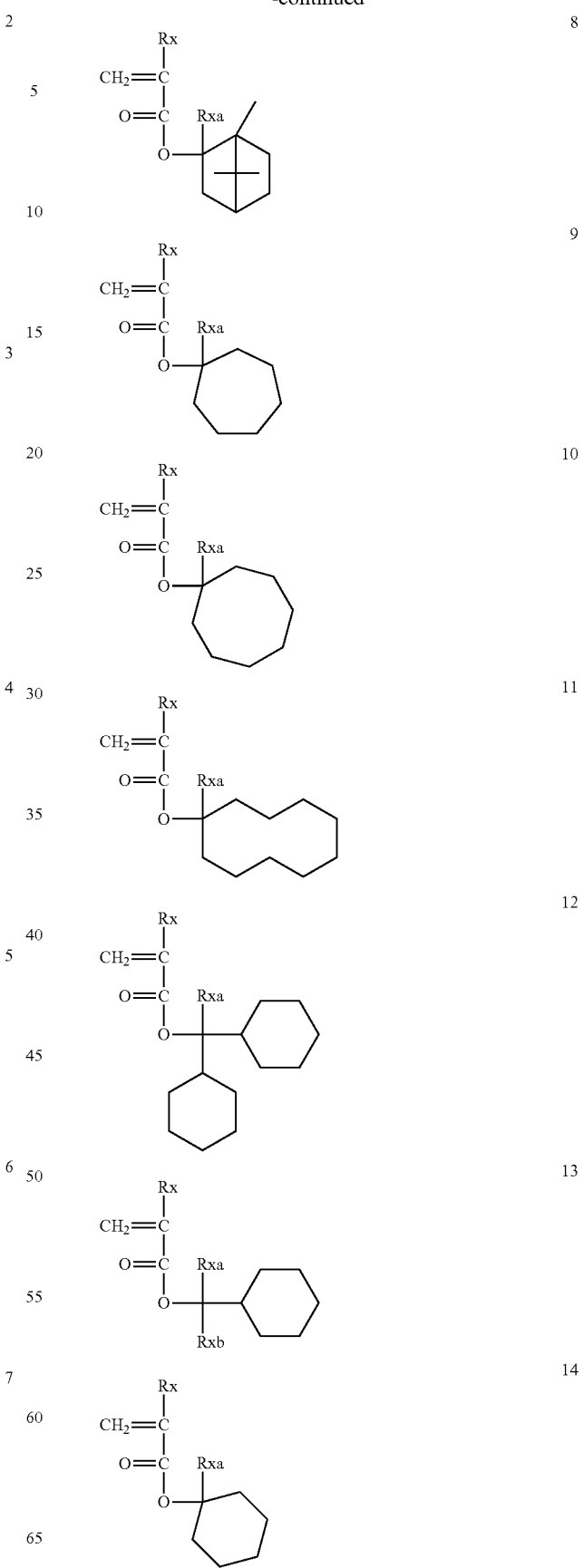

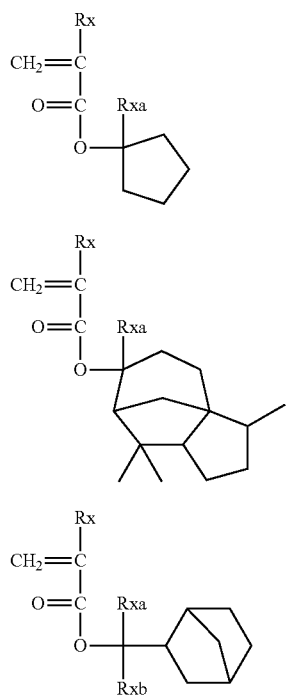

As for the (D) low molecular compound having a group capable of leaving by the action of an acid, a commercially available product may be used or the compound may be synthesized by a known method.

Also, an amine derivative having on the nitrogen atom a group capable of leaving by the action of an acid is preferred as the component D.

The component D may have a protective group-containing carbamate group on the nitrogen atom. The protective group constituting the carbamate group can be represented by the following formula (d-1):

(d-1)

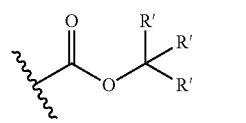

In formula (d-1), each R' independently represents a hydrogen atom, a linear, branched or cyclic alkyl group, an aryl group, an aralkyl group or an alkoxyalkyl group. Each R' may combine with every other R' to form a ring.

R' is preferably a linear or branched alkyl group, a cycloalkyl group or an aryl group, more preferably a linear or branched alkyl group or a cycloalkyl group.

Specific structures of the group are set forth below.

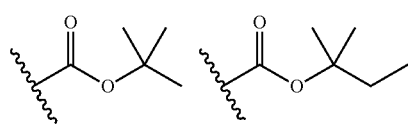

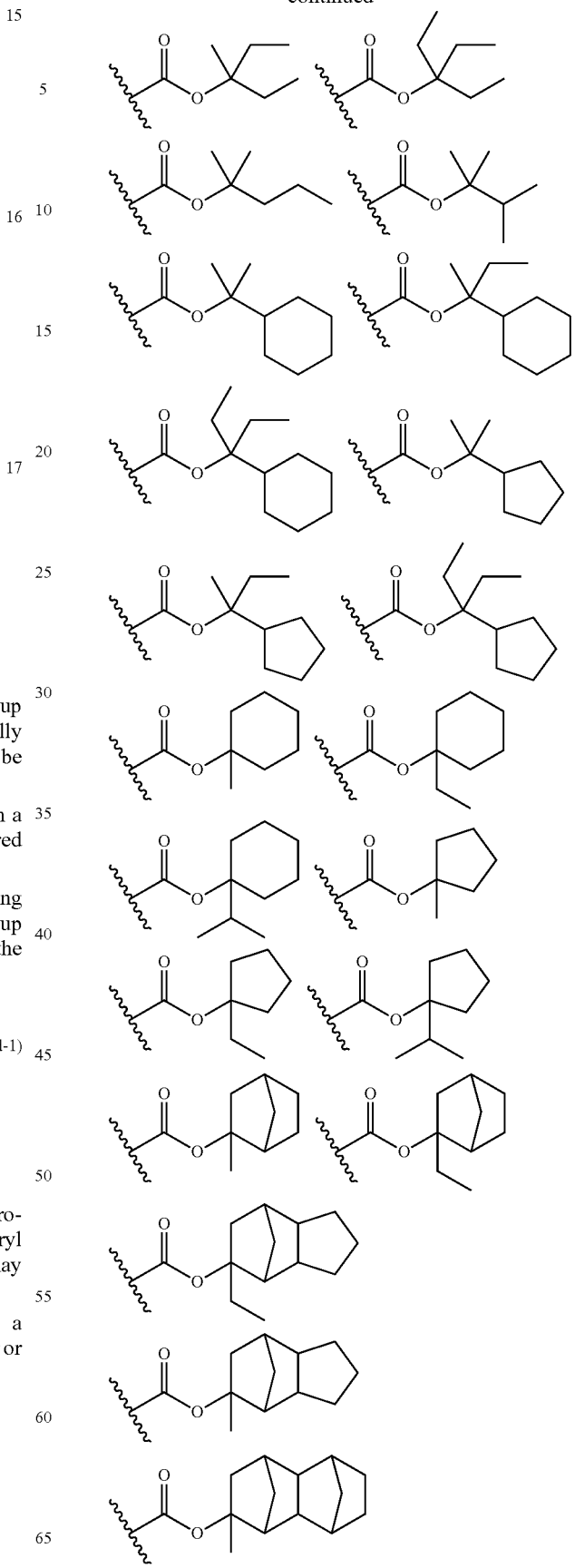

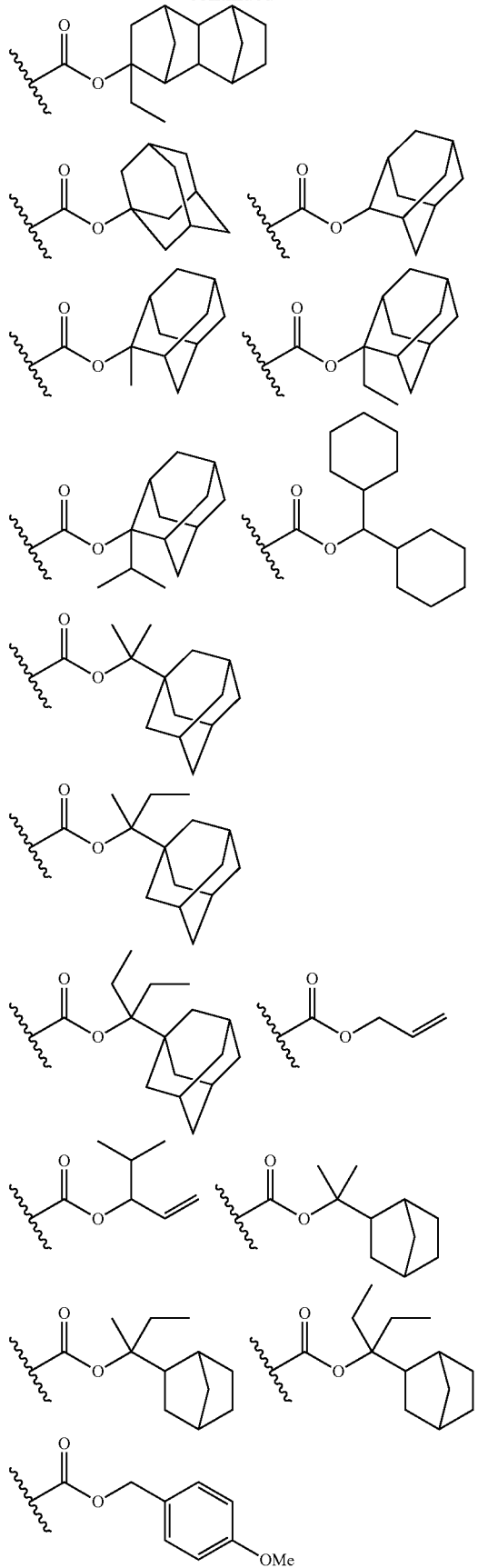
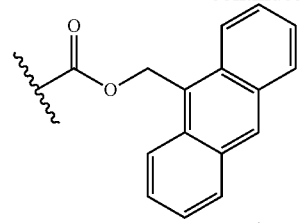
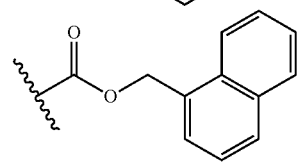
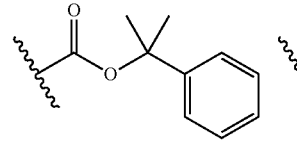
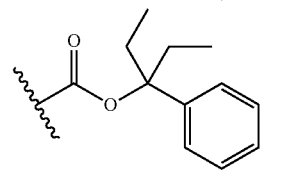
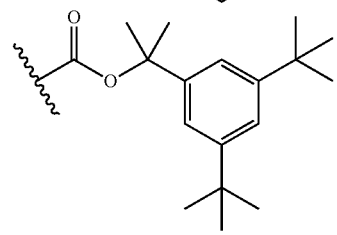

The component D may also be composed by arbitrarily combining the above-described basic compound and the structure represented by formula (d-1).

The component D is more preferably a compound having a structure represented by the following formula (A).

Incidentally, the component D may be a compound corresponding to the above-described basic compound as long as it is a low molecular compound having a group capable of leaving by the action of an acid.

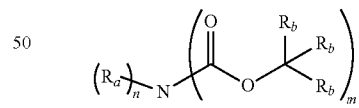

(A)

In formula (A), each Ra independently represents a hydrogen atom, an alkyl group, a cycloalkyl group, an aryl group or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine with each other to form an alicyclic hydrocarbon group, an aromatic hydrocarbon group, a heterocyclic hydrocarbon group or a derivative thereof.

n represents an integer of 0 to 2, m represents an integer of 1 to 3, and n+m=3.

In formula (A), each of the alkyl group, cycloalkyl group, aryl group and aralkyl group of Ra and Rb may be substitute by a functional group such as hydroxyl group, cyano group, amino group, pyrrolidino group, piperidino group, morpholino group and oxo group, an alkoxy group or a halogen atom.

Examples of the alkyl group, cycloalkyl group, aryl group and aralkyl group (each of these alkyl, cycloalkyl, aryl and aralkyl groups may be substituted by the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted by one or more in kind or number of cycloalkyl groups such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted by one or more in kind or number of linear or branched alkyl groups such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted by one or more in kind or number of linear or branched alkyl groups such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted by one or more in kind or number of a linear or branched alkyl group and an aromatic compound-derived group; a group where the group derived from a linear or branched alkane or the group derived from a cycloalkane is substituted by one or more in kind or number of aromatic compound-derived groups such as phenyl group, naphthyl group and anthracenyl group; and a group where the substituent above is substituted by a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted by one or more in kind or number of a linear or branched alkane-derived group, a cycloalkane-derived group, an aromatic compound-derived group, a heterocyclic compound-derived group and a functional group such as hydroxyl group, cyano group, amino group, pyrrolidino group, piperidino group, morpholino group and oxo group.

Specific examples particularly preferred in the present invention include N-tert-butoxycarbonyldi-n-octylamine, N-tert-butoxycarbonyldi-n-nonylamine, N-tert-butoxycarbonyldi-n-decylamine, N-tert-butoxycarbonyldicyclohexylamine, N-tert-butoxycarbonyl-1-adamantylamine, N-tert-butoxycarbonyl-2-adamantylamine, N-tert-butoxycarbonyl-N-methyl-1-adamantylamine, (S)-(−)-1-(tert-butoxycarbonyl)-2-pyrrolidinemethanol, (R)-(+)-1-(tert-butoxycarbonyl)-2-pyrrolidinemethanol, N-tert-butoxycarbonyl-4-hydroxypiperidine, N-tert-butoxycarbonylpyrrolidine, N-tert-butoxycarbonylmorpholine, N-tert-butoxycarbonylpiperazine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N',N'-tetra-tert-butoxycarbonylhexamethylenediamine, N,N-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole and N-tert-butoxycarbonyl-2-phenylbenzimidazole.

Specific examples of the component D particularly preferred in the present invention are set forth below, but the present invention is not limited thereto.

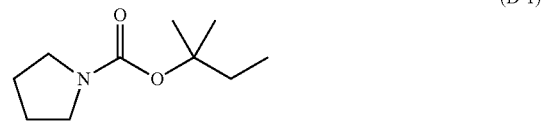
(D-1)

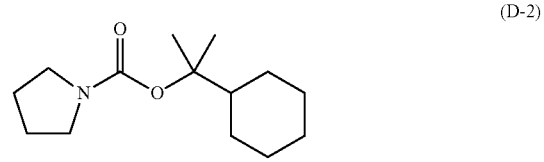
(D-2)

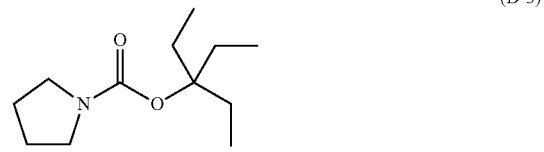
(D-3)

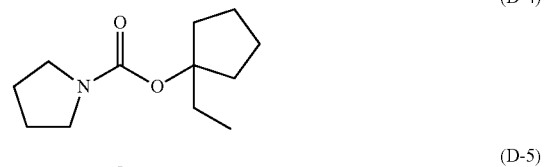
(D-4)

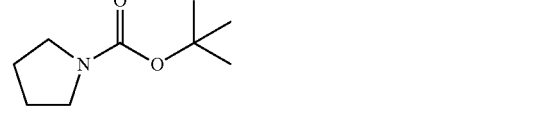
(D-5)

-continued
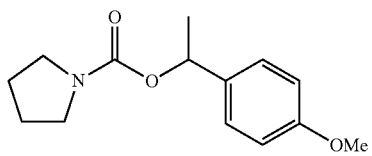 (D-6)
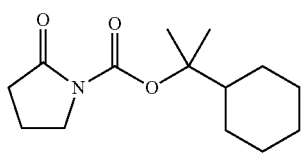 (D-7)
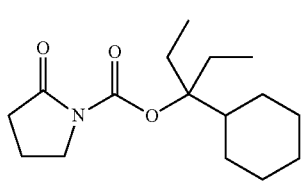 (D-8)
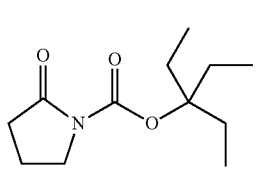 (D-9)
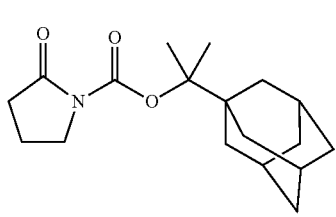 (D-10)
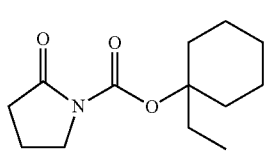 (D-11)
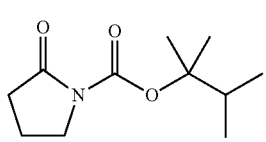 (D-12)
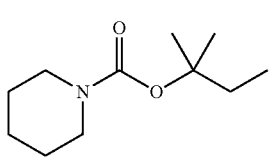 (D-13)
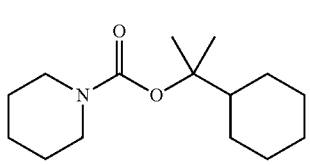 (D-14)
-continued
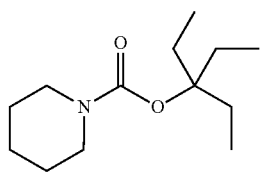 (D-15)
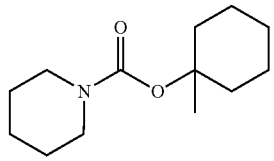 (D-16)
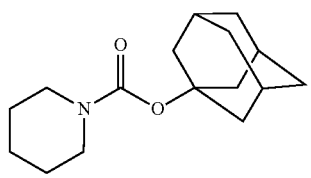 (D-17)
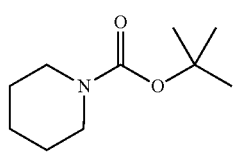 (D-18)
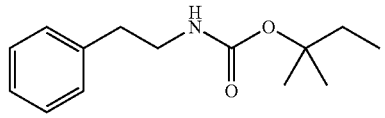 (D-19)
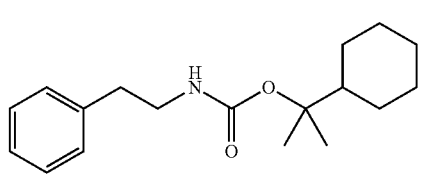 (D-20)
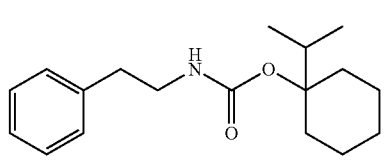 (D-21)
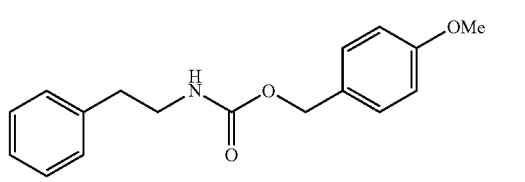 (D-22)
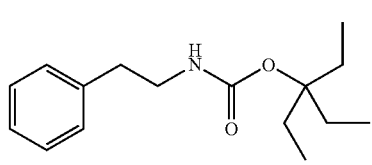 (D-23)

(D-24) 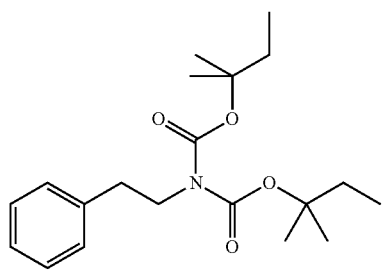
(D-25) 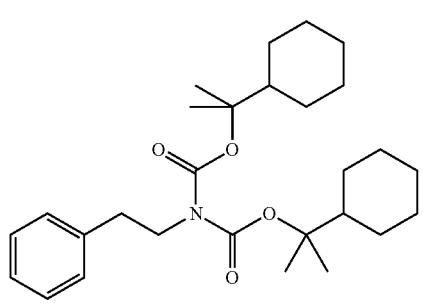
(D-26) 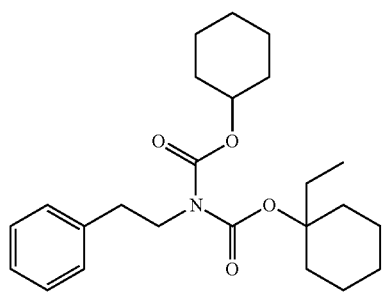
(D-27) 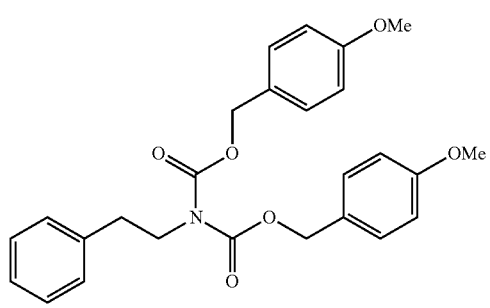
(D-28) 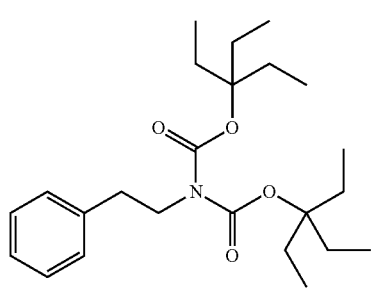
(D-29) 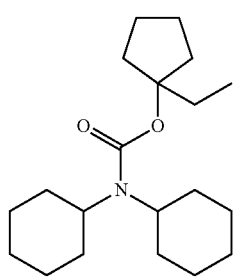
(D-30) 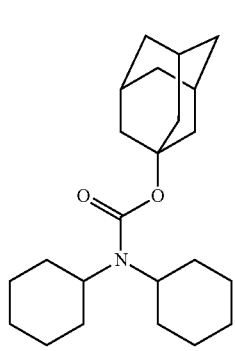
(D-31) 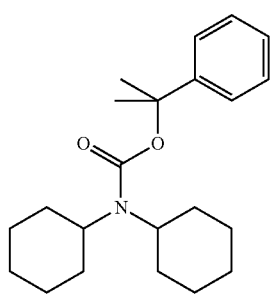
(D-32) 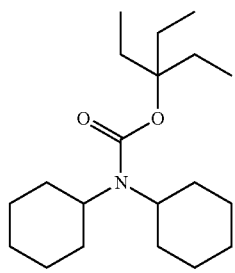
(D-33) 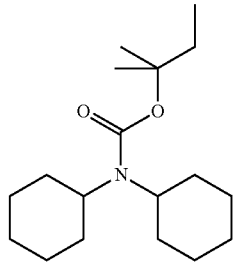

(D-34)
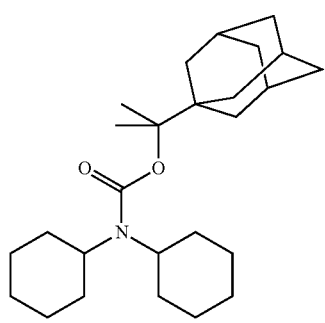
(D-35)
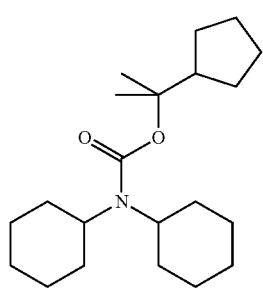
(D-36)
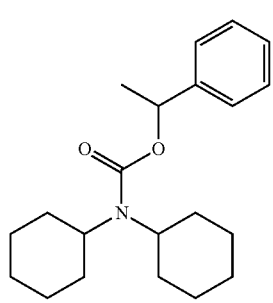
(D-37)
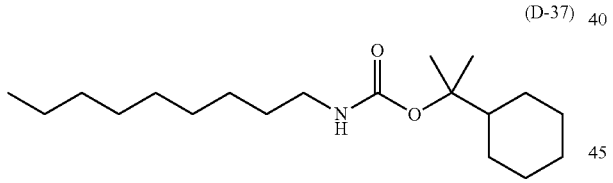
(D-38)
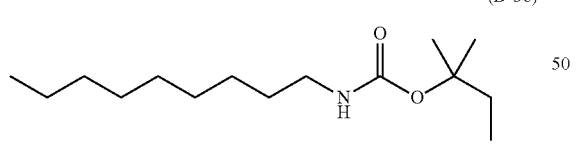
(D-39)
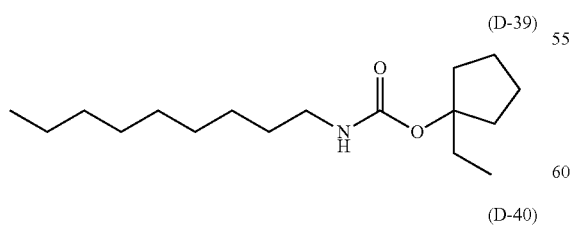
(D-40)
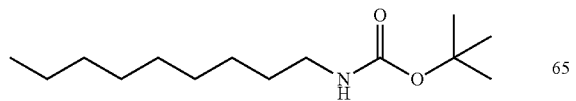
(D-41)
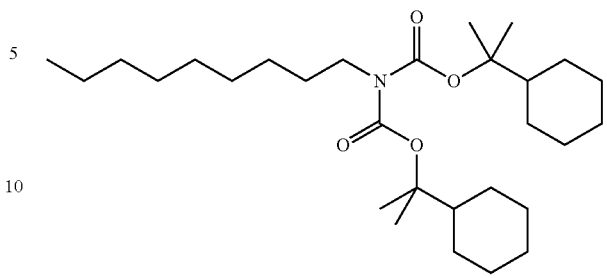
(D-42)
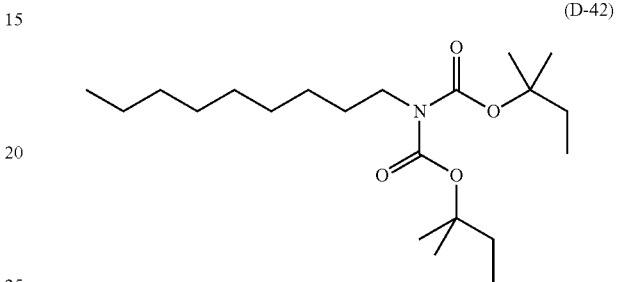
(D-43)
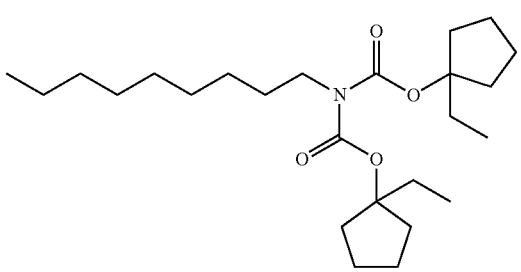
(D-44)
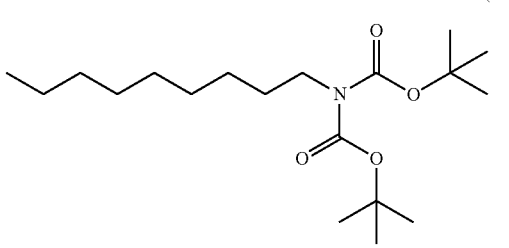
(D-45)
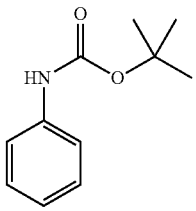
(D-46)
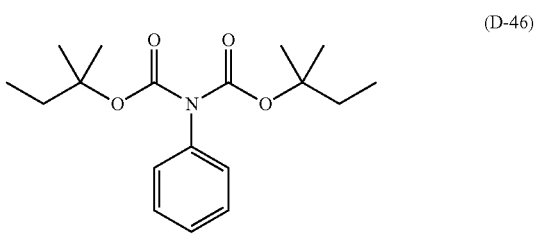

(D-47)
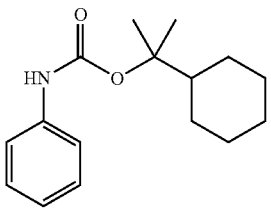

(D-48)
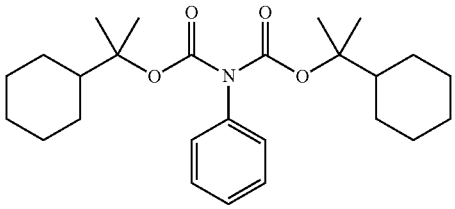

(D-49)
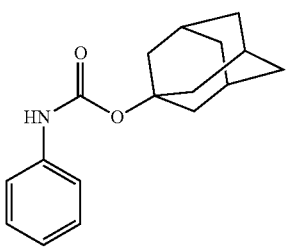

(D-50)
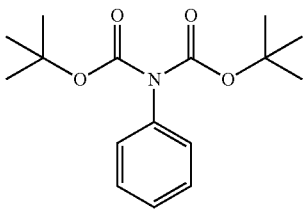

(D-51)
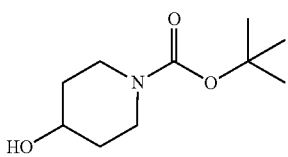

(D-52)
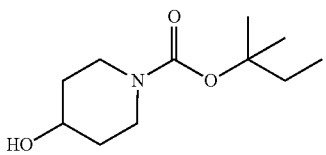

(D-53)
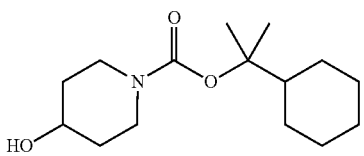

(D-54)
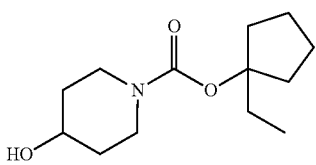

(D-55)
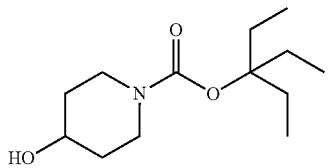

The compound represented by formula (A) can be easily synthesized from a commercially available amine by a method described, for example, Protective Groups in Organic Synthesis, 4th edition. A most general method is a method of causing a dicarbonic acid ester or a haloformic acid ester to act on a commercially available amine to obtain the compound. In the following formulae, X represents a halogen atom, and Ra and Rb have the same meanings as those in formula (A) above.

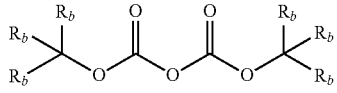

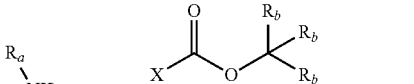

In the present invention, one kind of (D) a low molecular compound having a group capable of leaving by the action of an acid may be used alone, or two or more kinds of the compounds may be mixed and used.

In the present invention, the amount used of the (D) low molecular compound having a group capable of leaving by the action of an acid is usually from 0.001 to 20 mass %, preferably from 0.001 to 10 mass %, more preferably from 0.01 to 5 mass %, based on the entire solid compound of the composition combined with the basic compound described later.

The ratio between the acid generator and the (D) low molecular compound having a group capable of leaving by the action of an acid, which are used in the composition, is preferably acid generator/[(D) low molecular compound having a group capable of leaving by the action of an acid+later-described basic compound] (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/[(D) low molecular compound having a group capable of leaving by the action of an acid+later-described basic compound] (by mol) is more preferably from 5.0 to 200, still more preferably from 7.0 to 150.

[7] Surfactant

In the actinic ray-sensitive or radiation-sensitive resin composition of the present invention, a surfactant may or may not be added. In the case of adding a surfactant, the composition preferably contains any one of fluorine-containing and/or silicon-containing surfactants (a fluorine-containing surfactant, a silicon-containing surfactant and a surfactant containing both a fluorine atom and a silicon atom), or two or more kinds thereof.

By virtue of incorporating the above-described surfactant into the actinic ray-sensitive or radiation-sensitive resin composition of the present invention, a resist pattern with good performance in terms of sensitivity, resolution and adherence as well as less development defects can be provided when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group derived from a fluoro-aliphatic compound that is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of such surfactants may be used alone, or some of these may be used in combination.

The amount of the surfactant used is preferably from 0.0001 to 2 mass %, more preferably from 0.001 to 1 mass %, based on the entire amount of solid contents in the actinic ray-sensitive or radiation-sensitive resin composition (excluding the solvent).

[8] Onium Carboxylate

The actinic ray-sensitive or radiation-sensitive resin composition of the present invention may contain an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably the carboxylate anion above with the alkyl group being partially or entirely fluorine-substituted. The alkyl chain may contain an oxygen atom. Thanks to such a construction, the transparency to light at 220 nm or less is ensured, the sensitivity and resolution are enhanced, and the iso/dense bias and exposure margin are improved.

Examples of the fluorine-substituted carboxylate anion include fluoroacetate, difluoroacetate, trifluoroacetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

These onium carboxylates can be synthesized by reacting a sulfonium, iodonium or ammonium hydroxide and a carboxylic acid with silver oxide in an appropriate solvent.

The content of the onium carboxylate in the composition is generally from 0.1 to 20 mass %, preferably from 0.5 to 10 mass %, more preferably from 1 to 7 mass %, based on the entire solid content of the composition.

[9] Dissolution Inhibiting Compound Having a Molecular Weight of 3,000 or Less and being Capable of Decomposing by the Action of an Acid to Increase the Solubility in an Alkali Developer The actinic ray-sensitive or radiation-sensitive resin composition of the present invention may contain a dissolution inhibiting compound having a molecular weight of 3,000 or less and being capable of decomposing by the action of an acid to increase the solubility in an alkali developer (hereinafter, sometimes referred to as a "dissolution inhibiting compound"). The dissolution inhibiting compound is preferably an alicyclic or aliphatic compound containing an acid-decomposable group, such as acid-decomposable group-containing cholic acid derivative described in Proceeding of SPIE, 2724, 355 (1996), so as not to reduce the transparency to light at 220 nm or less. Examples of the acid-decomposable group and alicyclic structure are the same as those described above with respect to the resin of the component (A).

In the case where the actinic ray-sensitive or radiation-sensitive resin composition of the present invention is exposed to a KrF excimer laser or irradiated with an electron beam, the compound preferably contains a structure where the phenolic hydroxyl group of a phenol compound is substituted by an acid-decomposable group. The phenol compound is preferably a compound containing from 1 to 9 phenol skeletons, more preferably from 2 to 6 phenol skeletons.

The molecular weight of the dissolution inhibiting compound for use in the present invention is 3,000 or less, preferably from 300 to 3,000, more preferably from 500 to 2,500.

The amount of the dissolution inhibiting compound added is preferably from 2 to 50 mass %, more preferably from 3 to 30 mass %, yet still more preferably from 5 to 10 mass %, based on the entire solid content of the actinic ray-sensitive or radiation-sensitive resin composition.

Specific examples of the dissolution inhibiting compound are set forth below, but the present invention is not limited thereto.

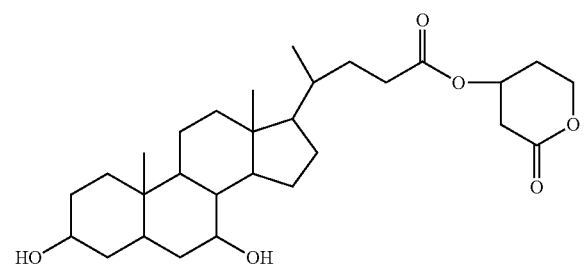

-continued

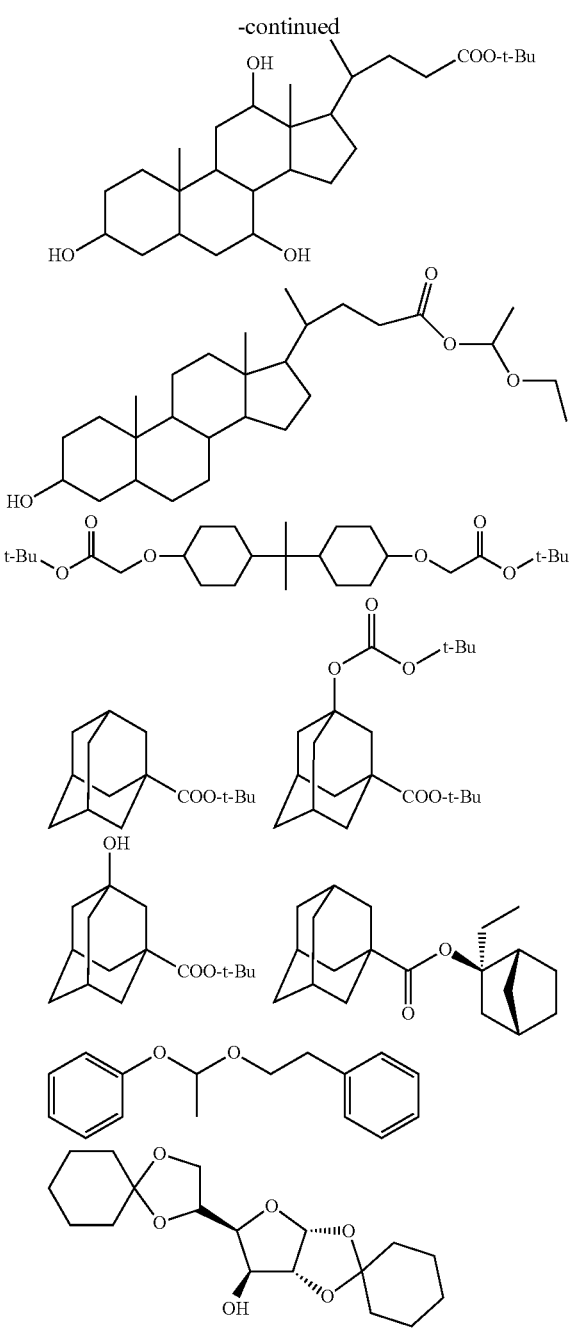

[10] Other Additives

The actinic ray-sensitive or radiation-sensitive resin composition of the present invention may further contain a dye, a plasticizer, a photosensitizer, a light absorbent, a compound for accelerating dissolution in a developer (for example, a phenol compound having a molecular weight of 1,000 or less, or a carboxyl group-containing alicyclic or aliphatic compound), and the like, if desired.

The phenol compound having a molecular weight of 1,000 or less can be easily synthesized by one skilled in the art by referring to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

[11] Pattern Forming Method

The actinic ray-sensitive or radiation-sensitive resin composition of the present invention is preferably used in a film thickness of 30 to 250 nm, more preferably from 30 to 200 nm, from the standpoint of enhancing the resolution. Such a film thickness can be obtained by setting the solid content concentration in the actinic ray-sensitive or radiation-sensitive resin composition to an appropriate range, thereby imparting an appropriate viscosity and enhancing the coatability and film-forming property.

The entire solid content concentration in the actinic ray-sensitive or radiation-sensitive resin composition is generally from 1 to 10 mass %, preferably from 1 to 8.0 mass %, more preferably from 1.0 to 6.0 mass %.

The actinic ray-sensitive or radiation-sensitive resin composition of the present invention is used by dissolving the components above in a predetermined organic solvent, preferably in the above-described mixed solvent, filtering the solution, and applying it on a predetermined support as follows. The filter used for filtering is preferably a polytetrafluoroethylene-, polyethylene- or nylon-made filter having a pore size of 0.1 µm or less, more preferably 0.05 µm or less, still more preferably 0.03 µm or less.

For example, the actinic ray-sensitive or radiation-sensitive resin composition is applied on such a substrate (e.g., silicon/silicon dioxide-coated substrate) as used in the production of a precision integrated circuit device, by an appropriate coating method such as spinner or coater and dried to form a film.

The film is irradiated with an actinic ray or radiation through a predetermined mask, preferably baked (heated) and then subjected to development and rinsing, whereby a good pattern can be obtained.

Examples of the actinic ray or radiation include infrared light, visible light, ultraviolet light, far ultraviolet light, extreme-ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser (248 nm), ArF excimer laser (193 nm), $F_2$ excimer laser (157 nm), X-ray, electron beam and EUV (13 nm), with ArF excimer laser, $F_2$ excimer laser and EUV (13 nm) being preferred.

Incidentally, in the present invention, an electromagnetic wave such as ultraviolet light and X-ray is included in the radiation.

Before forming the film, an antireflection film may be previously provided by coating on the substrate.

The antireflection film which can be used may be either an inorganic film type such as titanium, titanium dioxide, titanium nitride, chromium oxide, carbon and amorphous silicon, or an organic film type composed of a light absorber and a polymer material. Also, a commercially available organic antireflection film such as DUV30 Series and DUV-40 Series produced by Brewer Science, Inc., and AR-2, AR-3 and AR-5 produced by Shipley Co., Ltd. may be used as the organic antireflection film.

The actinic ray-sensitive or radiation-sensitive resin composition of the present invention may also be suitably used for pattern formation by immersion exposure where exposure is performed by filling a liquid (immersion medium) having a refractive index higher than that of air between the actinic ray-sensitive or radiation-sensitive film and a lens at the irradiation with an actinic ray or radiation. By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid being transparent to light at the exposure wavelength and having as small a temperature coefficient of refractive index as possible so as to minimize the distortion of an optical image projected on the actinic ray-sensitive or radiation-sensitive film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the actinic ray-sensitive or radiation-sensitive film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the actinic ray-sensitive or radiation-sensitive film. Therefore, the water used is preferably distilled water. Pure water obtained by further filtering the distilled water through an ion exchange filter or the like may also be used.

The electrical resistance of water as the immersion liquid is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or deuterium water ($D_2O$) may be used in place of water.

In the development step, an alkali developer is used as follows. The alkali developer which can be used for the actinic ray-sensitive or radiation-sensitive resin composition is an alkaline aqueous solution of, for example, inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

After the development or rinsing, a treatment of removing the developer or rinsing solution adhering on the pattern by a supercritical fluid may be performed.

EXAMPLES

The present invention is described in greater detail below by referring to Examples, but the present invention is not limited to these Examples.

Monomers corresponding to repeating units used for the synthesis of the resin (A) used in Examples are shown below.

(LM-1)

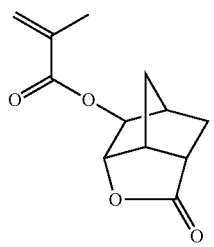

(LM-2)

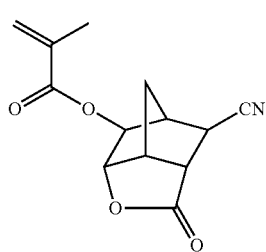

(LM-3)

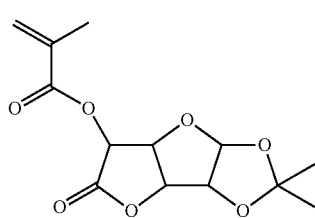

(LM-4)

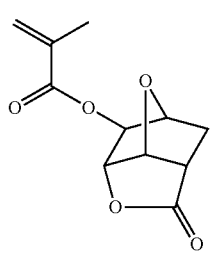

-continued (LM-5)

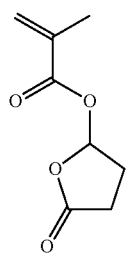

(LM-6)

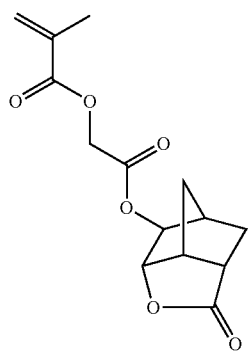

(LM-7)

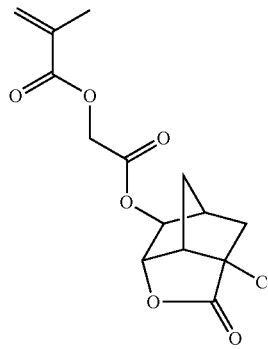

(LM-8)

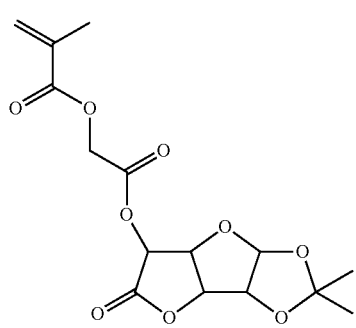

(LM-9)

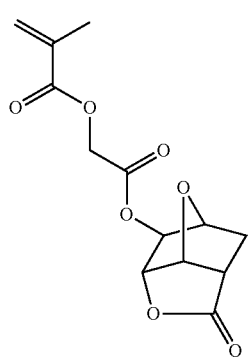

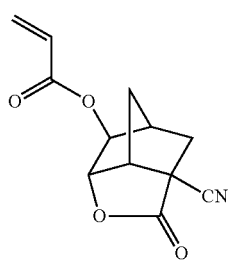
(LM-10)
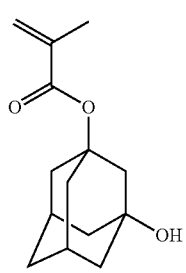
(IM-1)
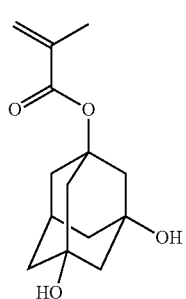
(IM-2)
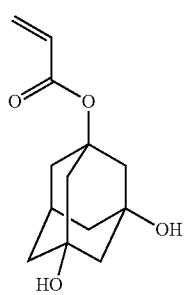
(IM-3)
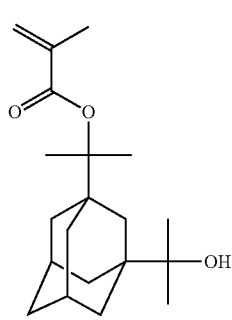
(PM-1)
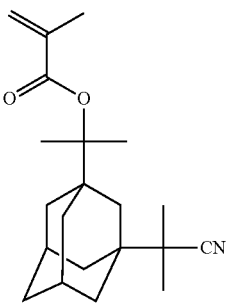
(PM-2)
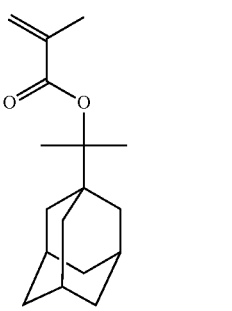
(PM-3)
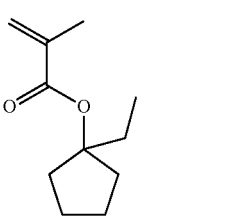
(PM-4)
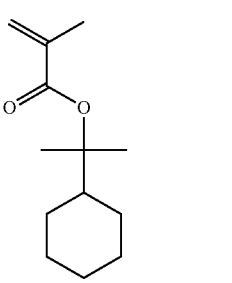
(PM-5)
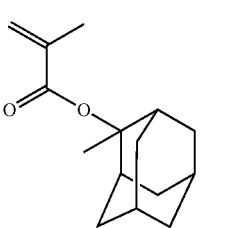
(PM-6)
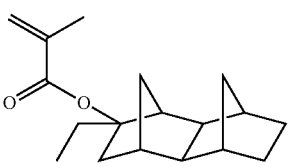
(PM-7)

(PM-8)

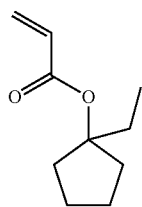

(PM-9)

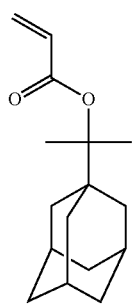

(AM-1)

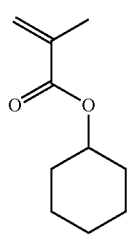

(AM-2)

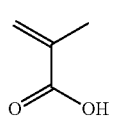

(AM-3)

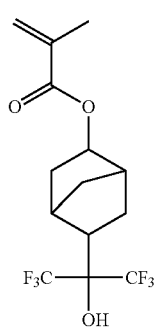

(AM-4)

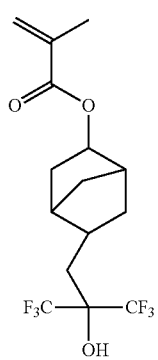

(AM-5)

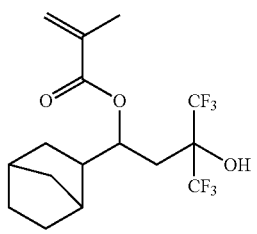

Synthesis Example 1

Synthesis of Resin (A-1)

In a nitrogen atmosphere, 8.8 g of cyclohexanone was charged into a three-neck flask and heated to 80° C. Thereto, a solution prepared by dissolving 8.5 g of (LM-1), 2.2 g of (IM-1), 9.0 g of (PM-4) and polymerization initiator V-60 (produced by Wako Pure Chemical Industries, Ltd.) in a ratio of 13 mol % based on the monomers, in 79 g of cyclohexanone was added dropwise over 6 hours. After the completion of dropwise addition, the reaction was further allowed to proceed at 80° C. for 2 hours. The resulting reaction solution was left standing to cool and then added dropwise to a mixed solution of 900 ml of methanol/100 ml of water over 20 minutes, and the powder precipitated was collected by filtration and dried, as a result, 18 g of Resin (A-1) was obtained. The compositional ratio of the resin obtained was 40/10/50, the weight average molecular weight was 8,200 in terms of standard polystyrene, and the polydispersity (Mw/Mn) was 1.53.

Resins (A-2) to (A-22) were synthesized by the same operation as in Synthesis Example 1.

Structures thereof are shown below.

(A-1)

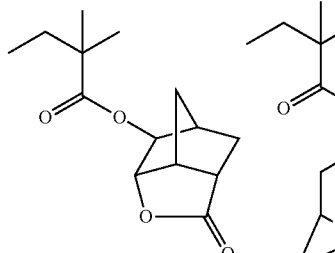
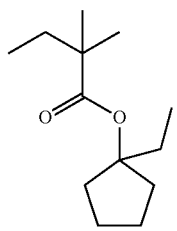

(A-2)
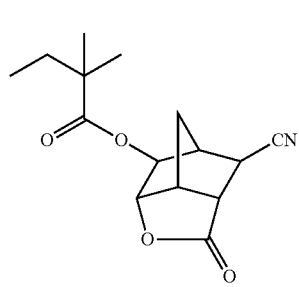
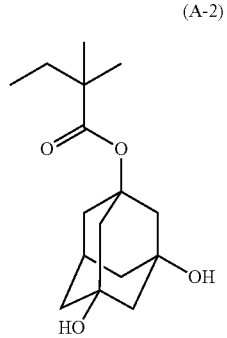
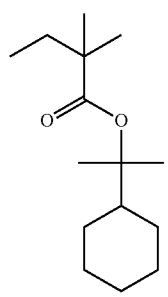
(A-3)
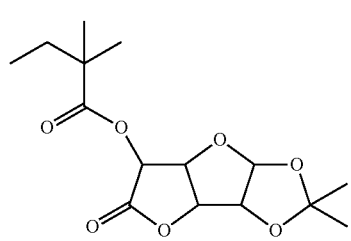
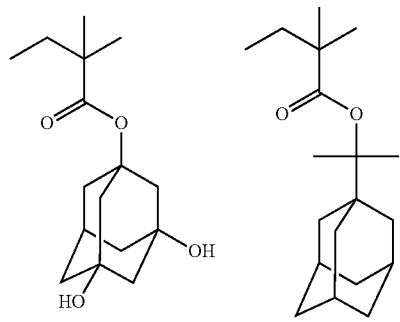
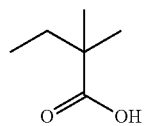
(A-4)
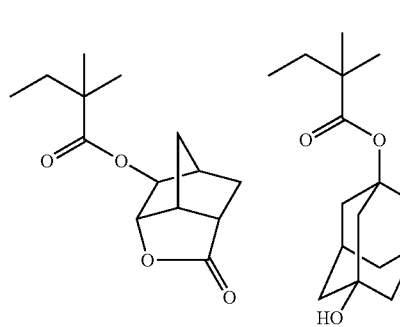
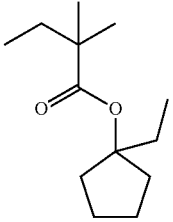
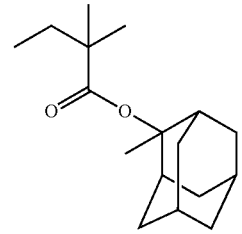
(A-5)
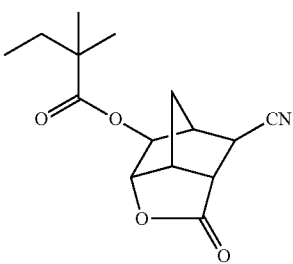
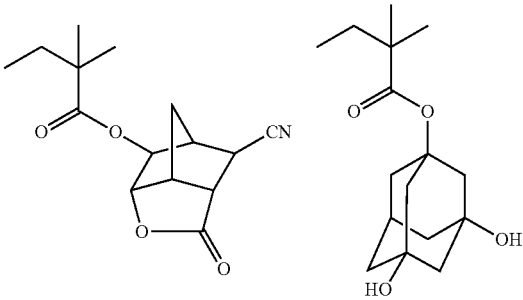
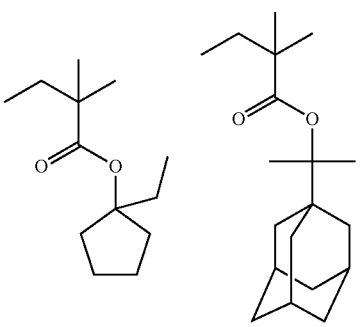
(A-6)
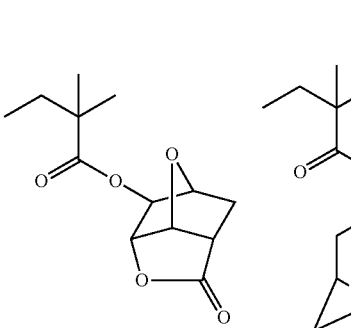
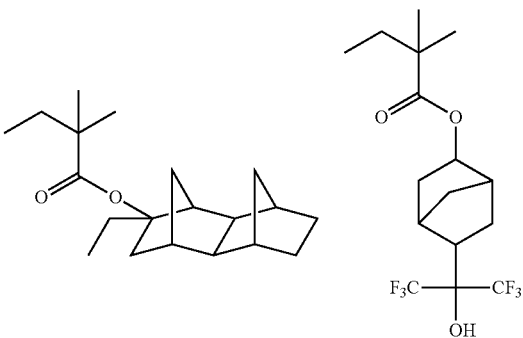

(A-7)
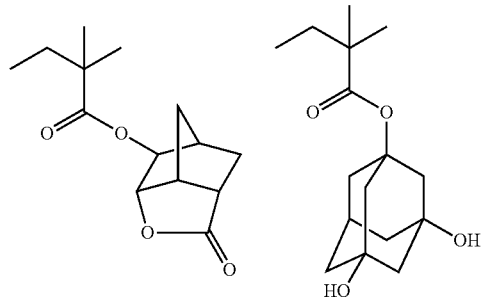
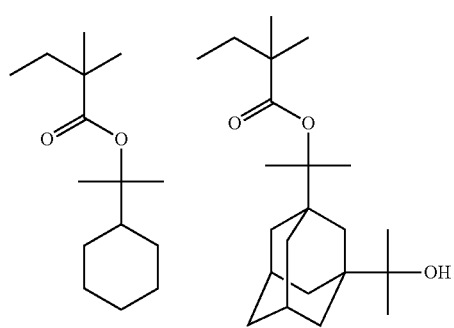
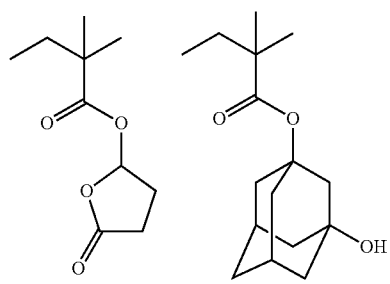
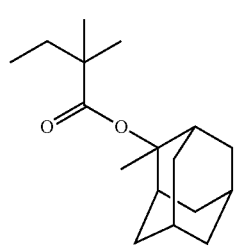
(A-10)
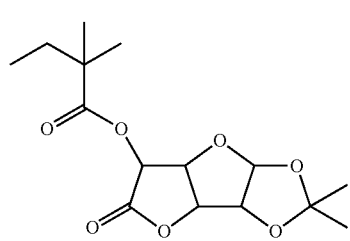
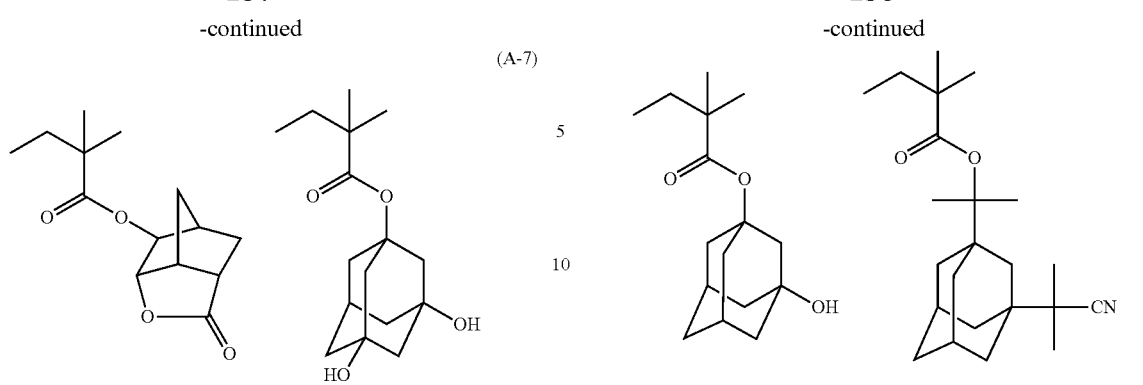
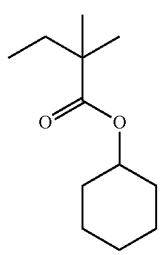
(A-9)
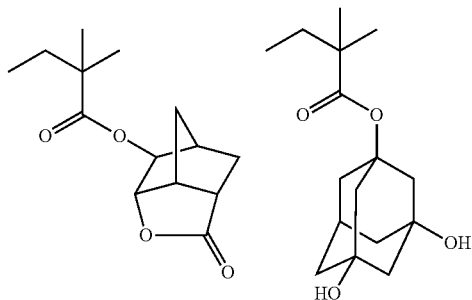
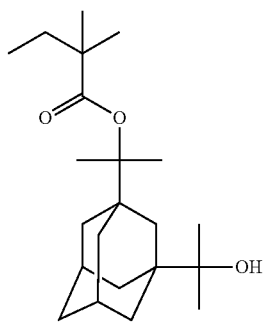
(A-11)
(A-12)
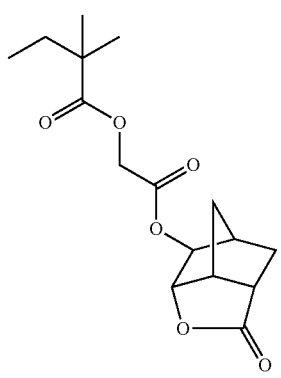

-continued
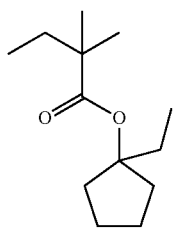
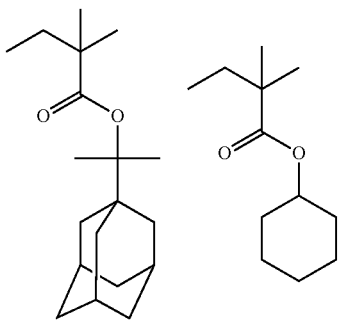
(A-13)
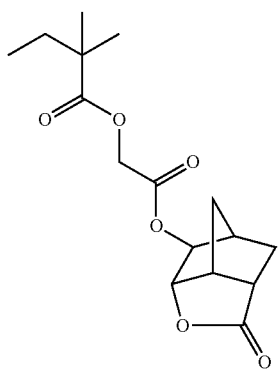
(A-15)
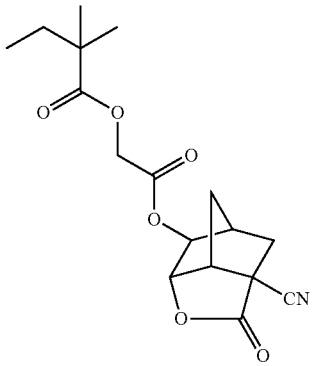
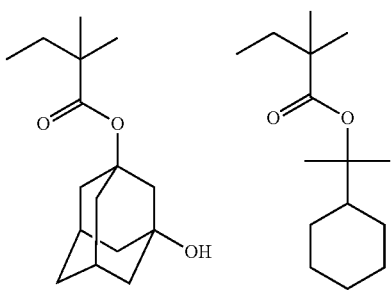
(A-14)
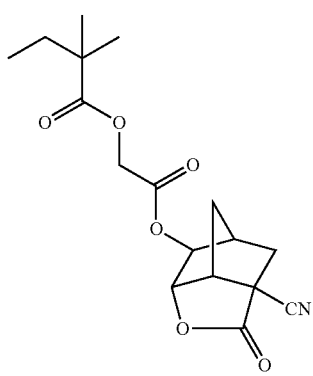
(A-16)
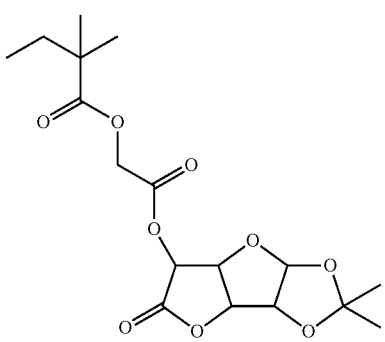
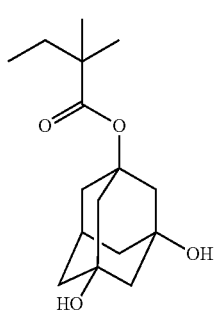
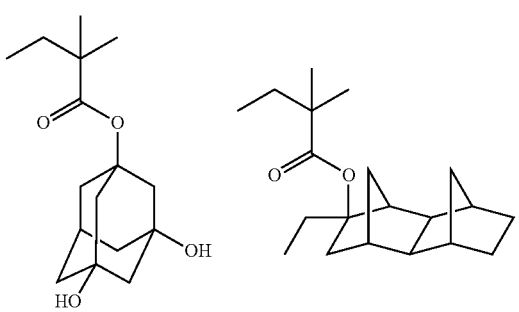

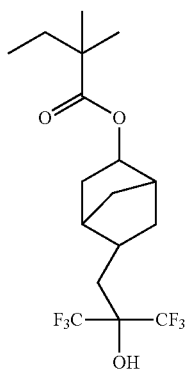
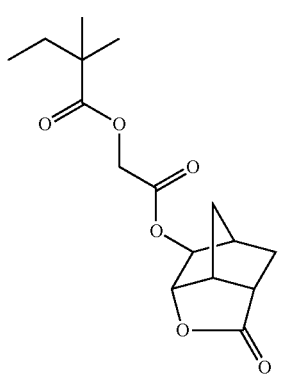
(A-17)
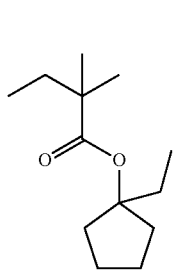
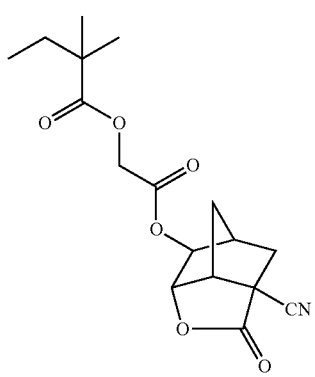
(A-18)
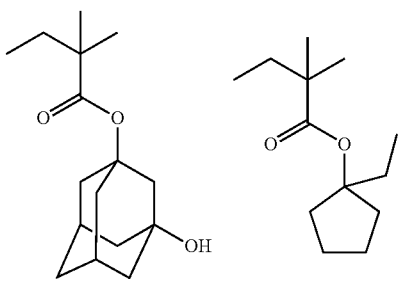
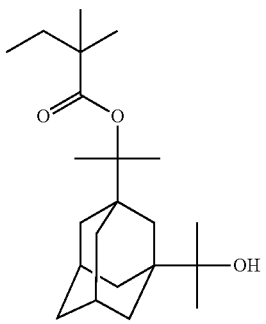
(A-19)
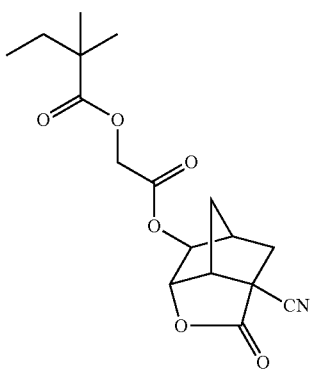

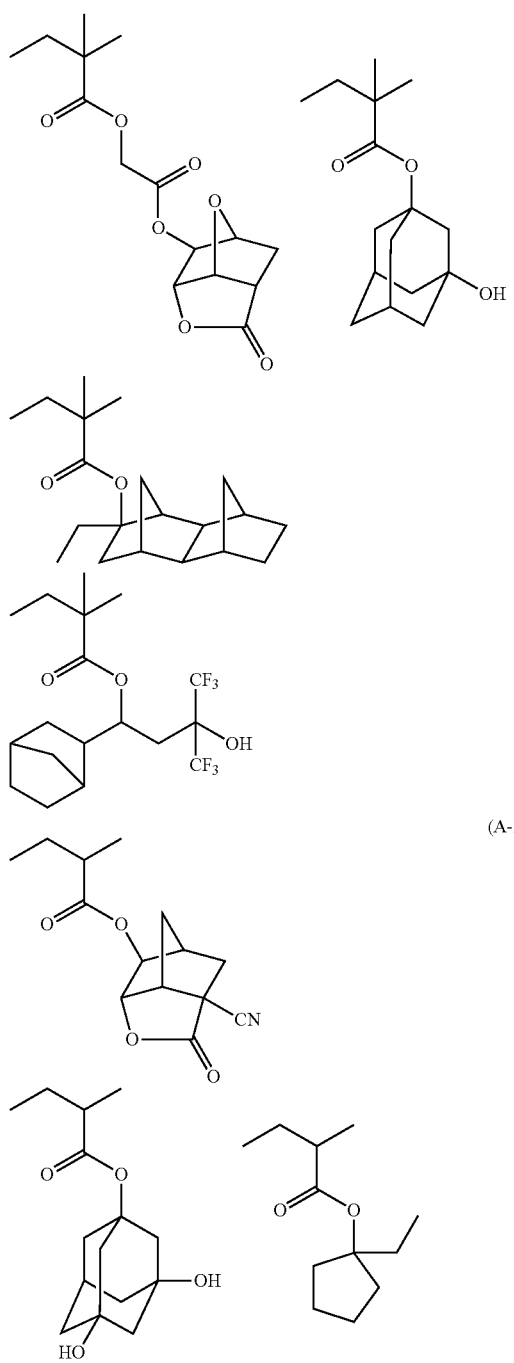

(A-20)

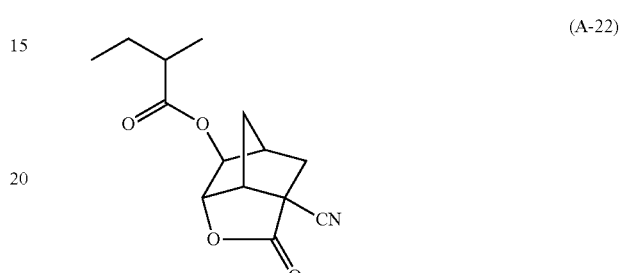

(A-21)

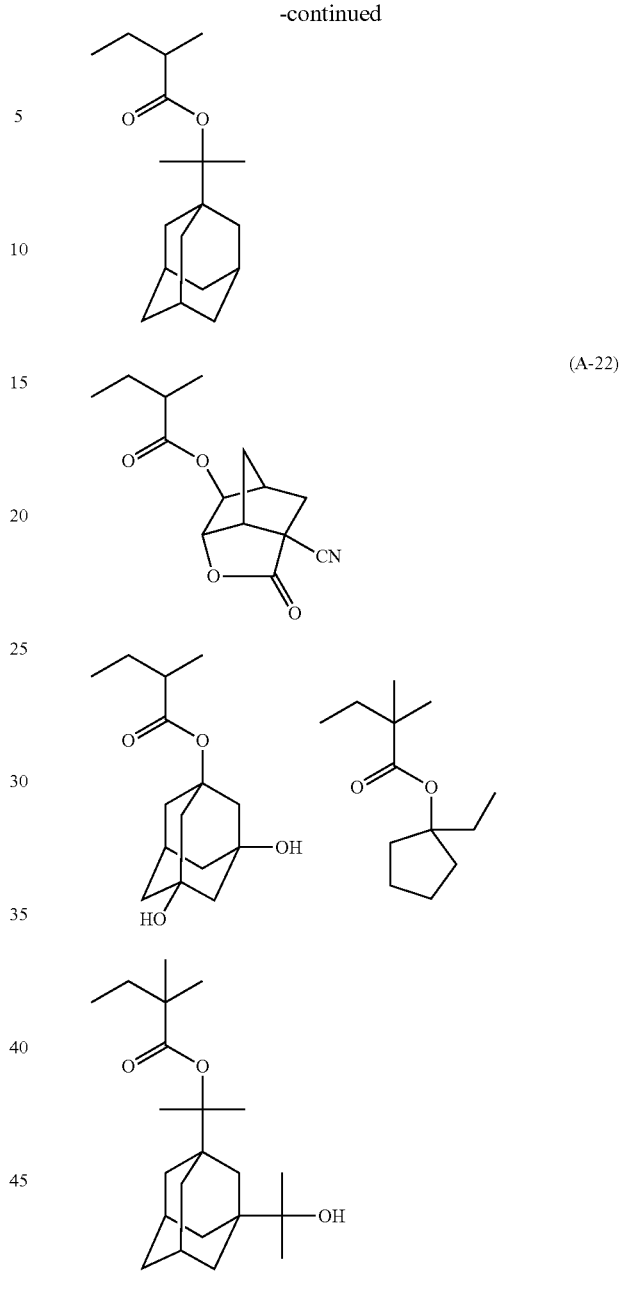

(A-22)

With respect to Resins (A-1) to (A-22), the monomers used for the synthesis, the monomer ratio, the weight average molecular weight and the polydispersity are shown in (Table 1) below.

TABLE 1

| Synthesis Example | LM | IM | PM | | AM | Compositional Ratio | Molecular Weight | Polydispersity |
|---|---|---|---|---|---|---|---|---|
| A-1 | LM-1 | IM-1 | PM-4 | — | — | 40/10/50 | 8200 | 1.53 |
| A-2 | LM-2 | IM-2 | PM-5 | — | — | 41/10/49 | 7500 | 1.54 |
| A-3 | LM-3 | IM-2 | PM-3 | — | AM-2 | 40/19/32/9 | 6400 | 1.52 |
| A-4 | LM-1 | IM-2 | PM-4 | PM-6 | — | 42/10/29/19 | 8000 | 1.49 |
| A-5 | LM-2 | IM-2 | PM-4 | PM-3 | — | 40/10/11/39 | 7200 | 1.56 |
| A-6 | LM-4 | IM-1 | PM-7 | — | AM-3 | 39/11/42/8 | 8500 | 1.51 |
| A-7 | LM-1 | IM-2 | PM-5 | PM-1 | — | 51/9/22/18 | 7300 | 1.53 |
| A-8 | LM-2 | IM-1 | PM-4 | PM-1 | — | 41/11/28/20 | 6700 | 1.60 |

TABLE 1-continued

| Synthesis Example | LM | IM | PM | AM | Compositional Ratio | Molecular Weight | Polydispersity |
|---|---|---|---|---|---|---|---|
| A-9 | LM-5 | IM-1 | PM-6 | — | — 41/19/40 | 8300 | 1.52 |
| A-10 | LM-3 | IM-1 | PM-2 | — | AM-1 38/11/41/10 | 7200 | 1.55 |
| A-11 | LM-1 | IM-2 | PM-1 | — | — 48/8/44 | 7000 | 1.53 |
| A-12 | LM-6 | IM-1 | PM-4 | — | — 50/19/31 | 7700 | 1.56 |
| A-13 | LM-6 | IM-2 | PM-6 | — | — 43/18/39 | 8100 | 1.57 |
| A-14 | LM-7 | IM-2 | PM-3 | — | AM-1 37/11/42/10 | 7400 | 1.54 |
| A-15 | LM-7 | IM-1 | PM-5 | — | — 43/11/46 | 7600 | 1.53 |
| A-16 | LM-8 | IM-2 | PM-7 | — | AM-4 49/10/32/9 | 6900 | 1.57 |
| A-17 | LM-6 | IM-1 | PM-4 | PM-2 | — 40/11/40/9 | 7200 | 1.56 |
| A-18 | LM-7 | IM-1 | PM-4 | PM-1 | — 41/9/29/21 | 7500 | 1.52 |
| A-19 | LM-7 | IM-2 | PM-4 | PM-3 | — 39/10/10/41 | 6800 | 1.54 |
| A-20 | LM-9 | IM-1 | PM-7 | — | AM-5 31/11/48/10 | 7300 | 1.56 |
| A-21 | LM-10 | IM-3 | PM-8 | PM-9 | — 40/10/20/30 | 7000 | 1.54 |
| A-22 | LM-10 | IM-3 | PM-4 | PM-1 | — 35/10/30/25 | 8200 | 1.51 |

[Preparation of Actinic Ray-Sensitive or Radiation-Sensitive Resin Composition]

The components shown in Tables 2, 3 and 6 below were dissolved in a solvent to prepare a solution having a solid content concentration of 5 mass %, and the obtained solution was filtered through a polyethylene filter having a pore size of 0.03 μm to prepare an actinic ray-sensitive or radiation-sensitive resin composition. The actinic ray-sensitive or radiation-sensitive resin compositions prepared were evaluated by the following methods, and the results are shown in the Tables.

[Image Performance Test]

An organic antireflection film, ARC29A (produced by Nissan Chemical Industries, Ltd.), was applied on a silicon wafer and baked at 205° C. for 60 seconds to form an antireflection film having a film thickness of 86 nm, and the positive resist composition prepared above was applied thereon and baked at 100° C. for 60 seconds to form a resist film having a film thickness of 100 nm. The obtained wafer was exposed through a 6% halftone mask having a 1:1 line-and-space pattern of 75 nm by using an ArF excimer laser immersion scanner (XT1700i, manufactured by ASML, NA: 1.20, C-Quad, outer sigma: 0.981, inner sigma: 0.895, XY deflection). As for the immersion liquid, ultrapure water was used. Thereafter, the wafer was heated at 100° C. for 60 seconds, developed with an aqueous tetramethylammonium hydroxide solution (2.38 mass %) for 30 seconds, rinsed with pure water and spin-dried to obtain a resist pattern.

With respect to the compositions of Examples 1 to 20 and Comparative Examples 1 to 4 shown in Table 2, the patterning by immersion exposure and the evaluation were performed as described above, and the results are shown in Table 4.

With respect to the compositions of Examples 21 and 22 and Comparative Example 5 shown in Table 3, the positive resist composition did not contain a hydrophobic resin but after foaming a resist film, a topcoat protective film containing a hydrophobic resin was formed as the overlayer of the resist film, and the evaluation was performed in the same manner as above. The results are shown in Table 5.

The topcoat protective film was formed by the following operation after the formation of the photosensitive film.
<Topcoat Forming Method>

The hydrophobic resin shown in Table 3 was dissolved in a solvent, and the resulting solution was applied on the photosensitive film by a spin coater. The wafer was heated at 115° C. for 60 seconds to form a 0.05 μm-thick topcoat layer. At this time, the topcoat was observed for uneven coating and confirmed to be uniformly applied without coating unevenness.

The abbreviations of solvents are as follows.
SL-6: 2-Ethylbutanol
SL-7: Perfluorobutyltetrahydrofuran

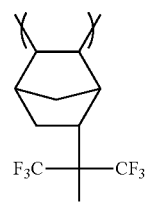

(HR-67)

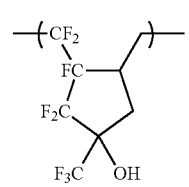

(HR-68)

(HR-67)

Weight average molecular weight: 8,000

Polydispersity: 1.4

(HR-68)

Weight Average Molecular Weight: 6,900

Polydispersity: 2.5

With respect to the compositions of Examples 23 to 26 and Comparative Examples 6 and 7 shown in Table 6, the evaluation was performed in the same manner as in the patterning by immersion exposure except for forming a 1:1 line-and-space pattern of 75 nm by dry exposure (ArF excimer laser scanner, NA: 0.75) without using an immersion liquid, and the results are shown in Table 7.

[Evaluation Method of Line Edge Roughness (LER)]

In the measurement of line edge roughness, the 1:1 line-and-space pattern of 75 nm was observed using a critical dimension scanning electron microscope (SEM) and with respect to the range of 5 μm in the longitudinal edge of the line pattern, the distance from the reference line where the edge should be present was measured at 50 points by a critical dimension SEM. The standard deviation was determined and 36 (nm) was computed. A smaller value indicates higher performance.

[Pattern Tapering]

The pattern profile (tapering) of a resist pattern of 75 nm in line width was observed using a scanning electron microscope (S-4800, manufactured by Hitachi Ltd.), and the sample was rated A when tapering was not generated at all, rated B when tapering was scarcely generated, rated C when tapering was observed, and rated D when tapering was severely generated.

[Transmittance]

A resist solution prepared by the method above was spin-coated on a quartz glass substrate and pre-baked at 100° C. to form a resist film having a film thickness of 100 nm, and the transmittance of the film was calculated from its absorbance at a wavelength of 193 nm. For the measurement of absorbance, Ellipsometer EPM-222 (manufactured by J.A. Woollam Co., Inc.) was used.

[Dry Etching Resistance (DE Resistance)]

An organic antireflection film, ARC29A (produced by Nissan Chemical Industries, Ltd.), was applied on a silicon wafer and baked at 205° C. for 60 seconds to form an antireflection film having a film thickness of 86 nm, and the positive resist composition prepared in Examples 4, 17 and 18 was applied thereon and baked at 100° C. for 60 seconds to form a resist film having a film thickness of 100 nm. The obtained resist films were subjected to etching by UNITY (manufactured by Tokyo Electron Limited) and after 30 seconds, the decrease of film thickness as a bulk was measured. The sample was rated A when the decrease of film thickness was less than 25 nm, and rated B when from 25 to 35 nm. As a result, in Examples 17 and 18 using a resin containing an acrylate-based repeating unit, the rating was A, and in Example 4 using a resin containing only a methacrylate-based repeating unit, the rating was B.

TABLE 2

| | Composition | | | | | | |
|---|---|---|---|---|---|---|---|
| | Resin A (parts by mass) | Acid Generator (parts by mass) | Basic Compound (parts by mass) | Additive (parts by mass) | Surfactant (parts by mass) | Hydrophobic Resin (parts by mass) | Solvent (parts by mass) |
| Example 1 | A-18 (87.011) | b36 (10.9) | N-1 (0.71) | | W-1 (0.50) | HR-66 (0.879) | SL-1/SL-3 (1140/760) |
| Example 2 | A-18 (68.361) | b36 (28.4) | N-1 (1.86) | | W-1 (0.50) | HR-66 (0.879) | SL-1/SL-3 (1140/760) |
| Example 3 | A-1 (77.531) | b12 (19.8) | N-1 (1.29) | | W-2 (0.50) | HR-26 (0.879) | SL-1 (1900) |
| Example 4 | A-5 (72.841) | b37 (23.5) | N-2 (1.78) | AD-1 (0.5) | W-3 (0.50) | HR-41 (0.879) | SL-1/SL-2/SL-3 (1641/244/15) |
| Example 5 | A-6 (69.991) | b1 (26.4) | N-1 (1.73) | AD-1 (0.5) | W-1 (0.50) | HR-66 (0.879) | SL-1/SL-3/SL-4 (1438/442/20) |
| Example 6 | A-7 (75.171) | b4 (21.8) | N-2 (1.65) | | W-3 (0.50) | HR-41 (0.879) | SL-1 (1900) |
| Example 7 | A-14 (74.571) | b3/b37 (10.8/10.5) | N-3 (2.05) | AD-2 (0.7) | W-1 (0.50) | HR-66 (0.879) | SL-1/SL-2/SL-5 (1354/531/15) |
| Example 8 | A-15 (74.631) | b3/z2 (19.6/2.7) | N-2 (1.69) | | W-1 (0.50) | HR-26 (0.879) | SL-1/SL-3 (1140/760) |
| Example 9 | A-16 (71.281) | b36/z45 (20.5/3.8) | N-3 (2.34) | AD-2 (0.7) | W-2 (0.50) | HR-60 (0.879) | SL-1/SL-3 (1140/760) |
| Example 10 | A-17 (72.971) | b9/b31/z45 (10.8/10.5/2.1) | N-3 (2.25) | | W-3 (0.50) | HR-66 (0.879) | SL-1/SL-3 (1140/760) |
| Example 11 | A-18 (79.261) | c1 (18.4) | N-1 (0.96) | | W-1 (0.50) | HR-66 (0.879) | SL-1/SL-3 (1140/760) |
| Example 12 | A-19 (73.311) | c3 (23.4) | N-2 (1.41) | AD-1 (0.5) | W-1 (0.50) | HR-66 (0.879) | SL-1/SL-3 (1140/760) |
| Example 13 | A-1 (76.241) | c4/z39 (15.8/5.2) | N-1 (1.38) | | W-2 (0.50) | HR-66 (0.879) | SL-1 (1900) |
| Example 14 | A-5 (77.871) | c5/c6 (12.5/7.1) | N-1 (1.15) | | W-3 (0.50) | HR-66 (0.879) | SL-1/SL-2/SL-3 (1641/244/15) |
| Example 15 | A-8 (74.111) | c7/z2 (17.5/5.4) | N-2 (1.11) | AD-1 (0.5) | W-1 (0.50) | HR-66 (0.879) | SL-1/SL-3/SL-4 (1438/442/20) |
| Example 16 | A-17 (79.161) | c1/c6 (13.8/4.2) | N-1 (0.96) | AD-1 (0.5) | W-1 (0.50) | HR-66 (0.879) | SL-1/SL-3 (1140/760) |
| Example 17 | A-21 (74.041) | b12 (23.2) | N-1 (1.38) | | W-1 (0.50) | HR-66 (0.879) | SL-1/SL-3 (1140/760) |
| Example 18 | A-22 (72.381) | c1/c5/c6 (12.5/7.4/4.6) | N-3 (2.24) | | | HR-66 (0.879) | SL-1 (1900) |
| Example 19 | A-18 (69.921) | c5/c7 (12.5/14.8) | N-1 (1.40) | | W-1 (0.50) | HR-66 (0.879) | SL-1/SL-3 (1140/760) |
| Example 20 | A-5 (74.921) | c2 (22.6) | N-2 (1.60) | | | HR-66 (0.879) | SL-1/SL-3 (1140/760) |
| Comparative Example 1 | A-18 (88.501) | b36 (9.5) | N-1 (0.62) | | W-1 (0.50) | HR-66 (0.879) | SL-1/SL-3 (1140/760) |
| Comparative Example 2 | A-18 (64.101) | b36 (32.4) | N-1 (2.12) | | W-1 (0.50) | HR-66 (0.879) | SL-1/SL-3 (1140/760) |
| Comparative Example 3 | A-18 (90.531) | z2 (7.6) | N-1 (0.49) | | W-1 (0.50) | HR-41 (0.879) | SL-1/SL-3 (1140/760) |
| Comparative Example 4 | A-18 (88.311) | z45 (9.4) | N-3 (0.91) | | W-1 (0.50) | HR-26 (0.879) | SL-1/SL-3 (1140/760) |

TABLE 3

| | Composition | | | | | | | |
|---|---|---|---|---|---|---|---|---|
| | | Acid | | | | TC Mode | | |
| | Resin A (parts by mass) | Generator (parts by mass) | Basic Compound (parts by mass) | Additive (parts by mass) | Surfactant (parts by mass) | Hydrophobic Resins (parts by mas) | Solvent | Solvent (parts by mass) |
| Example 21 | A-5 (78.600) | b12/z45 (10.0/9.6) | N-1 (1.30) | | W-1. (0.50) | HR-67 | SL-6 | SL-1/SL-3 (1140/760) |
| Example 22 | A-18 (72.230) | c1 (25.0) | N-2 (1.77) | AD-1 (0.5) | W-1 (0.50) | HR-68 | SL-7 | SL-1 (1900) |
| Comparative Example 5 | A-17 (90.370) | c6 (8.6) | N-1 (0.53) | | W-2 (0.50) | HR-67 | SL-6 | SL-1/SL-3 (1140/760) |

TABLE 4

| Example | Transmittance | LER | Profile |
|---|---|---|---|
| Example 1 | 82% | 7.2 | A |
| Example 2 | 68% | 7.0 | B |
| Example 3 | 69% | 6.9 | B |
| Example 4 | 72% | 6.6 | A |
| Example 5 | 70% | 6.8 | B |
| Example 6 | 73% | 6.5 | A |
| Example 7 | 72% | 6.4 | B |
| Example 8 | 65% | 6.8 | B |
| Example 9 | 74% | 6.7 | A |
| Example 10 | 72% | 6.5 | A |
| Example 11 | 75% | 6.9 | A |
| Example 12 | 71% | 7.0 | B |
| Example 13 | 69% | 6.8 | A |
| Example 14 | 73% | 6.7 | A |
| Example 15 | 70% | 6.8 | B |
| Example 16 | 71% | 6.6 | A |
| Example 17 | 72% | 6.8 | A |
| Example 18 | 73% | 6.6 | |
| Example 19 | 70% | 7.0 | B |
| Example 20 | 71% | 6.8 | A |
| Comparative Example 1 | 83% | 7.5 | B |
| Comparative Example 2 | 64% | 7.7 | D |
| Comparative Example 3 | 68% | 7.6 | C |
| Comparative Example 4 | 63% | 7.8 | D |

TABLE 5

| Example | Transmittance | LER | Profile |
|---|---|---|---|
| Example 21 | 72% | 6.7 | A |
| Example 22 | 70% | 6.6 | A |
| Comparative Example 5 | 65% | 7.5 | C |

TABLE 6

| | Composition | | | | | | |
|---|---|---|---|---|---|---|---|
| | Resin A (parts by mass) | Acid Generator (parts by mass) | Basic Compound (parts by mass) | Additive (parts by mass) | Surfactant (parts by mass) | Hydrophobic Resin (parts by mass) | Solvent (parts by mass) |
| Example 23 | A-18 (88.21) | b3 (10.6) | N-1 (0.69) | | W-I (0.50) | | SL-1/SL-3 (1140/760) |
| Example 24 | A-18 (80.42) | b3 (17.4) | N-3 (1.68) | | W-1 (0.50) | | SL-1/SL-3 (1140/760) |
| Example 25 | A-1 (76.91) | b12 (21.2) | N-1 (1.39) | | W-2 (0.50) | | SL-1 (1900) |
| Example 26 | A-5 (71.46) | b31 (25.6) | N-2 (1.94) | AD-3 (0.5) | W-3 (0.50) | | SL-1/SL-2/SL-3 (1641/244/15) |
| Comparative Example 6 | A-18 (91.40) | b3 (7.6) | N-1 (0.50) | | W-1 (0.50) | | SL-1/SL-3 (1140/760) |
| Comparative Example 7 | A-1 (66.15) | z45 (30.4) | N-3 (2.95) | | W-1 (0.50) | | SL-1/SL-3 (1140/760) |

TABLE 7

| Example | Transmittance | LER | Profile |
|---|---|---|---|
| Example 23 | 79% | 7.3 | A |
| Example 24 | 72% | 7.0 | A |
| Example 25 | 67% | 6.7 | B |
| Example 26 | 71% | 6.6 | A |
| Comparative Example 6 | 84% | 7.8 | C |
| Comparative Example 7 | 46% | 9.5 | D |

Abbreviations in the Tables are as follows.

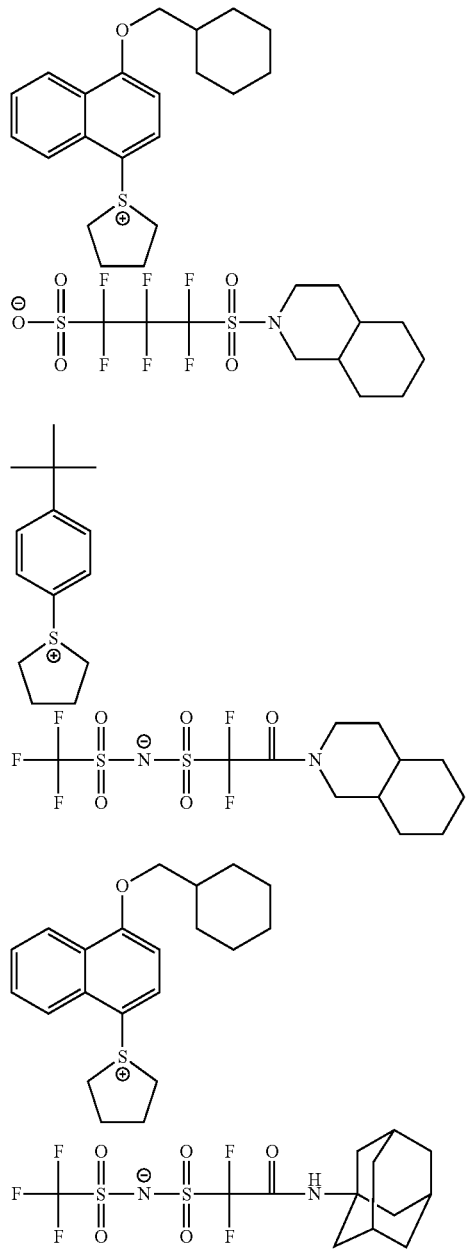

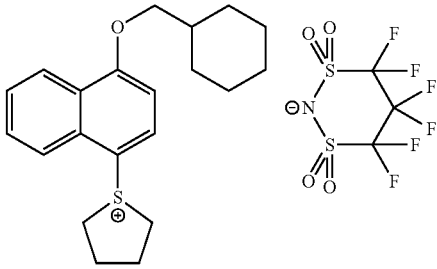

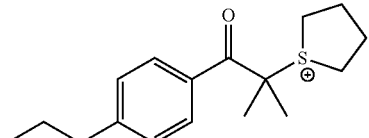

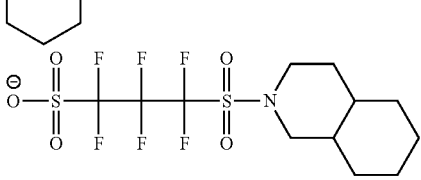

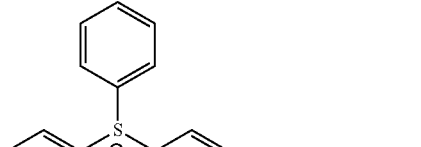

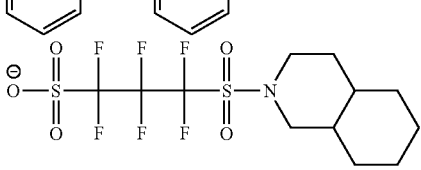

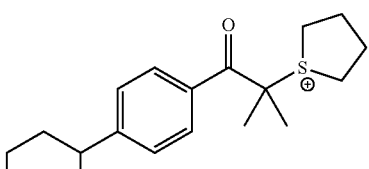

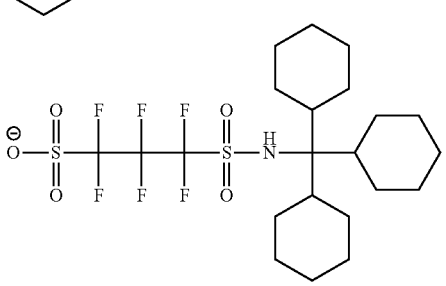

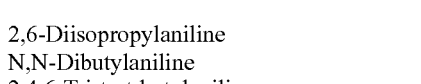

N-1: 2,6-Diisopropylaniline
N-2: N,N-Dibutylaniline
N-3: 2,4,6-Tri-tert-butylaniline
W-1: PF6320 (produced by OMNOVA, fluorine-containing)
W-2: Troysol S-366 (produced by Troy Chemical)
W-3: Polysiloxane Polymer KP-341 (produced by Shin-Etsu Chemical Co., Ltd., silicon-containing)

SL-1: Propylene glycol monomethyl ether acetate (PGMEA)
SL-2: Cyclohexanone
SL-3: Propylene glycol monomethyl ether (PGME)
SL-4: γ-Butyrolactone
SL-5: Propylene carbonate

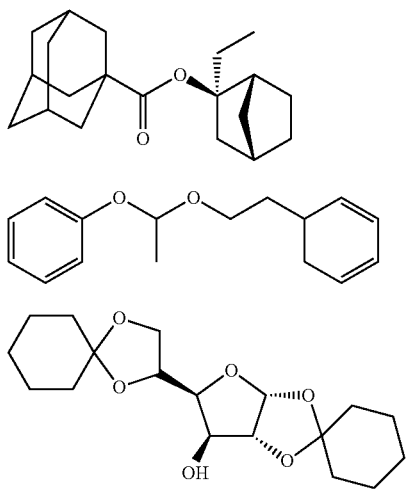

(Synthesis of Photo-Acid Generator c1)

Photo-Acid Generator c1 shown below was synthesized according to the following synthesis route.

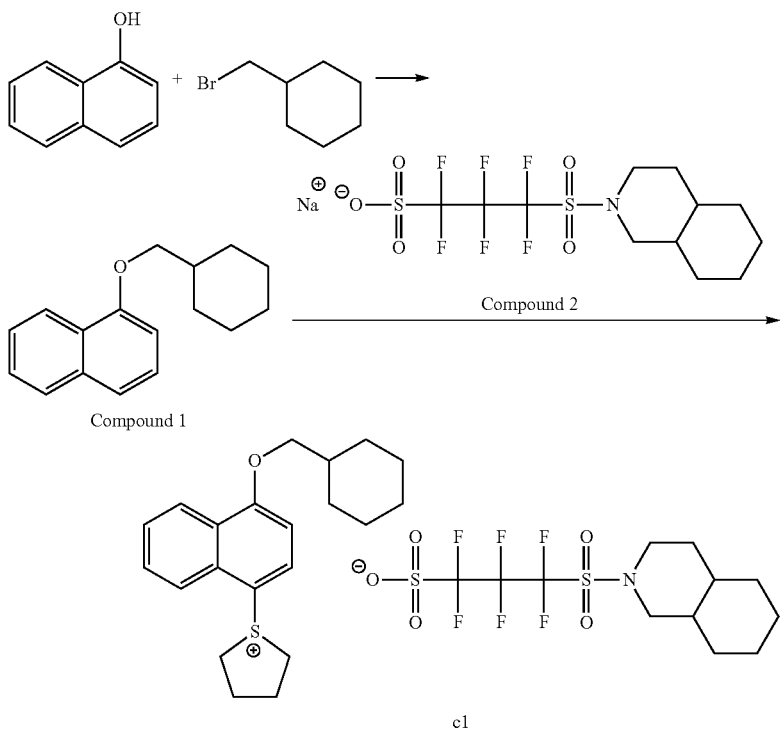

[Synthesis of Compound 1]

In a three-neck flask, 20 g of bromomethyl cyclohexane and 12.5 g of 1-naphthol were dissolved in 300 g of NMP, and 12 g of potassium carbonate and 14 g of potassium iodide were added thereto. After heating at 120° C. for 8 hours, 300 g of water was added to the reaction solution, and the resulting solution was extracted with 100 g of hexane three times. The obtained organic layers were combined, then washed once with 100 g of an aqueous 1 N sodium hydroxide solution, once with 100 g of water and once with 100 g of brine and further concentrated to obtain 13 g of Compound 1.

[Synthesis of Compound 2]

Compound 2 was synthesized by referring to the method described in JPA-2005-266799.

[Synthesis of Photo-Acid Generator c1]

In a three-neck flask, 13.1 g of Compound 1 was dissolved in 65 g of Eaton's reagent, and 5.7 g of tetramethylene sulfoxide was added dropwise thereto with stirring. After stirring for another 3 hours, the reaction solution was poured in 240 g of water, and 25 g of Compound 2 and 50 g of chloroform were added thereto. The organic layer was separated and then further extracted twice from the aqueous layer by using 50 g of chloroform. The obtained organic layers were combined, washed with water twice and concentrated. The obtained crude product was recrystallized using 20 g of ethyl acetate to obtain 22 g of Photo-Acid Generator c1.

The components shown in Tables 2, 3 and 6 above were dissolved in a solvent while adjusting the amount of the solvent to prepare a solution having a solid content concentration of 3 mass %, and the obtained solution was filtered through a polyethylene filter having a pore size of 0.03 μm to prepare an actinic ray-sensitive or radiation-sensitive resin composition. The actinic ray-sensitive or radiation-sensitive resin compositions prepared were evaluated by the same methods. Then, the same results as in Tables 4, 5 and 7 were obtained.

INDUSTRIAL APPLICABILITY

According to the present invention, an actinic ray-sensitive or radiation-sensitive resin composition having an effect in the improvement of tapered profile of a resist pattern and enabling formation of a pattern with good LER performance, and a pattern forming method using the composition can be provided. The actinic ray-sensitive or radiation-sensitive resin composition of the present invention is suitable as a positive resist composition.

This application is based on Japanese patent applications No. 2009-88557, filed on Mar. 31, 2009 and No. 2009-205362, filed on Sep. 4, 2009, the entire content of which is hereby incorporated by reference, the same as if set forth at length.

The invention claimed is:

1. An actinic ray-sensitive or radiation-sensitive resin composition, comprising:
    (A) a resin capable of increasing the solubility of the resin (A) in an alkali developer by the action of an acid; and
    (B) a compound capable of generating an acid upon irradiation with an actinic ray or radiation,
    wherein:
    (B) the compound capable of generating an acid upon irradiation with an actinic ray or radiation is contained in an amount of 10.6 to 18.4 mass % based on the entire solids content of the actinic ray-sensitive or radiation-sensitive resin composition, and
    the actinic ray-sensitive or radiation-sensitive resin composition contains at least one of the compounds represented by formulae (1-1) and (1-2) as the compound (B):

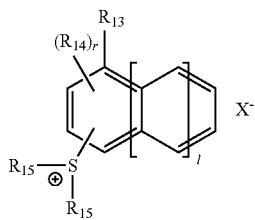

(1-1)

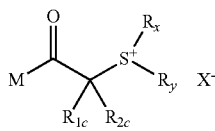

(1-2)

wherein in formula (1-1),
$R_{13}$ represents a hydrogen atom, a fluorine atom, a hydroxyl group, an alkyl group, a cycloalkyl group, an alkoxy group, an alkoxycarbonyl group, or a group having a monocyclic or polycyclic cycloalkyl skeleton;
$R_{14}$ represents an alkyl group, a cycloalkyl group, an alkoxy group, an alkylsulfonyl group, a cycloalkylsulfonyl group, an alkylcarbonyl group, an alkoxycarbonyl group, or an alkoxy group having a monocyclic or polycyclic cycloalkyl skeleton, and when a plurality of $R_{14}$'s are present, the plurality of $R_{14}$'s are the same or different;
each $R_{15}$ independently represents an alkyl group, a cycloalkyl group or a naphthyl group, and two $R_{15}$'s may combine with each other to form a ring;
l represents an integer of 0 to 2;
r represents an integer of 0 to 8; and
$X^-$ represents a non-nucleophilic anion;
and in formula (1-2),
M represents an alkyl group, a cycloalkyl group, an aryl group or a benzyl group and when M has a ring structure, the ring structure may contain an oxygen atom, a sulfur atom, an ester bond, an amide bond or a carbon-carbon double bond;
each of $R_{1c}$ and $R_{2c}$ independently represents a hydrogen atom, an alkyl group, a cycloalkyl group, a halogen atom, a cyano group or an aryl group, and $R_{1c}$ and $R_{2c}$ may combine with each other to form a ring;
each of $R_x$ and $R_y$ independently represents an alkyl group, a cycloalkyl group, a 2-oxoalkyl group, an alkoxycarbonylalkyl group, an allyl group or a vinyl group;
$R_x$ and $R_y$ may combine with each other to form a ring, at least two members of M, $R_{1c}$ and $R_{2c}$ may combine with each other to form a ring, and the ring structure may contain a carbon-carbon double bond; and
$X^-$ represents a non-nucleophilic anion.

2. The actinic ray-sensitive or radiation-sensitive resin composition according to claim 1, further comprising:
a nitrogen-containing basic compound.

3. The actinic ray-sensitive or radiation-sensitive resin composition according to claim 1,
wherein the resin (A) contains a lactone structure-containing repeating unit.

4. The actinic ray-sensitive or radiation-sensitive resin composition according to claim 1,
wherein the resin (A) contains a repeating unit having an acid-decomposable group that contains a monocyclic or polycyclic alicyclic structure.

5. The actinic ray-sensitive or radiation-sensitive resin composition according to claim 1,
wherein when a film having a film thickness of 100 nm is formed from the actinic ray-sensitive or radiation-sensitive resin composition, the film has a transmittance of 60 to 85% for light at a wavelength of 193 nm.

6. The actinic ray-sensitive or radiation-sensitive resin composition according to claim 1,
wherein the resin (A) contains a repeating unit represented by the following formula (AI):

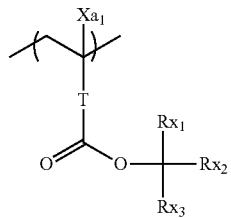

(AI)

wherein $Xa_1$ represents a hydrogen atom, a methyl group or a group represented by $-CH_2-R_9$;
$R_9$ represents a hydroxyl group or a monovalent organic group;
T represents a single bond or a divalent linking group;
each of $Rx_1$ to $Rx_3$ independently represents an alkyl group or a cycloalkyl group; and
two members out of $Rx_1$ to $Rx_3$ may combine with each other to form a cycloalkyl group.

7. A pattern forming method, comprising:
forming a film from the actinic ray-sensitive or radiation-sensitive resin composition claimed in claim 1; and subjecting the film to immersion exposure and development.

8. The actinic ray-sensitive or radiation-sensitive resin composition according to claim 1,
wherein in formula (1-1), each $R_{15}$ independently represents an alkyl group or a cycloalkyl group, and two $R_{15}$'s may combine with each other to form a ring.

9. The actinic ray-sensitive or radiation-sensitive resin composition according to claim 3,
wherein the lactone structure contained in the resin (A) is a lactone structure represented by formula (LC1-4) or (LC1-5):

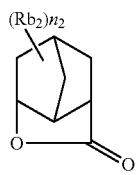

LC1-4

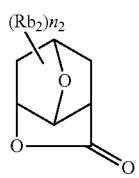

LC1-5 wherein $Rb_2$ represents an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group or an acid-decomposable group;

$n_2$ represents an integer of 0 to 4, and when $n_2$ is an integer of 2 or more, each $Rb_2$ may be the same as or different from every other $Rb_2$ and the plurality of $Rb_2$'s may combine with each other to form a ring.

10. The actinic ray-sensitive or radiation-sensitive resin composition according to claim 1, wherein the total amount of the compounds represented by formula (1-1) and (1-2) is 50% by weight or more based on the total amount of the compound (B).

11. The actinic ray-sensitive or radiation-sensitive resin composition according to claim 1, wherein the total amount of the compounds represented by formula (1-1) and (1-2) is 90% by weight or more based on the total amount of the compound (B).

12. The actinic ray-sensitive or radiation-sensitive resin composition according to claim 1, wherein the resin composition further contains at least one selected from the group consisting of compounds represented by formulae (ZI) to (ZIII) as the compound (B), and the compounds represented by formula (ZI) to (ZIII) are different from the compounds represented by formula (1-1) and (1-2):

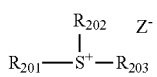

(ZI)

-continued

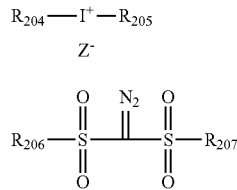

(ZII)

(ZIII)

wherein each of $R_{201}$, $R_{202}$ and $R_{203}$ independently represents an organic group, and two members out of $R_{201}$ to $R_{203}$ may combine with each other to form a ring structure;

each of $R_{204}$ to $R_{207}$ independently represents an aryl group which may have a substituent, an alkyl group which may have a substituent or a cycloalkyl group which may have a substituent, and $Z^-$ represents a non-nucleophilic anion.

13. The actinic ray-sensitive or radiation-sensitive resin composition according to claim 1, wherein the compound (B) contains at least the compound represented by formula (1-1), and $R_{15}$'s in formula (1-1) each independently represent an alkyl group, which are bound with each other to form a ring.

14. The actinic ray-sensitive or radiation-sensitive resin composition according to claim 1, wherein $X^-$ in formula (1-1) and (1-2) is an anion represented by formula (A2):

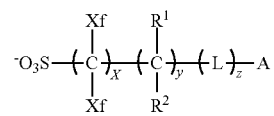

(A2)

wherein each Xf independently represents a fluorine atom or an alkyl group substituted by at least one fluorine atom;

each of $R^1$ and $R^2$ independently represents a group selected from the group consisting of a hydrogen atom, a fluorine atom, an alkyl group and an alkyl group substituted by at least one fluorine atom, and when a plurality of $R^1$'s or $R^2$'s are present, these may be the same or different;

L represents a single bond or a divalent linking group, and when a plurality of L's are present, these may be the same or different;

A represents a group having a cyclic structure; and x represents an integer of 1 to 20, y represents an integer of 0 to 10, and z represents an integer of 0 to 10.

15. The actinic ray-sensitive or radiation-sensitive resin composition according to claim 1, wherein $X^-$ in formula (1-1) and (1-2) is an anion represented by formula (A1):

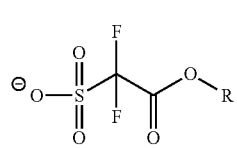

(A1)

wherein R represents a hydrogen atom or an organic group.

16. The actinic ray-sensitive or radiation-sensitive resin composition according to claim 1, wherein the resin composition further contains a hydrophobic resin.

17. The actinic ray-sensitive or radiation-sensitive resin composition according to claim 16, wherein the content of the hydrophobic resin is 0.1 to 10% by weight.

18. The actinic ray-sensitive or radiation-sensitive resin composition according to claim 1, wherein the resin (A) has no aromatic group.

19. The actinic ray-sensitive or radiation-sensitive resin composition according to claim 6, wherein the resin (A) comprises at least one repeating unit represented by either formula (1) or formula (2):

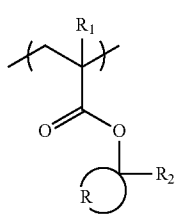
(1)

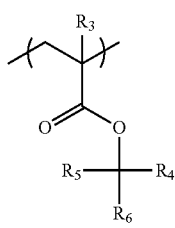
(2)

wherein each of $R_1$ and $R_3$ independently represents a hydrogen atom, a methyl group or a group represented by —$CH_2$—$R_9$, wherein $R_9$ represents a hydroxyl group or a monovalent organic group;

each of $R_2$, $R_4$, $R_5$ and $R_6$ independently represents an alkyl group or a cycloalkyl group, and R represents an atomic group necessary for forming an alicyclic structure together with the carbon atom.

20. The actinic ray-sensitive or radiation-sensitive resin composition according to claim 6, wherein the resin (A) comprises at least two repeating units selected from a repeating unit or units represented by formula (1) and/or a repeating unit or units represented by formula (2):

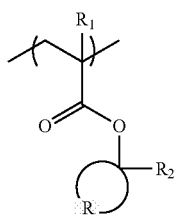
(1)

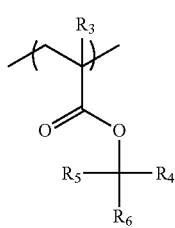
(2)

wherein each of $R_1$ and $R_3$ independently represents a hydrogen atom, a methyl group or a group represented by —$CH_2$—$R_9$, wherein $R_9$ represents a hydroxyl group or a monovalent organic group;

each of $R_2$, $R_4$, $R_5$ and $R_6$ independently represents an alkyl group or a cycloalkyl group, and R represents an atomic group necessary for forming an alicyclic structure together with the carbon atom.

21. An actinic ray-sensitive or radiation-sensitive resin composition, comprising:

(A) a resin capable of increasing the solubility of the resin (A) in an alkali developer by the action of an acid; and (B) a compound capable of generating an acid upon irradiation with an actinic ray or radiation, wherein:

(B) the compound capable of generating an acid upon irradiation with an actinic ray or radiation is contained in an amount of 10 to 30 mass % based on the entire solids content of the actinic ray-sensitive or radiation-sensitive resin composition, and the resin composition contains at least one selected from the group consisting of compounds represented by formula (ZI) and (ZII) as the compound (B):

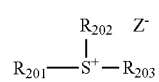
(ZI)

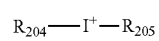
(ZII)

wherein each of $R_{201}$, $R_{202}$ and $R_{203}$ independently represents an organic group, and two members out of $R_{201}$ to $R_{203}$ may combine with each other to form a ring structure;

each of $R_{204}$ to $R_{205}$ independently represents an aryl group which may have a substituent, an alkyl group which may have a substituent or a cycloalkyl group which may have a substituent, and $Z^-$ represents a non-nucleophilic anion represented by formula (A1):

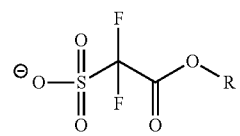
(A1)

wherein R represents a hydrogen atom or an organic group.

22. The actinic ray-sensitive or radiation-sensitive resin composition according to claim 21, wherein R in formula (A1) is a group represented by formula (A1a):

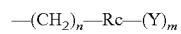
(A1a)

wherein Rc represents a monocyclic or polycyclic organic group having a carbon number of 3 to 30;

Y represents a hydroxyl group, a halogen atom, a cyano group, a carboxyl group, a hydrocarbon group having a carbon number of 1 to 10, a hydroxyalkyl group having a carbon number of 1 to 10, an alkoxy group having a carbon number of 1 to 10, an acyl group having a carbon number of 1 to 10, an alkoxycarbonyl group having a carbon number of 2 to 10, an acyloxy group having a carbon number of 2 to 10, an alkoxyalkyl group having a carbon number of 2 to 10, or an alkyl halide group having a carbon number of 1 to 8;

m is from 0 to 6, and when a plurality of Y's are present, each Y may be the same as or different from every other Y; and n is from 0 to 10.

23. The actinic ray-sensitive or radiation-sensitive resin composition according to claim 22, wherein Rc in formula (A1a) is a polycyclic organic group having a carbon number of 7 to 16.

24. An actinic ray-sensitive or radiation-sensitive resin composition, comprising:
(A) a resin capable of increasing the solubility of the resin (A) in an alkali developer by the action of an acid; and
(B) a compound capable of generating an acid upon irradiation with an actinic ray or radiation,
wherein:
(B) the compound capable of generating an acid upon irradiation with an actinic ray or radiation is contained in an amount of 10 to 30 mass % based on the entire solids content of the actinic ray-sensitive or radiation-sensitive resin composition, and
the resin composition contains at least one selected from the group consisting of compounds represented by formula (ZI) and (ZII) as the compound (B):

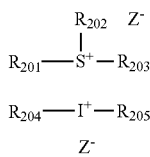

(ZI)

(ZII)

wherein each of $R_{201}$, $R_{202}$ and $R_{203}$ independently represents an organic group, and two members out of $R_{201}$ to $R_{203}$ may combine with each other to form a ring structure;

each of $R_{204}$ to $R_{205}$ independently represents an aryl group which may have a substituent, an alkyl group which may have a substituent or a cycloalkyl group which may have a substituent, and $Z^-$ represents a non-nucleophilic anion represented by formula (A2):

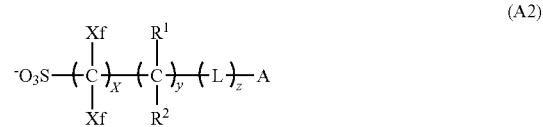

(A2)

wherein each Xf independently represents a fluorine atom or an alkyl group substituted by at least one fluorine atom;

each of $R^1$ and $R^2$ independently represents a group selected from the group consisting of a hydrogen atom, a fluorine atom, an alkyl group and an alkyl group substituted by at least one fluorine atom, and when a plurality of $R^1$'s or $R^2$'s are present, these may be the same or different;

L represents a single bond or a divalent linking group, and when a plurality of L's are present, these may be the same or different;

A represents a group having a cyclic structure;

x represents an integer of 1 to 20;

y represents an integer of 0 to 10, and z represents an integer of 0 to 10.

25. The actinic ray-sensitive or radiation-sensitive resin composition according to claim 24, wherein in formula (A2), z is 1 and L represents —OCO—.

26. The actinic ray-sensitive or radiation-sensitive resin composition according to claim 25, wherein in formula (A2), x is 1 and Xf represents a fluorine atom.

27. The actinic ray-sensitive or radiation-sensitive resin composition according to claim 26, wherein in formula (A2), y is 1, $R_1$ represents —$CF_3$, and $R_2$ represents a hydrogen atom.

28. The actinic ray-sensitive or radiation-sensitive resin composition according to claim 24, wherein in formula (A2), A represents an alicyclic group having a carbon number of 7 or more.

29. The actinic ray-sensitive or radiation-sensitive resin composition according to claim 28, wherein in formula (A2), A represents an adamantyl group.

* * * * *